US008889469B2

(12) United States Patent
Jackrel et al.

(10) Patent No.: US 8,889,469 B2
(45) Date of Patent: Nov. 18, 2014

(54) MULTI-NARY GROUP IB AND VIA BASED SEMICONDUCTOR

(75) Inventors: David B. Jackrel, Pacifica, CA (US); Katherine Dickey, Stanford, CA (US); Kristin Pollock, San Francisco, CA (US); Jacob Woodruff, Mountain View, CA (US); Peter Stone, Los Gatos, CA (US); Gregory Brown, San Jose, CA (US)

(73) Assignee: aeris CAPITAL Sustainable IP Ltd., Grand Cayman (KY)

( * ) Notice: Subject to any disclaimer, the term of this patent is extended or adjusted under 35 U.S.C. 154(b) by 0 days.

(21) Appl. No.: 13/533,761

(22) Filed: Jun. 26, 2012

(65) Prior Publication Data
US 2012/0313200 A1   Dec. 13, 2012

Related U.S. Application Data

(63) Continuation-in-part of application No. 13/208,325, filed on Aug. 11, 2011, now Pat. No. 8,729,543, and a continuation-in-part of application No. 13/344,583, filed on Jan. 5, 2012, now abandoned, and a continuation-in-part of application No. 12/980,276, filed on Dec. 28, 2010, now abandoned, and a continuation-in-part of application No. PCT/US2012/020385, filed on Jan. 5, 2012.

(60) Provisional application No. 61/502,853, filed on Jun. 29, 2011, provisional application No. 61/505,084, filed on Jul. 6, 2011, provisional application No. 61/290,490, filed on Dec. 28, 2009.

(51) Int. Cl.
| H01L 31/032 | (2006.01) |
| H01L 31/0352 | (2006.01) |
| H01L 31/0749 | (2012.01) |

(52) U.S. Cl.
CPC .... *H01L 31/0322* (2013.01); *H01L 31/035218* (2013.01); *Y02E 10/541* (2013.01); *H01L 31/0749* (2013.01)
USPC ............................. 438/95; 438/478; 257/95

(58) Field of Classification Search
USPC .......................................................... 438/95
See application file for complete search history.

(56) References Cited

U.S. PATENT DOCUMENTS

| 6,720,239 B2 | 4/2004 | Stanbery |
| 7,858,151 B2 | 12/2010 | Sager et al. |

(Continued)

FOREIGN PATENT DOCUMENTS

| JP | 2009-267332 A | 11/2009 |
| WO | 2010110461 A | 9/2010 |
| WO | 2010114138 A | 10/2010 |

OTHER PUBLICATIONS

Final Office Action mailed date May 24, 2012, issued for U.S. Appl. No. 12/980,276.

(Continued)

*Primary Examiner* — Colleen A Matthews
*Assistant Examiner* — William Harrison
(74) *Attorney, Agent, or Firm* — Joshua D. Isenberg; JDI Patent

(57) ABSTRACT

Methods and devices are provided for forming multi-nary semiconductor. In one embodiment, a method is provided comprising of depositing a precursor material onto a substrate, wherein the precursor material may include or may be used with an additive to minimize concentration of group IIIA material such as Ga in the back portion of the final semiconductor layer. The additive may be a non-copper Group IB additive in elemental or alloy form. Some embodiments may use both selenium and sulfur, forming a senary or higher semiconductor alloy. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

18 Claims, 15 Drawing Sheets

(56) References Cited

U.S. PATENT DOCUMENTS

| | | | |
|---|---|---|---|
| 2003/0123167 | A1 | 7/2003 | Kolberg et al. |
| 2004/0063320 | A1 | 4/2004 | Hollars |
| 2006/0024503 | A1 | 2/2006 | Wong et al. |
| 2007/0163637 | A1 | 7/2007 | Leidholm Craig et al. |
| 2008/0057203 | A1 | 3/2008 | Robinson et al. |
| 2008/0202584 | A1 | 8/2008 | Basol |
| 2009/0035882 | A1 | 2/2009 | Basol |
| 2009/0169723 | A1 | 7/2009 | Hanket et al. |
| 2010/0261304 | A1 | 10/2010 | Chang et al. |
| 2010/0267222 | A1 | 10/2010 | Robinson et al. |
| 2011/0048490 | A1 | 3/2011 | Bernius et al. |
| 2011/0232760 | A1 | 9/2011 | Shirata |
| 2011/0294254 | A1* | 12/2011 | Jackrel et al. .......... 438/95 |
| 2012/0168910 | A1 | 7/2012 | Jackrel et al. |
| 2012/0270363 | A1 | 10/2012 | Jackrel et al. |

OTHER PUBLICATIONS

Non Final Office Action mailed date Dec. 28, 2012 issued for U.S. Appl. No. 13/344,583.

Non Final Office Action mailed date Mar. 14, 2013 issued for U.S. Appl. No. 13/208,325.

Non Final Office Action mailed date Oct. 19, 2011, issued for U.S. Appl. No. 12/980,276.

International Search Report issued for PCT International Application No. PCT/US2012/044364, mail date Nov. 9, 2012.

International Search Report issued for PCT International Application No. PCT/US12/20385, mail date Sep. 7, 2012.

International Search Report issued for PCT International Application No. PCT/US10/62270 mail date Oct. 26, 2011.

Koen Decock et al. Modelling thin film solar cells with graded band gap, Department of Electronics and Information Systems (ELIS), University of Gent, Oct. 5, 2009.

U.S. Appl. No. 61/430,131, filed Jan. 5, 2011.

U.S. Appl. No. 61/505,084, filed Jul. 6, 2011.

U.S. Appl. No. 61/505,853, filed Jun. 29 ,2011.

U.S. Appl. No. 61/290,490, filed Dec. 28, 2009.

* cited by examiner

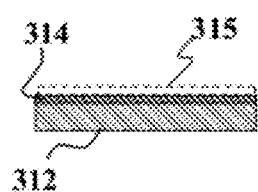
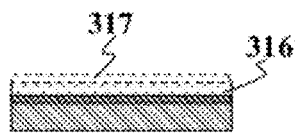
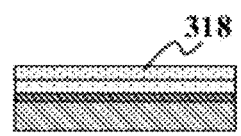
FIG. 2A     FIG. 2B     FIG. 2C
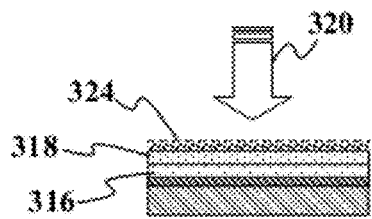
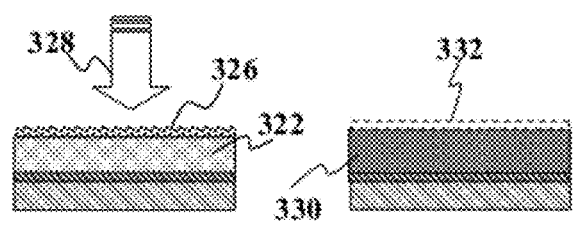
FIG. 2D     FIG. 2E     FIG. 2F

MULTI-NARY GROUP IB AND VIA BASED SEMICONDUCTOR

CLAIM OF PRIORITY

This application is a nonprovisional claiming the priority benefit of U.S. Provisional Patent Application No. 61/502,853 filed Jun. 29, 2011 to David B. Jackrel et al., entitled "MULTI-NARY GROUP IB AND VIA BASED SEMICONDUTOR", the entire contents of which are incorporated herein by reference.

FIELD OF THE INVENTION

This invention relates generally to multi-nary semiconductor materials, more specifically to senary or higher semiconductors suitable but not limited to use in optoelectronic devices.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, preferably non-silicon, light-absorbing semiconductor materials such as but not limited to copper-indium-gallium-selenide (CIGS).

Many traditional thin-film CIGS manufacturing techniques use co-evaporation or other vacuum based deposition techniques where all of the components of the final semiconductor material are formed in one step. In particular for co-evaporation, the material is grown from the bottom-up, with content carefully controlled as the material is grown. Although material content through the depth of the layer is more controllable, this one step type fabrication process is typically a time consuming process.

By contrast, multi-step fabrication techniques which involve deposition and then a subsequent anneal in one or more steps in a group VIA or other reactive environment can sometimes be a higher throughput process that, unfortunately, is more susceptible to migration and/or phase separation of material during fabrication. In one nonlimiting example, gallium content in depth of the initially deposited material is subsequently much different through the depth of the final semiconductor layer as much of gallium is pushed to bottom of the layer in the final semiconductor material.

One problem faced with thin-film type solar cells is the difficulty in cost effectively creating solar cells with higher conversion efficiencies, more on par with the efficiencies of their crystalline silicon counterparts. Improved techniques are desired so that improved thin film photovoltaic absorbers are formed.

SUMMARY OF THE INVENTION

Embodiments of the present invention address at least some of the drawbacks set forth above. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes for forming Group IBIIIAVIA compound semiconductors that contain Group IB (Cu,Ag,Au), Group IIIA (B,Al,Ga,In,Tl) and Group VIA (O,S,Se,Te,Po). At least some of these and other objectives described herein will be met by various embodiments of the present invention.

For many of the embodiments herein, it is also possible to have two or more elements of IB elements in the chalcogenide particle and/or the resulting intermediate film and/or final absorber layer. The present embodiments further enhance performance by including at least two or more group VIA elements to form a senary or higher multi-nary IBIIIAVIA alloy. Some embodiment may relate to senary or higher semiconductors containing at least two IB elements, two VIA elements, and at least two other elements from the groups consisting of IIB, IIIA, and IVA.

In one embodiment of the present invention, an optoelectronic device is provided having a thin film absorber layer consisting essentially of: silver, copper, indium, gallium, selenium, and sulfur; wherein the device comprises (i) at least about 17% conversion efficiency under AM 1.5G illumination and (ii) an Ag/(Ag+Cu) ratio which is less than about 0.4. Optionally, the device has at least about 16% conversion efficiency under AM 1.5G illumination. Optionally, the device has at least about 15% conversion efficiency under AM 1.5G illumination. Optionally, the device has at least about 14% conversion efficiency under AM 1.5G illumination. Optionally, the device has at least about 13% conversion efficiency under AM 1.5G illumination. Optionally, the device has at least about 12% conversion efficiency under AM 1.5G illumination. Optionally, the device has at least about 11% conversion efficiency under AM 1.5G illumination. Optionally, the device has at least about 10% conversion efficiency under AM 1.5G illumination.

In another embodiment of the present invention, an optoelectronic device is provided comprising: a thin film absorber layer formed on a base, wherein the absorber layer consists essentially of: silver, copper, indium, gallium, selenium, and sulfur; wherein oxygen content at a surface region of the absorber layer is reduced.

In another embodiment of the present invention, an optoelectronic device is provided a $(Ag,Cu)(In,Ga)(SeS)_2$ absorber layer having a surface region, a bulk region and a transition region disposed between the surface region and the bulk region, wherein a transition region Ag/(Ag+Cu) molar ratio in the transition region is higher than a surface region Ag/(Ag+Cu) ratio in the surface region.

In another embodiment of the present invention, an optoelectronic device is provided a $(Ag,Cu)(In,Ga)(SeS)_2$ absorber layer comprising a surface region, a bulk region, and a transition region disposed between the surface region and the bulk region, and wherein the surface region includes: a thickness of less than about 300 nm, a Ga/(Ga+In) molar ratio that is in the range of about 0 to about 0.3, a S/(Se+S) molar ratio that is in the range of about 0.1 to about 0.7, and a Ag/(Ag+Cu) molar ratio that is in the range of about 0 to about 0.4.

In another embodiment of the present invention, an optoelectronic device is provided a $(Ag,Cu)(In,Ga)(SeS)_2$ absorber layer comprising a surface region, a bulk region, and a transition region between the surface region and the bulk region, wherein the surface region includes: a thickness of less than about 300 nm, a surface region Ga/(Ga+In) molar ratio within the surface region in the range of 0.05 to about 0.15.

In another embodiment of the present invention, an optoelectronic device is provided a $(Ag,Cu)(In,Ga)(SeS)_2$ absorber layer having a surface region, a bulk region and a transition region between the surface region and the bulk region, wherein an average bulk region Ga/(Ga+In) molar ratio within the bulk region is about 0.5 or less. The short circuit current density ($J_{sc}$) of the solar cell under AM 1.5G may be at least about 32 mA/cm$^2$ and a fill factor of at least about 73%.

In another embodiment of the present invention, an optoelectronic device is provided a (Ag,Cu)(In,Ga)(SeS)$_2$ absorber layer having a surface region, a bulk region and a transition region between the surface region and the bulk region, wherein a surface region S/(S+Se) molar ratio in the surface region is greater than a surface region Ag/(Ag+Cu) ratio in the surface region and provides an increased sulfur interface for junction partner formation. Without being bound to any particular theory, the junction partner layer used with the thin film absorber layer may be CdS and the sulfur interface on the thin film absorber may improve junction partner formation or growth.

In yet another embodiment of the present invention, a method is provided comprising: forming a thin film absorber layer from a precursor layer, wherein the absorber layer consists essentially of: silver, copper, indium, gallium, selenium, and sulfur, wherein the absorber layer is formed by withholding substantial amounts of sulfur from incorporation into the absorber until after full selenization of the precursor layer.

In yet another embodiment of the present invention, a method is provided for forming a thin film absorber layer consisting essentially of: silver, copper, indium, gallium, selenium, and sulfur, the method comprising: forming a nascent absorber layer; fully selenizing the nascent absorber layer to form a chalcogenide layer; incorporating sulfur into the chalcogenide layer only after full selenization of the nascent absorber layer. Silver in the chalcogenide layer may facilitate incorporation of sulfur.

In another embodiment of the present invention, a method is provided for forming a Ag-III alloy precursor layer; selenizing the precursor layer, incorporating sulfur only after selenization of the precursor layer has begun, wherein incorporating sulfur forms a thin film absorber layer consisting essentially of: silver, copper, indium, gallium, selenium, and sulfur.

In another embodiment of the present invention, a method is provided comprising: forming a precursor layer comprising Ag-III flake particles; selenizing the precursor layer, incorporating sulfur only after selenization of the precursor layer has begun, wherein incorporating sulfur forms a thin film absorber layer consisting essentially of: silver, copper, indium, gallium, selenium, and sulfur.

In another embodiment of the present invention, a method is provided comprising: forming a precursor layer; forming a AgIn$_2$ alloy phase; selenizing the precursor layer, incorporating sulfur only after full selenization of the precursor layer for forming a thin film absorber layer consisting essentially of: silver, copper, indium, gallium, selenium, and sulfur.

In another embodiment of the present invention, a method is provided comprising: forming a thin film absorber layer consisting essentially of: silver, copper, indium, gallium, selenium, and sulfur, wherein forming comprises raising transition region minimum bandgap by increasing Ag/(Ag+Cu) ratio in the transition region; maintaining average Ga/(Ga+In) molar ratio in the absorber layer from about 0.3 to about 0.5.

In another embodiment of the present invention, a method is provided comprising: forming a thin film absorber layer formed on a base, wherein the absorber layer consists essentially of: silver, copper, indium, gallium, selenium, and sulfur, wherein oxygen content at a surface region of the absorber layer is reduced compared to another thin film absorber layer formed in substantially the same manner consisting essentially of: silver, copper, indium, gallium, and selenium.

In another embodiment of the present invention, a method is provided for forming a thin film absorber layer consisting essentially of: silver, copper, indium, gallium, selenium, and sulfur, the method comprising: forming a precursor layer; chacolgenizing the precursor layer in one more steps to incorporate both sulfur and selenium to form the absorber layer, wherein minimum bandgap in a transition region of the absorber layer is defined by transition region Ag/(Ag+Cu), wherein increasing transition region Ag/(Ag+Cu) changes a surface region bandgap and a bulk region bandgap by substantially the same amount.

In another embodiment of the present invention, a method is provided for forming a thin film absorber layer from a precursor layer, the method comprising: altering a minimum bandgap in a transition region of the absorber layer by using a pre-determined Ag/(group IB) in the precursor layer; altering a shape of a surface region bandgap profile of the absorber layer by changing S/(group VIA) in the precursor layer; and altering a shape of a bulk region bandgap profile of the absorber layer by changing Ga/(Group III) in the precursor layer.

In another embodiment of the present invention, a method is provided for forming a thin film absorber layer from a precursor layer, the method comprising: providing a base having a front surface and a back surface; depositing a precursor layer over the front surface of the base, wherein the precursor layer includes metallic species comprising Ag, Cu, and at least one Group IIIA material; converting the precursor layer into a thinned layer during a densification period at a first temperature range; reacting the thinned layer at a second temperature range for a transformation period within a second process different from the first process to transform the thinned layer into a planar Group IBIIIAVIA compound layer, the second temperature range being greater than the first temperature range; replacing a portion of the group VIA material in the planar Group IBIIIAVIA compound layer with sulfur by reacting the compound layer in a sulfur environment in a third temperature range, wherein the absorber layer has a S/(S+Se) molar ratio about 0.1 to about 0.7 in a surface region of the absorber layer while Ag/(Ag+Cu) molar ratio within the surface region is about 0.05 to about 0.2.

In another embodiment of the present invention, a method is provided for forming a thin film absorber layer from a precursor layer, the method comprising: providing a base having a front surface and a back surface; depositing a precursor layer over the front surface of the base, wherein the precursor layer includes metallic species comprising Ag, Cu, and at least one Group IIIA material; forming a (Ag,Cu)(In, Ga)(SeS)$_2$ absorber layer from the precursor layer in one or more steps, wherein the absorber layer has a surface region, a bulk region and a transition region disposed between the surface region and the bulk region, wherein a transition region Ag/(Ag+Cu) molar ratio in the transition region is higher than a surface region Ag/(Ag+Cu) ratio in the surface region.

In another embodiment of the present invention, a method is provided for forming a thin film absorber layer from a precursor layer, the method comprising: providing a base having a front surface and a back surface; depositing a precursor layer over the front surface of the base, wherein the precursor layer includes metallic species comprising Ag, Cu, and at least one Group IIIA material; forming a (Ag,Cu)(In, Ga)(SeS)$_2$ absorber layer from the precursor layer in one or more steps, wherein the absorber layer has a surface region, a bulk region and a transition region disposed between the surface region and the bulk region, and wherein the surface region includes: a thickness of about 300 nm or less, a Ga/(Ga+In) molar ratio that is in the range of about 0.05 to about 0.15, a S/(Se+S) molar ratio that is in the range of about 0.1 to about 0.4, and a Ag/(Ag+Cu) molar ratio that is in the range of about 0.05 to about 0.2.

In another embodiment of the present invention, a method is provided for forming a thin film absorber layer from a precursor layer, the method comprising: providing a base having a front surface and a back surface; depositing a precursor layer over the front surface of the base, wherein the precursor layer includes metallic species comprising Ag, Cu, and at least one Group IIIA material; forming a (Ag,Cu)(In, Ga)(SeS)$_2$ absorber layer from the precursor layer in one or more steps, wherein the absorber layer has a surface region, a bulk region and a transition region disposed between the surface region and the bulk region, wherein the surface region includes: a thickness of less than about 300 nm, a surface region Ga/(Ga+In) molar ratio within the surface region in the range of 0.05 to about 0.15.

One notable problem encountered when creating CIG(S)Se films for solar cells using low cost 2-step selenization methods is preventing Ga from segregating to the back of the film. Two-step selenization methods entail one step where a metal, oxide, or chalcogenide (or other Ag, Au, Cu, In, Ga, S, or Se containing compounds) precursor film is deposited, and then subsequently selenized (and/or sulfidized) in a second step. The approach described herein is to create (Ag,Cu)(In, Ga)(Se,S)$_2$ (hereafter referred to as ACIGSS) by adding Ag to the precursor film. It has been found that this enables more of the Ga to remain forward in the film. Ga at the front surface of the film allows for higher open-circuit voltage solar cells and therefore higher efficiencies.

Optionally, the following may also be adapted for use with any of the embodiments disclosed herein. Processing comprises annealing with a ramp-rate of 1-5° C./sec, preferably over 5° C./sec, to a temperature of about 225 to 575° C. Optionally, processing comprises annealing with a ramp-rate of 1-5° C./sec, preferably over 5° C./sec, to a temperature of about 225 to 650° C. preferably for about 30 seconds to about 600 seconds to enhance conversion of indium hydroxide or other hydroxide, densification and/or alloying between Cu, In, and Ga in an atmosphere containing hydrogen gas, where the plateau temperature not necessarily is kept constant in time. Optionally, processing further comprises selenizing and/or sulfidizing this annealed layer with a ramp-rate of 1-5° C./sec, preferably over 5° C./sec, to a temperature of about 225 to 650° C. for a time period of about 60 seconds to about 10 minutes in the appropriate VIA vapor, where the plateau temperature not necessarily is kept constant in time, to form the thin-film containing one or more chalcogenide compounds containing Cu, In, Ga, Ag, and Se. Optionally, processing comprises selenizing and/or sulfizding without the separate annealing step in an atmosphere containing hydrogen gas, but may be densified and selenized in one step with a ramp-rate of 1-5° C./sec, preferably over 5° C./sec, to a temperature of 225 to 650° C. for a time period of greater than about 120 seconds, e.g., between about 120 second to about 90 minutes in an atmosphere containing either H$_2$Se or a mixture of H$_2$ and Se vapor (or H$_2$S or H$_2$ and S vapor) or Se vapor, with or without S vapor.

For any of the embodiments herein, these layers can be deposited by techniques such as but not limited to electroplating, nanoparticle deposition, coevaporation, deposition by gas, vacuum, or vapor phase techniques (vacuum evaporation, sputtering, vapor transport, etc.) of the constituent elements either in sequence or the simultaneous deposition of two or more elements, or any combination thereof, or the like.

A further understanding of the nature and advantages of the invention will become apparent by reference to the remaining portions of the specification and drawings.

BRIEF DESCRIPTION OF THE DRAWINGS

FIGS. 2A-2F show a series of cross-sectional views showing formation of various layers of materials according to one embodiment of the present invention.

DESCRIPTION OF THE SPECIFIC EMBODIMENTS

Figure 1A:
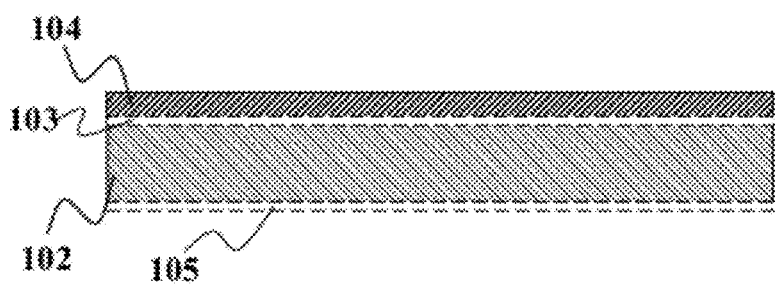
FIGS. 1A-1D are schematic cross-sectional diagrams illustrating fabrication of a film according to an embodiment of the present invention.

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

To date, the actual reduction to practice or formation of a senary or higher group IB-IIIA-VIA alloy has not been known to have been actually created based on any known published results from research or academic groups. The fact that such a material has not be made could be due to potential cost of making such a material, difficulty creating such an senary alloy, and even incentive to create an alloy that does not seem on its face to have an performance benefit. Accordingly, the properties of such senary or higher group IB-IIIA-VIA alloy are substantially unknown, including properties that make a high efficiency senary semiconductor. The lack of work in the space points to the non-obvious nature of this material.

Co-evaporation processes, although expensive to operate and low throughput, can precisely build semiconductor layers with the exact material composition in depth to create a desired material composition. To date, however, there has been no disclosure in published literature on the material composition/molar ratio depth profile for a senary or higher group IB-IIIA-VIA that will create a high conversion efficiency semiconductor absorber layer. Thus, without this teaching or even suggestion to make such a material, there is no motivation to make this material. Arguendo, even if there is motivation (which there is not), there has been no known enabling disclosure, teaching, or suggestion of how to create a senary or higher group IB-IIIA-VIA with improved performance qualities.

In one embodiment of the present invention, a senary (Ag,Cu)(In,Ga)(SeS)$_2$ semiconductor layer has been created. Multiple (Ag,Cu)(In,Ga)(SeS)$_2$ semiconductor films have been created. Although some embodiments may replace one or more of the elements with others in the same grouping based on: Group IB (Cu,Ag,Au), Group IIIA (B,Al,Ga,In,Tl) and Group VIA (O,S,Se,Te,Po), by way of non-limiting example, a desired semiconductor compound is (Ag,Cu)(In,Ga)(SeS)$_2$.

Figure 10:
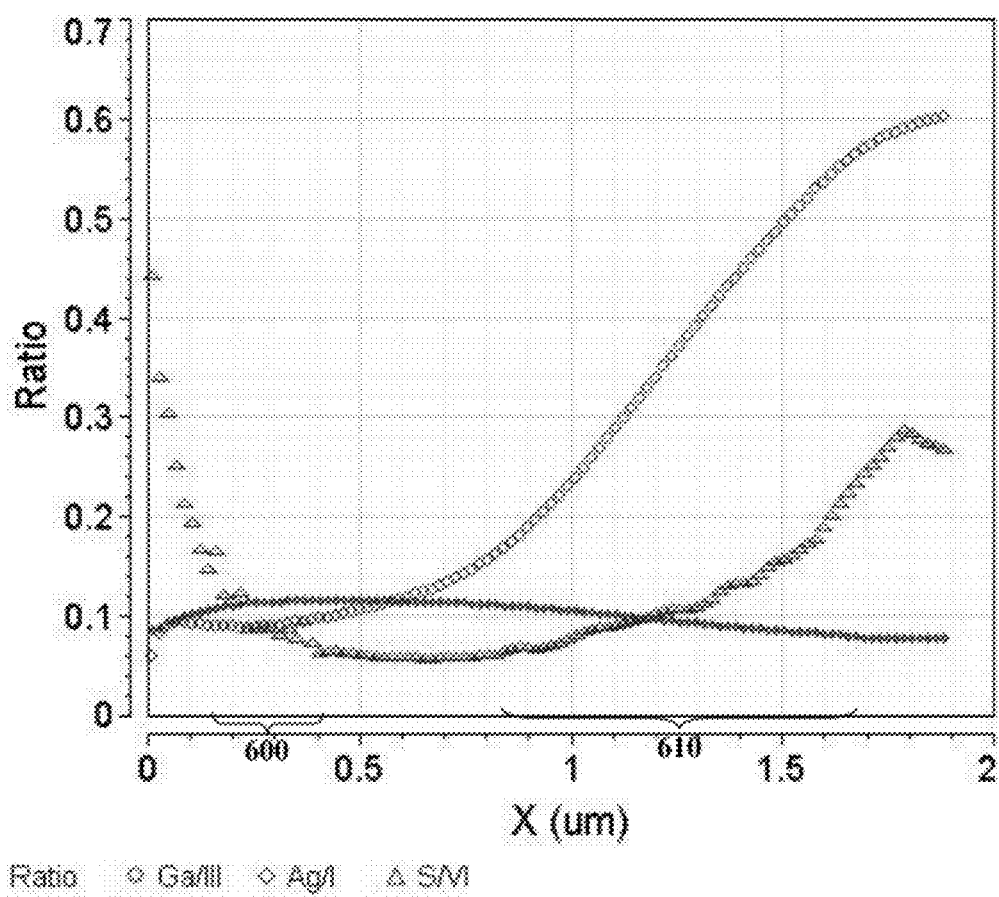
FIG. 10 is a graph of certain molar ratios as a function of depth in an absorber

In one non-limiting example, FIG. 10 shows that the desired senary (Ag,Cu)(In,Ga)(SeS)$_2$ semiconductor should be manufactured to have a depth profile with varying material concentrations. FIG. 10 shows that a (Ag,Cu)(In,Ga)(SeS)$_2$ absorber layer comprising a surface region 600, a bulk region 610, and a transition region disposed between the surface region and the bulk region. In some embodiments, the bulk region is at least 400 nm thick. Optionally, the bulk region is at least 500 nm thick. Optionally, the bulk region is at least 600 nm thick. Optionally, the bulk region is at least 700 nm thick. Optionally, the bulk region is at least 800 nm thick. Optionally, the bulk region is at least 900 nm thick.

In one embodiment, the surface region includes: a thickness of about 300 nm or less, a Ga/(Ga+In) molar ratio that is in the range of about 0.05 to about 0.15, a S/(Se+S) molar ratio that is in the range of about 0.1 to about 0.45, and a Ag/(Ag+Cu) molar ratio that is in the range of about 0.05 to about 0.2. By way of example, the Ga/(Ga+In) for the entire absorber may be higher in the range of about 0.2 to 0.5. Optionally, Ga/(Ga+In) for the entire absorber may be higher in the range of about 0.25 to 0.4. Optionally, Ga/(Ga+In) for the entire absorber may be higher in the range of about 0.3 to 0.4.

As seen in FIG. 10, silver profile in the surface region of the absorber layer drops significantly, relative to the relatively straight line trend of silver content in the rest of the absorber layer. In one non-limiting example, silver goes to areas of low bandgap and near the surface region, the bandgap is high relative to other areas of the absorber layer. This downward notch in the silver profile creates a non-linear silver profile in the surface region.

Without being bound to any particular theory or composition, this range of materials in the surface region of the absorber layer provides improved device performance and has not been taught in the published literature. This is due in part that no published literature has described a senary semiconductor that includes both silver and sulfur in an actually created semiconductor film. Having created many of these senary semiconductor film of (Ag,Cu)(In,Ga)(SeS), applicant has found that the materials with compositions in the range describe have yielded improved device performance.

In one non-limiting example, the use of silver (and/or gold) can raise minimum bandgap to at least about 1.1 eV without having to increase gallium Ga/group III molar ratio in the entire absorber layer to greater than about 0.4.

Figure 11:
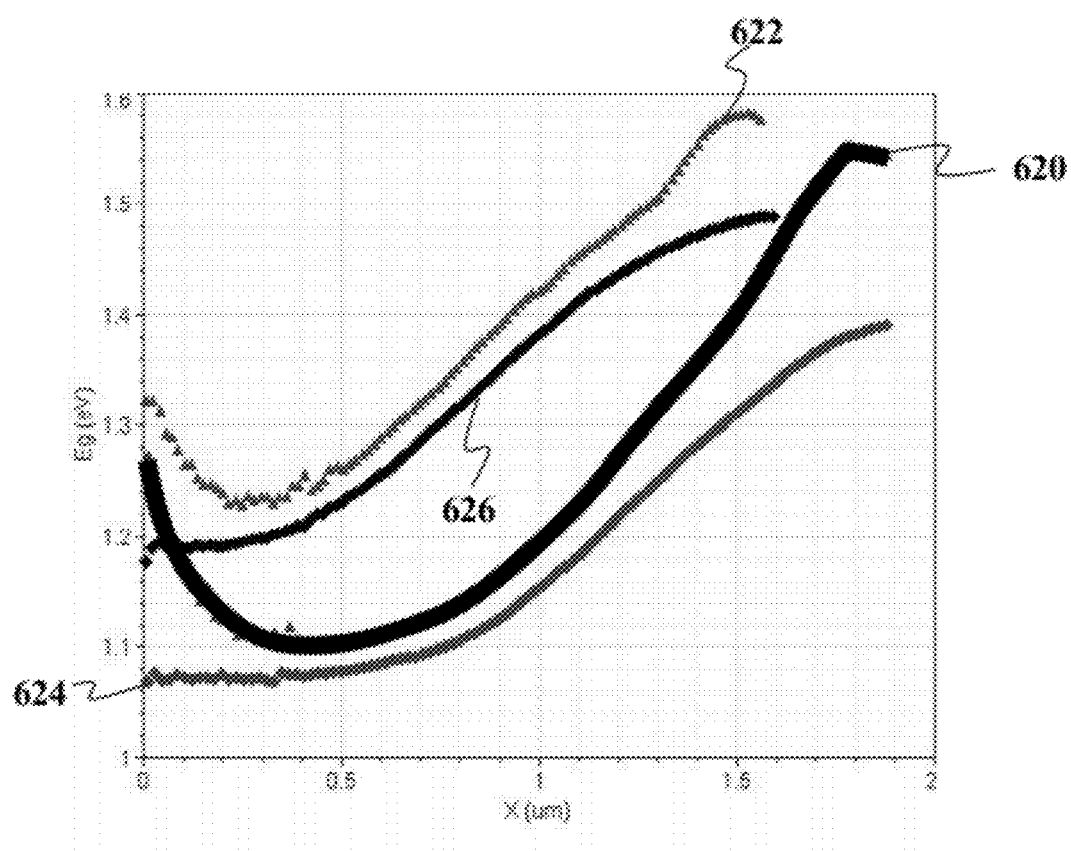
FIG. 11 is a graph showing bandgap depth profiles for several different types thin film absorber layers.

FIG. 11 shows the bandgap depth profiles for several different types thin film absorber layers. Line 620 shows a (Ag,Cu)(In,Ga)(SeS) absorber having minimum bandgap to at least about 1.1 eV without having to increase gallium Ga/group III molar ratio in the entire absorber layer to greater than about 0.4. Line 622 shows a (Ag,Cu)(In,Ga)(SeS) where high levels of gallium were used (Ga/group III molar ratio in the entire absorber layer greater than about 0.5) which moved the minimum bandgap to over 1.25 eV, which is less desirable. Other embodiments are shown in the graph were without S and the bandgap profile does not have a surface region increase in bandgap. For example, line 624 represents an embodiment similar to that of line 620, minus the addition of sulfur. Line 626 represents an embodiment similar to that of line 622, minus the addition of sulfur.

Figure 12:
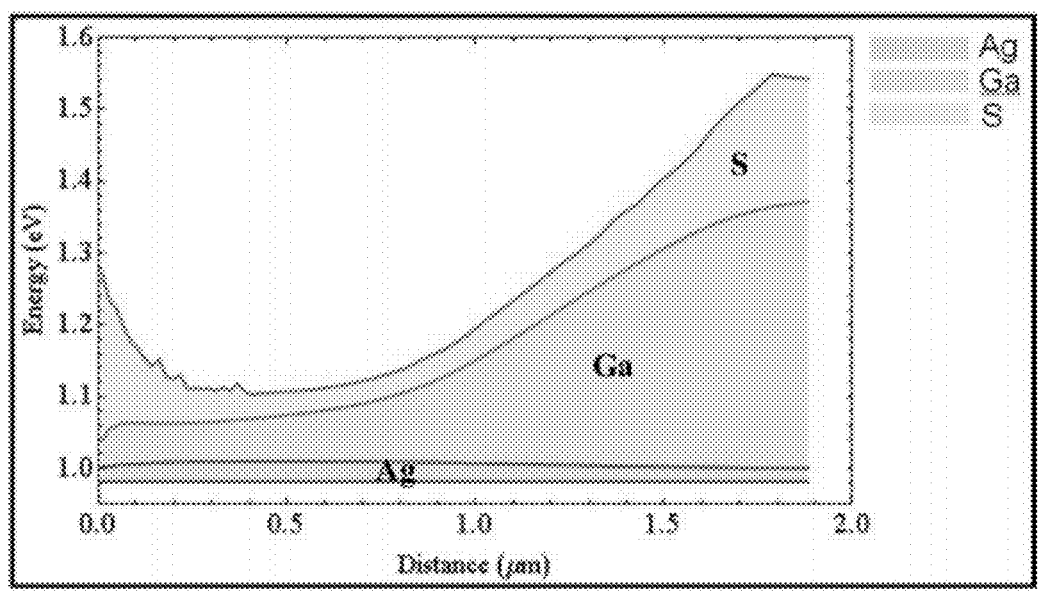
FIG. 12 is a graph illustrating calculated bandgap contributions in an absorber layer from silver, gallium, and sulfur.

FIG. 12 shows calculated bandgap contribution from each of silver, gallium, and sulfur. As can be seen from the graph, the silver contribution, as compared to the other two elements, creates a more flat or uniform contribution to the bandgap across the depth of the profile. Thus, changing silver content will raise or lower the minimum bandgap in the transition region in substantially "flat" or uniform manner, for that region. The change in other regions of the absorber layer based on silver will also be more flat that the more angled shapes associated with the other two elements. In a 2-step or multi-step process, the use of silver provides a third variable to raise or lower the bandgap of entire the semiconductor layer without substantially changing the shape of the bandgap profile. Sulfur changes bandgap most significantly in the surface region. Gallium most significantly changes bandgap in the bulk region.

Figure 13:
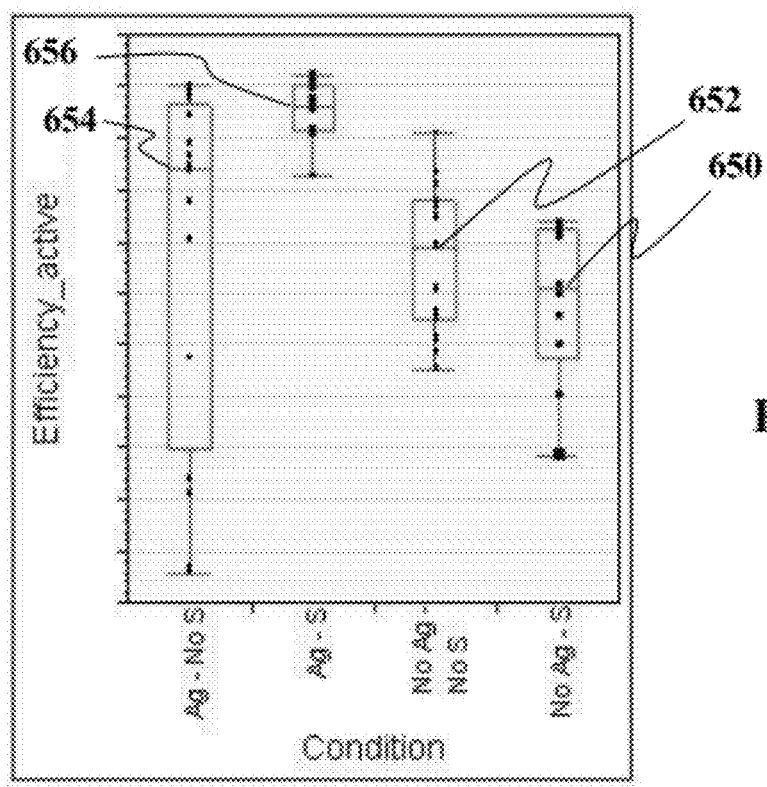
FIG. 13 is a plot illustrating conversion efficiency for absorber layers made under different conditions.
Figure 14:
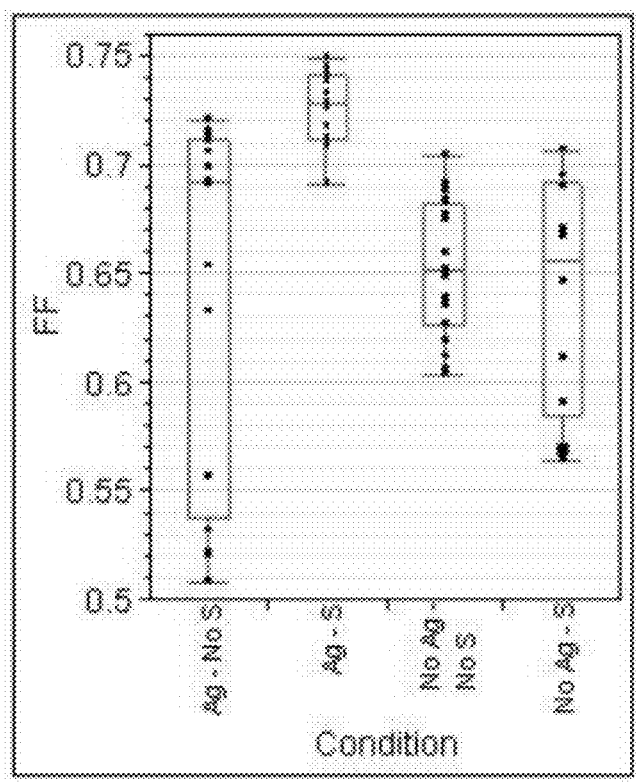
FIG. 14 is a plot illustrating fill factor for absorber layers made under different conditions.

FIGS. 13 and 14 show that a (Ag,Cu)(In,Ga)(SeS) absorber having minimum bandgap to at least about 1.1 eV and Ag/IB ratio less than about 0.3 has a higher conversion efficiency than other embodiments. FIG. 13 shows that adding sulfur to CIGS as indicated by column 650 actually decreases conversion efficiency relative to CIGS in column 652, particularly after full selenization of the layer as is the case for this example. Adding silver to CIGS increases efficiency as indicated by column 654. Column 656 shows highest efficiencies of all the combinations listed and is surprisingly higher than the expected combination of silver and sulfur, due to the indicated reduction in efficiency shown in column 650 for embodiments that include sulfur. Thus, the potential interaction of sulfur with silver unexpectedly improves device performance. For all of the examples in FIG. 13, if sulfur is added, it occurs after full selenization. Of course, adding sulfur before or during partial selenization is not excluded.

FIG. 14 shows a still further example wherein the fill factor for a (Ag,Cu)(In,Ga)(SeS) is unexpectedly higher than the fill factors for all other combinations, even higher than the sum of the individual contributions associated with silver or sulfur alone with CIGS.

In another embodiment of the present invention, an optoelectronic device is provided a (Ag,Cu)(In,Ga)(SeS)$_2$ absorber layer having a surface region, a bulk region and a transition region between the surface region and the bulk region, wherein a bulk region Ga/(Ga+In) molar ratio within the bulk region is about 0.4 or less while a $J_{sc}$ of the solar cell under AM 1.5G is at least about 32 mA/cm$^2$ and a fill factor of at least about 73%. In another embodiment of the present invention, an optoelectronic device is provided a (Ag,Cu)(In, Ga)(SeS)$_2$ absorber layer having a surface region, a bulk region and a transition region between the surface region and the bulk region, wherein a bulk region Ga/(Ga+In) molar ratio within the bulk region is about 0.37 or less while a $J_{sc}$ of the solar cell under AM 1.5G is at least about 33 mA/cm$^2$ and a fill factor of at least about 74%. In another embodiment of the present invention, an optoelectronic device is provided a (Ag, Cu)(In,Ga)(SeS)$_2$ absorber layer having a surface region, a bulk region and a transition region between the surface region and the bulk region, wherein a bulk region Ga/(Ga+In) molar ratio within the bulk region is about 0.35 or less while a $J_{sc}$ of the solar cell under AM 1.5G is at least about 33 mA/cm$^2$ and a fill factor of at least about 75%. For any of the embodiments herein, the solar cell may be coated with or without an anti-reflective coating to further increase conversion efficiency.

Non-Copper Group IB Additive

In one embodiment of the present invention, an additive and/or dopant is added to the precursor material to minimize the migration of the group IIIA material to the back of the absorber layer. As mentioned, when selenizing and/or sulfidizing metallic (or oxide, or chalcogenide, or other Cu, In, Ga, S, or Se containing compounds) precursor films, it is difficult to keep the Ga from segregating to the back of the film. Although not limited to only this purpose, the additive or dopant can minimize Ga segregation to the back of the layer. It can also a facilitate incorporation of sulfur into a chalcogenide layer.

In some embodiments, the Ag or other non-copper group IB additive is evenly distributed in the ink during deposition. This even distribution in the ink makes the silver or group IB additive available throughout the precursor layer for reaction to all the particles and/or precursors therein. This provides the group IB additive material throughout the depth of the layer and not concentrated at any particular depth. Some embodiments may use particles of smaller sizes such as from 0.1 nm to 1500 nm in mean diameter or largest dimension. Optionally, the particle size is between 0.5 nm to 200 nm in mean diameter or largest dimension. Optionally, the particle size is between 0.5 nm to 100 nm in mean diameter or largest dimension. Optionally, the particle size is between 0.5 nm to 50 nm in mean diameter or largest dimension. Optionally, the particle size is between 0.5 nm to 20 nm in mean diameter or largest dimension.

Optionally, other particle shapes such as spherical, flake, hexagonal, polygonal, cylindrical, nanowires, or combinations of any of the foregoing may also be used. For example, methods have been used to provide uniform layers of nanowires over semiconductor materials. Optionally, some embodiment may desire to lock in the IB material be using core-shell particles with IIB in the core and a IB, IIIA, or VIA shell.

In some embodiments, it should be understood that all of particles used in the system are solid particles. Optionally, only one of the components is in liquid form above 100° C.

Optionally, at least two of the particles are binary alloys. By way of nonlimiting example, the material may be Cu(solid)+In(solid)+Ga(liquid above 100° C.)+Ag(solid) in the precursor. Optionally, the material may be CuIn(solid)+Ga(liquid above 100° C.)+Ag(solid) in the precursor. Optionally, the material may be Cu(solid)+CuGa(solid)+In(solid)+Ag(solid) in the precursor. Optionally, the material may be CuIn(solid)+CuGa(solid)+Ga(liquid above 100° C.)+Ag (solid) in the precursor. Some embodiments may substitute Ag-IIIA, Ag—Cu-IIIA, Ag—Cu—In—Ga, AgIn$_2$, AgGa, and/or (CuGa)$_1$In$_2$ for the In or Ga source.

These various precursor combinations can be used as stated or in combination with other elements or materials to achieve a material with the following stoichiometric combinations: Ag/(Ag+Cu)=0.05-0.6, Ga/(Ga+In)=0.1-0.7, and (Ag+Cu)/(Ga+In)=0.7-1.0. Optionally, the various precursor combinations can be used as stated or in combination with other elements or materials to achieve a material with the following stoichiometric combinations: Ag/(Ag+Cu)=0.1-0.4, Ga/(Ga+In)=0.2-0.5, and (Ag+Cu)/(Ga+In)=0.8-0.9. The resulting devices with the group IB additive had high Voc=700 mV. Optionally, the resulting devices with the group IB additive had high Voc of at least 650 mV. Optionally, the resulting devices with the group IB additive had high Voc of at least 600 mV. Optionally, the resulting devices with the group IB additive had high Voc of at least 550 mV.

Optionally, some embodiments may use a ratio of about Ag/(Ag+Cu)=0.25-0.30, Ga/(Ga+In)=0.25-0.33, and (Ag+Cu)/(Ga+In)=0.80-0.95. The bandgap is not linear through the depth of the layer. Silver is everywhere throughout the layer. The silver will pull up the bandgap. In some embodiments, the silver content is substantially constant through the depth of the absorber layer. In some embodiments, the bandgap probably may not be perfectly flat, and thus it may be desirable to reduce the overall gallium content so that the gallium at the rear or back of the layer is not too high.

Optionally, some embodiments may use a ratio of about Ag/(IB)=0.05-0.4, Ga/(Ga+In)=0.30-0.80, and (Ag+Cu)/(Ga+In)=0.80-0.89. These ratios are averages for the entire absorber layer, not any specific region.

Optionally, some embodiments may use a ratio of about Ag/(IB)=0.2-0.3, Ga/(Ga+In)=0.30-0.50, and (Ag+Cu)/(Ga+In)=0.80-0.89.

Optionally, some embodiments may use a ratio of about Ag/(IB)=0.29 Ga/(Ga+In)=0.30-0.50, and (Ag+Cu)/(Ga+In)=0.80-0.89. Optionally, some embodiments may use a ratio of about Ag/(IB)=0.08 to 0.28. Optionally, some embodiments may use a ratio of about Ag/(IB)=0.08 to 0.27. Optionally, some embodiments may use a ratio of about Ag/(IB)=0.08 to 0.26. Optionally, some embodiments may use a ratio of about Ag/(IB)=0.08 to 0.25. Optionally, some embodiments may use a ratio of about Ag/(IB)=0.08 to 0.24. Optionally, some embodiments may use a ratio of about Ag/(IB)=0.08 to 0.23. Optionally, some embodiments may use a ratio of about Ag/(IB)=0.08 to 0.22. Optionally, some embodiments may use a ratio of about Ag/(IB)=0.08 to 0.21.

Optionally, some embodiments may use a ratio of about Ag/(IB)=0.1-0.2, Ga/(Ga+In)=0.30-0.50, and (Ag+Cu)/(Ga+In)=0.80-0.89.

Chalcogenization and/or Sulfidation

For any of the embodiments herein, it should be understood that the chalcogenization and/or sulfidation may be configured using one or more of the processes described herein.

In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, no selenium is introduced until a dwell temperature of 400-600° C. is reached. In some embodiments, the first segment is to introduce selenium vapor in the first segment of the selenization for a duration of 10-360 seconds, at a temperature between 200-450° C. In some embodiments, the next segment of the selenization should be between 10-360 seconds, at a temperature between 400-600° C. Some embodiments may increase selenium concentration in the latter portion of this time period. Optionally, some embodiments may decrease selenium concentration after an initial time period in this temperature region. The partial pressure of selenium vapor in an inert gas (such as argon or nitrogen) to be delivered to the sample in the initial phase of selenization should be 10-100 mmHg. After this stage the film will be fully reacted into a $(Ag,Cu)_x(In,Ga)_ySe_z$ compound, and there will not be any partially reacted binary selenide phases still present in the film, where x is between 0.6-1, y is between 0.6-3, and z is between 1.2-5. Thus, the process fully selenizes the precursor layer to form a chalcogenide layer. In some embodiments, the second segment is to introduce S vapor at a partial pressure in an inert gas (such as argon or nitrogen) of 0.2-50 mmHg, while the sample is still at a dwell temperature of 400-600° C., for a duration of 60-360 seconds. Optionally, the duration is from 360 seconds to 960 seconds. Some embodiments have both S and Se in this second segment. Optionally, some embodiments only use S in this second segment. The final segment is to cool the sample in an N2, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, the first segment is to introduce selenium vapor in the first segment of the selenization for a duration of 10-360 seconds, at a temperature between 200-450° C. The partial pressure of selenium vapor in an inert gas (such as argon or nitrogen) to be delivered to the sample in the initial phase of selenization should be 0.01-10 mmHg. After this segment the film may not be fully reacted into a $(Ag,Cu)_x(In,Ga)_ySe_z$ compound, where x is between 0.6-1, y is between 0.6-3, and z is between 1.2-5, and there may be some partially reacted binary selenide phases still present in the film. In some embodiments, the second segment is to increase the sample dwell temperature to 400-600° C. introduce S vapor at a partial pressure in an inert gas (such as argon or nitrogen) of 0.2-50 mmHg for a duration of 60-360 seconds. Optionally, the duration is from 360 seconds to 960 seconds. Some embodiments have both S and Se in this second segment. Optionally, some embodiments only use S in this second segment. The final segment is to cool the sample in an N2 or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, the first segment is to introduce hydrogen selenide gas at this point, while the sample is increasing in temperature up to the dwell temperature of 400-600° C. Some embodiments may hold off on introduction of hydrogen selenide until the dwell temperature is reached. In some embodiments, the first segment of the selenization time should be between 10-360 seconds, at a temperature between 400-600° C. The concentration of hydrogen selenide to be delivered to the sample in the initial phase of selenization should be 0.1-10% in an inert gas (such as argon or nitrogen), optionally along with a small concentration of oxygen gas (optionally 0.001-0.1%). After this segment the film may or may not be fully reacted into a $(Ag,Cu)_x(In,Ga)_ySe_z$ compound, where x is between 0.6-1, y is between 0.6-3, and z is between 1.2-5, and there may or may not be some partially reacted binary selenide phases still present in the film. In some embodiments, the second segment is to increase the sample dwell temperature to 400-600° C. introduce hydrogen sulfide. The concentration of hydrogen sulfide to be delivered to the sample in this second segment should be 0.1-10% in an inert gas (such as argon or nitrogen), optionally along with a small concentration of oxygen gas (optionally 0.001-0.1%). Optionally, the duration is from 360 seconds to 960 seconds. Some embodiments have both $H_2S$ and $H_2Se$ in this second segment. Optionally, some embodiments only use $H_2S$ in this second segment. The final segment is to cool the sample in an $N_2$, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

In yet another embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. Some may use a first step 20° C./sec ramp and has the $H_2Se$ step for 15-60 min. In some embodiments, the first segment is to introduce hydrogen selenide gas at this point, while the sample is increasing in temperature up to the dwell temperature of 400-600° C. Some embodiments may hold off on introduction of hydrogen selenide until the dwell temperature is reached. In some embodiments, the first segment of the selenization time should be between 15-45 minutes, at a temperature between 400-450° C. Some embodiments can run for as long as 60 minutes in this temperature range. The concentration of hydrogen selenide to be delivered to the sample in the initial phase of selenization should be 0.1-10% in an inert gas (such as argon or nitrogen), optionally along with a small concentration of oxygen gas (optionally 0.001-0.1%). After this segment the film may or may not be fully reacted into a $(Ag,Cu)_x(In,Ga)_ySe_z$ compound, where x is between 0.6-1, y is between 0.6-3, and z is between 1.2-5, and there may or may not be some partially reacted binary selenide phases still present in the film. In some embodiments, the second segment is to increase the sample dwell temperature to 400-600° C. introduce hydrogen sulfide. Some use 550 to 600° C. for 10 to 60 minutes. The second step ramp is less than 15 min in one embodiment. The concentration of hydrogen sulfide to be delivered to the sample in this second segment should be 0.1-10% in an inert gas (such as argon or nitrogen), optionally along with a small concentration of oxygen gas (optionally 0.001-0.1. Some embodiments have both $H_2S$ and $H_2Se$ in this second segment. Optionally, some embodiments only use $H_2S$ in this second segment. Some embodiments include an option for 550° C. for 20 min $N_2$ only, and then a third step at 550° C. for 10 min in $H_2S$, The final segment is to cool the sample in an $N_2$, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, the first segment is to introduce hydrogen selenide gas at this point, while the sample is increasing in temperature up to the dwell temperature of 400-600° C. In some embodiments, the first segment of the selenization time should be between 10-360 seconds, at a temperature between 400-600° C. The concentration of hydrogen selenide to be delivered to fully selenize the precursor layer to form a $(Ag, Cu)_x(In,Ga)_ySe_z$ compound, where x is between 0.6-1, y is between 0.6-3, and z is between 1.2-5. Some embodiments may increase the time period in the hydrogen selenide atmosphere so that full selenization is reached. In some embodiments, the second segment is to increase the sample dwell temperature to 400-600° C. introduce hydrogen sulfide. The concentration of hydrogen sulfide to be delivered to the sample in this second segment should be 0.1-10% in an inert gas (such as argon or nitrogen), optionally along with a small concentration of oxygen gas (optionally 0.001-0.1%). Optionally, the duration is from 360 seconds to 960 seconds. Some embodiments have both $H_2S$ and $H_2Se$ in this second segment. Optionally, some embodiments only use $H_2S$ in this second segment. The final segment is to cool the sample in an $N_2$, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

Embodiment 1

A metal foil substrate was sputtered with Mo to form a 500 nm to 1000 nm Mo film to serve as the back contact. A barrier layer of 50 nm to 300 nm of Chromium, TiN, HfN, or other transition metal nitride barrier was formed onto the Mo back contact. A precursor ink comprised of Cu, In, Ga, and Ag, and atomic ratios Ag/(Ag+Cu)=0.1-0.3, Ga/(Ga+In)=0.35-0.5, and (Ag+Cu)/(Ga+In)=0.80-1.0. For the present embodiment, an approximately 0.5-2.5 micron thick layer of precursor material containing solution is deposited on the substrate. The precursor material may be dispersed in a solvent such as water, alcohol or ethylene glycol with the aid of organic surfactants and/or dispersing agents described herein to form an ink.

The precursor layer is annealed with a ramp-rate of 1-5° C./sec, optionally over 5° C./sec, to a temperature of about 225° to about 650° C. optionally for about 30 seconds to about 600 seconds to enhance densification and/or alloying between Ag, Cu, In, and Ga in an atmosphere containing hydrogen or nitrogen gas, where the plateau temperature not necessarily is kept constant in time. Some embodiments may heat to a temperature of at least 500° C. Optionally, some embodiments may heat to a temperature of at least 505° C. Optionally, some embodiments may heat to a temperature of at least 510° C. Optionally, some embodiments may heat to a temperature of at least 515° C. Optionally, some embodiments may heat to a temperature of at least 520° C. Optionally, some embodiments may heat to a temperature of at least 525° C. Optionally, some embodiments may heat to a temperature of at least 530° C. Optionally, some embodiments may heat to a temperature of at least 535° C. Optionally, some embodiments may heat to a temperature of at least 540° C. Optionally, some embodiments may heat to a temperature of at least 545° C. Optionally, some embodiments may heat to a temperature of at least 550° C.

Subsequently, this annealed layer is selenized and/or sulfdized (in that order or vice versa). The chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, no selenium is introduced until a dwell temperature of 400-600° C. is reached. In some embodiments, the first segment is to introduce selenium vapor in the first segment of the selenization for a duration of 10-360 seconds, at a temperature between 200-450° C. In some embodiments, the next segment of the selenization should be between 10-360 seconds, at a temperature between 400-600° C. Some embodiments may increase selenium concentration in the latter portion of this time period. Optionally, some embodiments may decrease selenium concentration after an initial time period in this temperature region. The partial pressure of selenium vapor in an inert gas (such as argon or nitrogen) to be delivered to the sample in the initial phase of selenization should be 10-100 mmHg. After this stage the film will be fully reacted into a $(Ag,Cu)_x(In,Ga)_ySe_z$ compound, and there will not be any partially reacted binary selenide phases still present in the film, where x is between 0.6-1, y is between 0.6-3, and z is between 1.2-5. Thus, the process fully selenizes the precursor layer to form a chalcogenide layer. In some embodiments, the second segment is to introduce S vapor at a partial pressure in an inert gas (such as argon or nitrogen) of 0.2-50 mmHg, while the sample is still at a dwell temperature of 400-600° C., for a duration of 60-360 seconds. Optionally, the duration is from 360 seconds to 960 seconds. Some embodiments have both S and Se in this second segment. Optionally, some embodiments only use S in this second segment. The final segment is to cool the sample in an $N_2$, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

Optionally, instead of this two-step approach, the layer of precursor material may be selenized without the separate annealing step in an atmosphere containing hydrogen or nitrogen gas, but may be densified and selenized in one step with a ramp-rate of 1-5° C./sec, optionally over 5° C./sec, to a temperature of 225 to 600° C. for a time period of about 120 seconds to about 20 minutes in an atmosphere containing either $H_2Se$ or a mixture of $H_2$ and Se vapor or Se vapor, with or without S vapor. Some embodiment use only Se material and completely avoid $H_2Se$. It should be understood that other embodiments may be configured to include S vapor or $H_2S$ to create the desired ACIGS or ACIGSS absorber.

These absorber layer films were then used in the fabrication of photovoltaic devices by chemical bath deposition of 50 nm CdS, followed by sputter deposition of an i:ZnO layer and Al:ZnO window layer, followed by deposition of a silver paste grid structure. For the window layer, some embodiments may use ITO, B:ZnO, A:ZnoY, non-vacuum deposited transparent conductors or other transparent oxides.

Embodiment 2

A metal foil substrate was sputtered with Mo to form a 500 nm to 1000 nm Mo film to serve as the back contact. A barrier layer of 50 nm to 300 nm of Chromium, TiN, HfN, or other transition metal nitride barrier was formed onto the Mo back contact. A precursor ink comprised of Cu, In, Ga, and Ag, and atomic ratios Ag/(Ag+Cu)=0.2-0.3, Ga/(Ga+In)=0.3-0.4, and (Ag+Cu)/(Ga+In)=0.8-0.9. For the present embodiment, an approximately 0.5-2.5 micron thick layer of the precursor material containing solution is deposited on the substrate. The precursor material may be dispersed in a solvent such as water, alcohol or ethylene glycol with the aid of organic surfactants and/or dispersing agents described herein to form an ink.

The precursor layer is annealed with a ramp-rate of 1-5° C./sec, optionally over 5° C./sec, to a temperature of about 225° to about 650° C. optionally for about 30 seconds to about 600 seconds to enhance densification and/or alloying between Ag, Cu, In, and Ga in an atmosphere containing hydrogen or nitrogen gas, where the plateau temperature not necessarily is kept constant in time. Some embodiments may heat to a temperature of at least 500° C. Optionally, some embodiments may heat to a temperature of at least 505° C. Optionally, some embodiments may heat to a temperature of at least 510° C. Optionally, some embodiments may heat to a temperature of at least 515° C. Optionally, some embodiments may heat to a temperature of at least 520° C. Optionally, some embodiments may heat to a temperature of at least 525° C. Optionally, some embodiments may heat to a temperature of at least 530° C. Optionally, some embodiments may heat to a temperature of at least 535° C. Optionally, some embodiments may heat to a temperature of at least 540° C. Optionally, some embodiments may heat to a temperature of at least 545° C. Optionally, some embodiments may heat to a temperature of at least 550° C.

Subsequently, this annealed layer is selenized and/or sulfdized (in that order or vice versa). In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, the first segment is to introduce selenium vapor in the first segment of the selenization for a duration of 10-360 seconds, at a temperature between 200-450° C. The partial pressure of selenium vapor in an inert gas (such as argon or nitrogen) to be delivered to the sample in the initial phase of selenization should be 0.01-10 mmHg. After this segment the film may not be fully reacted into a $(Ag,Cu)_x(In,Ga)_ySe_z$ compound, where x is between 0.6-1, y is between 0.6-3, and z is between 1.2-5, and there may be some partially reacted binary selenide phases still present in the film. In some embodiments, the second segment is to increase the sample dwell temperature to 400-600° C. introduce S vapor at a partial pressure in an inert gas (such as argon or nitrogen) of 0.2-50 mmHg for a duration of 60-360 seconds. Optionally, the duration is from 360 seconds to 960 seconds. Some embodiments have both S and Se in this second segment. Optionally, some embodiments only use S in this second segment. The final segment is to cool the sample in an $N_2$ or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

Optionally, instead of this two-step approach, the layer of precursor material may be selenized without the separate annealing step in an atmosphere containing hydrogen or nitrogen gas, but may be densified and selenized in one step with a ramp-rate of 1-5° C./sec, optionally over 5° C./sec, to a temperature of 225 to 600° C. for a time period of about 120 seconds to about 20 minutes in an atmosphere containing either $H_2Se$ or a mixture of $H_2$ and Se vapor or Se vapor, with or without S vapor. It should be understood that other embodiments may be configured to include S vapor or $H_2S$ to create the desired ACIGS or ACIGSS absorber.

These absorber layer films were then used in the fabrication of photovoltaic devices by chemical bath deposition of 50 nm CdS. The parts were finished into devices using a CdS junction partner, a ZnO-based transparent conductor and a metallic grid top contact formed from a silver based paste. For the window layer, some embodiments may use ITO, B:ZnO, A:ZnoY, non-vacuum deposited transparent conductors or other transparent oxides.

Embodiment 3

A metal foil substrate was sputtered with Mo to form a 500 nm to 1000 nm Mo film to serve as the back contact. A barrier layer of 50 nm to 300 nm of Chromium, TiN, HfN, or other transition metal nitride barrier was formed onto the Mo back contact. The method may be used to form a IB-IIB-IVA-VIA absorber material. A precursor ink is provided wherein Ag/IB=0.1-0.4. A method of forming $(Ag,Cu)_xZn_ySn_zS_aSe_b$ (ACZTSSe) layers with well-defined total bulk stoichiometries, wherein x ranges from 1.5 to 2.5, y ranges from 0.9 to 1.5, z ranges from 0.5 to 1.1, a ranges from 0 to 4.2, optionally from 0.1 to 4.2, and b ranges from 0 to 4.2, optionally from 0.1 to 4.2, and which method is easy to apply and suitable for large scale production of thin film solar cells.

In one embodiment, the stoichiometric ratio for a ACZTS solar cell precursor foil may be (Ag: 10 at.-%, Cu: 40 at.-%, Zn: 25 at.-%, Sn: 25 at.-%) Optionally, a further object of the invention is to provide a thin film of ACZTSS (AgCuZnSn $(SSe)_4$) and related compounds like $(Cu,Ag)_xZn_ySn_zCh1_aCh2_b$. A still further object of the present invention is to provide precursors of these chalcogenides, i.e., more specifically, $Ag_xCu_xZn_ySn_z$ in foil form. In this manner, the desired stoichiometry is fixed in the bulk material.

It should be understood that the precursor layer is designed to be IIB rich. This is particularly true if the IIB material is Zn. The desirable atomic ratio of IIB to IVA is at least 55:45 or optionally as high as 60:40. This IIB rich ratio in the precursor is particularly desirable due to the nature of the processing that occurs. Using particles such as but not limited to elemental particles, the ratio of IIB material to others is controllable. Optionally, some embodiments may have the ratio locked into alloy particles of IIB-IVA, IB-IIB, IB-IVA or IB-IIB-IVA. This IIB rich composition may also be obtained by printing an additional layer of IIB over any existing IB IIB IVA precursor.

Optionally, some embodiment may desire to lock in the IIB material be using core-shell particles with IIB in the core and a IB, IVA, or VIA shell. Optionally, some embodiments may use a IB, IVA, or VIA layer deposited over a precursor layer of IB IIB IVA.

For the present embodiment, an approximately 0.5-2.5 micron thick layer of the precursor material containing solution is deposited on the substrate. The precursor material may be dispersed in a solvent such as water, alcohol or ethylene glycol with the aid of organic surfactants and/or dispersing agents described herein to form an ink.

The precursor layer is annealed with a ramp-rate of 1-5° C./sec, optionally over 5° C./sec, to a temperature of about 225° to about 650° C. optionally for about 30 seconds to about 600 seconds to enhance densification and/or alloying between Cu, In, and Ga in an atmosphere containing hydrogen or nitrogen gas, where the plateau temperature not necessarily is kept constant in time. Some embodiments may heat to a temperature of at least 500° C. Optionally, some embodiments may heat to a temperature of at least 505° C. Optionally, some embodiments may heat to a temperature of at least 510° C. Optionally, some embodiments may heat to a temperature of at least 515° C. Optionally, some embodiments may heat to a temperature of at least 520° C. Optionally, some embodiments may heat to a temperature of at least 525° C. Optionally, some embodiments may heat to a temperature of at least 530° C. Optionally, some embodiments may heat to a temperature of at least 535° C. Optionally, some embodiments may heat to a temperature of at least 540° C. Optionally, some embodiments may heat to a temperature of at least 545° C. Optionally, some embodiments may heat to a temperature of at least 550° C.

Subsequently, this annealed layer is selenized and/or sulfidized (in that order or vice versa). In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, no selenium is introduced until a dwell temperature of 400-600° C. is reached. In some embodiments, the first segment is to introduce selenium vapor in the first segment of the selenization for a duration of 10-360 seconds, at a temperature between 200-450° C. In some embodiments, the next segment of the selenization should be between 10-360 seconds, at a temperature between 400-600° C. Some embodiments may increase selenium concentration in the latter portion of this time period. Optionally, some embodiments may decrease selenium concentration after an initial time period in this temperature region. The partial pressure of selenium vapor in an inert gas (such as argon or nitrogen) to be delivered to the sample in the initial phase of selenization should be 10-100 mmHg. After this stage the film will be fully reacted into a $(Ag,Cu)_x(In,Ga)_ySe_z$ compound, and there will not be any partially reacted binary selenide phases still present in the film, where x is between 0.6-1, y is between 0.6-3, and z is between 1.2-5. Thus, the process fully selenizes the precursor layer to form a chalcogenide layer. In some embodiments, the second segment is to introduce S vapor at a partial pressure in an inert gas (such as argon or nitrogen) of 0.2-50 mmHg, while the sample is still at a dwell temperature of 400-600° C., for a duration of 60-360 seconds. Optionally, the duration is from 360 seconds to 960 seconds. Some embodiments have both S and Se in this second segment. Optionally, some embodiments only use S in this second segment. The final segment is to cool the sample in an N2, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

Optionally, instead of this two-step approach, the layer of precursor material may be selenized without the separate annealing step in an atmosphere containing hydrogen or nitrogen gas, but may be densified and selenized in one step with a ramp-rate of 1-5° C./sec, optionally over 5° C./sec, to a temperature of 225 to 600° C. for a time period of about 120 seconds to about 20 minutes in an atmosphere containing either $H_2Se$ or a mixture of $H_2$ and Se vapor or Se vapor, with or without S vapor. It should be understood that other embodiments may be configured to include S vapor or $H_2S$ to create the desired ACIGS or ACIGSS absorber.

The parts were finished into devices using a CdS junction partner, a ZnO-based transparent conductor and a metallic grid top contact. For the window layer, some embodiments may use ITO, B:ZnO, A:ZnoY, non-vacuum deposited transparent conductors or other transparent oxides.

Embodiment 4

In this embodiment, an extra layer of added group IB material such as but not limited to silver or gold are added on top of annealed precursor material or in the same layer during printing. Optionally, the precursor layer comprises three or more portions. These layers can be deposited by known techniques such as electroplating, nanoparticle deposition, coevaporation, deposition by gas, vacuum, or vapor phase techniques (vacuum evaporation, sputtering, vapor transport, etc.) of the constituent elements either in sequence or the simultaneous deposition of two or more elements, or any combination thereof, or the like.

The first portion is next to the contact layer and it comprises a metallic film having metallic Cu, In and optionally Ga and/or Ag. This is the portion of the precursor where most of the In and Cu are supplied from. The ingredients within the first portion are metallic, either elemental or alloy form of Cu, In and optionally Ga and/or Ag so that during the reaction step ACIGS film can grow with good microstructure and large grains. Accordingly the first portion may comprise stacks containing Ag, Cu, In and Ga (for example Ag/Cu/In/Ga, Ag/Cu/Ga/In, etc. stacks) or stacks of metallic alloys and elements (such as Cu—In/Cu—Ga, Cu—In/Ga, Cu—Ga/In, Cu—Ga/Cu—In, Ag—In, Ag—Ga, etc.). The first portion may be deposited by various techniques such as evaporation, sputtering, ink or slurry deposition etc., however, preferred method is electroplating. The thickness of the first portion may be in the range of 400-2000 nm, optionally in the range of 500-1000 nm. The (Ag,Cu)/(In+Ga) molar ratio in the first portion may be in the range of 0.7-1.2, optionally in the range of 0.8-1.0. In this equation Ag, Cu, In and Ga represent the number of moles of Ag, Cu, In and Ga, respectively, within the first portion. In one embodiment, the ratio of Ag/IB=0.1-0.4. The In/D1 molar ratio may be in the range of 0.25-0.6, where D1 represents the total number of moles of all elements within the first portion, i.e. D1 comprises total number of moles of Ag, Cu, In, Ga and an additive material such as a dopant material including one of Na, K, Li and the like that may be present in the first portion. It should be noted that there is no Group VIA material such as Se present in the first portion.

The second portion or separator layer substantially comprises a Group VIA material such as Se and Te with $(VIA)_2/D2$ molar ratio being in the range of 0.95-1.0. In this equation $(VIA)_2$ represents the number of moles of Group VIA materials and D2 represents the total number of moles of all elements within the second portion. In other words, the second portion is substantially made of a Group VIA material such as Se and Te, but it also may include up to about 5% mole of other elements or additive materials such as at least one of Ag, Cu, In, Ga, and a dopant material including one of Na, K, Li and the like. Optionally, the second portion comprises only a Group VIA material. The Group VIA material may be Se or Te or a mixture of Se and Te. The thickness of the second portion may be in the range of 50-1500 nm, optionally in the range of 100-1000 nm. Various approaches such as evaporation and ink or slurry deposition may be used to deposit the second portion, but the preferred method is electroplating.

A third portion or source layer is formed on the second portion. The third portion comprises Ga. For example, the third portion may be a film of Ga, or it may additionally contain small amounts of In and/or Cu. In any case the Ga3/D3 molar ratio within the third portion may be in the range of 0.8-1.0, where Ga3 represents the number of moles of Ga and D3 represents the total number of moles of all elements such as Cu and In that may be present within the third portion. The third portion comprises mostly Ga and additive materials such as metallic elements of Cu and In and possibly dopants including one of Na, K, Li and the like. The thickness of the third portion may be in the range of 10-200 microns, optionally in the range of 20-100 nm. The third portion may be deposited using various thin film deposition methods, however, the preferred method is evaporation.

The fourth portion or cap layer of the precursor layer consists substantially of Se. This layer may be deposited using various techniques but the preferred method is evaporation. The thickness of the fourth portion may be in the range of 500-5000 nm, optionally in the range of 800-3000 nm. The Se4/D4 molar ratio within the fourth portion may be in the range of 0.95-1.0, where Se4 represents the number of moles of Se and D4 represents the total number of moles of all elements within the fourth portion. In other words D4 includes other elements or additive materials that may be present in the fourth portion such as Te and alkali metal dopant materials including one of Na, K, Li and the like.

Each portion described above has a function within the unique structure of the precursor layer of the present invention. The first portion is the source or provider of most of the Ag, Cu and In, and optionally Ga of the overall precursor layer. The second portion is a separator between the first portion and the third portion and it provides a Group VIA material such as Se or Te to both the first portion and the Ga-containing third portion when the temperature of the precursor layer is rapidly raised above 400° C. Such reaction of Se and/or Te with the Ga within the third portion helps arrest Ga diffusion towards the contact layer 31 and keeps Ga close to the surface of the absorber after the reaction step. It should be noted that even if Te is included in the second portion, the absorber film obtained after the heating and reaction of the precursor layer 32 would be substantially a CIGS layer since the thickness of the second portion is much smaller than that of the fourth portion which comprises mostly Se. Since Te is a Group VIA material like Se and since the bandgap of $(Ag,Cu)InTe_2$ is very similar to the bandgap of $(Ag,Cu)InSe_2$, inclusion of some Te in the ACIGS layer does not negatively impact the quality of the resulting absorber layer.

Known methods to form ACIGS absorbers employed a (Au, Ag, Cu)/In/Ga/Se precursor structure and rapid thermal processing to convert this precursor structure into a ACIGS absorber. Resulting ACIGS absorbers comprised segregated In-rich and Ga-rich sections even though Ga was placed far away from the contact layer. The reason for this is the fact that when the temperature of such a precursor layer or stack is raised, Ga can react with the Se layer placed on top of it as well as with the In layer and the Cu layer placed under it. Gallium reaction and intermixing with In and Cu is faster than its reaction with Se. Therefore, it in effect moves towards the contact layer while In and Cu move towards the surface. In the present invention Group VIA-rich second portion is placed under the Ga-containing third portion so that this problem can be avoided and the Group VIA-rich second portion acts as a barrier between the In-containing first portion and the Ga-containing third portion. If the metallic Ga of the third portion were to be placed directly on top of the Cu and In containing first portion, without placing the second portion between the two portions, metallic Ga of the third portion would easily mix in with the metallic Cu and In of the first portion and move towards the contact layer as explained above.

The fourth portion provides the excess Se to the overall compound absorber formation process and at the same time, since it is in physical contact with the Ga-containing third portion, it assists in reacting metallic Ga with Se and thus arrest its diffusion from the surface region of the absorber during the reaction. As the above discussion demonstrates, sandwiching the Ga-containing third portion between Se and/or Te containing second portion and Se containing fourth portion helps keep Ga near the surface. Metallic Ag, Cu and In containing first portion is relatively thick and it assists in forming a ACIGS layer with a good microstructure and with large grains after the reaction. It should be noted that all portions of the precursor layer are formed at relatively low temperatures, typically below 100° C., optionally below 50° C. This way, substantially discrete nature of each of the first portion, the second portion, the third portion and the fourth portion is preserved without much reaction between each portion. The reaction step is then carried out, optionally in a different apparatus, using RTP approach as will be described next. This is different from some prior art methods where various species of Ag, Cu, In, Ga and Se are deposited at various stages of the process on a heated substrate causing reaction and compound absorber formation during the film deposition step.

In the present invention, the above mentioned Na effect may be used to ones benefit. In that respect, instead of on the contact layer, Na may be included in at least one of the second portion, the third portion and the fourth portion of the precursor layer. This can be achieved by depositing a discrete film (not shown) of a Na-containing material (such as Na, Na—Se, Na—S, Na—F, Na—I, etc.) within the stack defined by the second portion, the third portion and the fourth portion.

Alternately a Na-containing material may be co-deposited along with at least one of the second portion, the third portion and the fourth portion. In any case, the equivalent thickness of this Na-containing film may be in the range of 2-40 nm, optionally in the range of 5-20 nm. By including Na in at least one of the Ga and Se-rich portions, i.e. second, third and fourth portions, of the overall precursor layer, diffusion of the Ga species (which react with Se) down towards the contact layer is reduced because of presence of Na within these Ga and Se-rich portions, and because of the above mentioned nature of Na retarding inter-diffusion of Ga-rich and In-rich phases. It should be noted that inclusion of Na in the first portion is optional in this case. It should also be noted that although Na is the preferred doping material, it may be wholly or partially replaced by another alkali metal such as K and Li.

It should be understood that a fifth portion or source layer may be provided. The fifth portion comprises Au, Ag, or their alloys. For example and not limitation, the fifth portion may be a film of Ag, or it may additionally contain small amounts of In, Ga, and/or Cu. In any case the Ag5/D5 molar ratio within the fifth portion may be in the range of 0.8-1.0, where Ag represents the number of moles of Ag and D3 represents the total number of moles of all elements such as Ag, Cu, Ga, and In that may be present within the fifth portion. The fifth portion comprises mostly Ga and additive materials such as metallic elements of Cu, Ga, and In and possibly dopants including one of Na, K, Li and the like. The thickness of the fifth portion may be in the range of 10-200 microns, optionally in the range of 20-100 nm. The fifth portion may be deposited using various thin film deposition methods, however, the preferred method is evaporation.

It should be understood that the group IB material in the fifth portion may be positioned between the first and second portions, between the second and third portions, between the third and fourth portions, and/or above the fourth portion. This fifth portion is provided so that it can be an additive that minimizes migration or phase separation of Ga to the back of the final semiconductor layer. Some embodiments may co-deposit these layers with any of the foregoing portions.

The above precursor layer may be processed by any of the techniques mentioned above with the other embodiments.

When the fifth portion is deposited as the top most layer, this may be done after the underlying layer has first been first annealed and/or selenized/sulfidized before this layer is applied and then reacted again with group VIA material. Subsequently, this layer is heated with a ramp-rate of 1-5° C./sec, optionally over 5° C./sec, to a temperature of about 225 to 600° C. for a time period of about 60 seconds to about 10 minutes in Se vapor in a non-vacuum, where the plateau temperature not necessarily is kept constant in time, to form the thin-film containing one or more chalcogenide compounds containing Ag, Cu, In, Ga, and Se.

Embodiment 5

In this embodiment, an electroplating technique may be used to deposit one or more of the layer. The substrate may be an insulating sheet or foil such as glass or polyimide or a conductive sheet or foil such as stainless steel or aluminum alloy web. The contact layer may comprise a conducting material such as Mo, Ta, Ru, Ir and Os among others. The precursor layer is grown on the top surface of the contact layer. A Mo coated substrate may be used as the substrate. An approximately 100 nm thick Ag and/or Cu layer may be electrodeposited over the Mo layer. In one embodiment, the ratio of Ag/IB=0.1-0.4. In one embodiment, the ratio of Ag/IB=0.25-0.35. This is then followed by the electrodeposition of an about 220 nm thick In film and a nominally 40 nm thick Ga layer. The stack is annealed at a temperature of 80-200° C. optionally for 2-300 seconds to enhance alloying between Ag, Cu, In and Ga. Over the alloyed layer, a nominally 100 nm of Cu, a nominally 220 nm of In and about 40 nm of Ga are then electrodeposited. A second anneal step is applied at 80-200° C., optionally for 2-300 seconds to promote further alloying between the layers of the metallic precursor. The precursor thus obtained is then selenized by well known approaches such as in hydrogen selenide or selenium vapor for a time period of 5 minutes to 60 minutes to form the Ag—Cu—In—Ga—Se compound. It should be noted that selenization may be carried out by various other means such as depositing Se over the metallic precursor and heating up the stacked layer, heating the substrate in a Se-containing gaseous or liquid atmosphere etc.

It is believed that when a substantially metallic precursor film including metallic Ag, Au, Cu, In and Ga is deposited first on a contact layer (such as Mo) of a base and then reacted with Se, the Ga-rich phases segregate to the film/base interface (or the film/contact layer interface) because reactions between Ga-bearing species and Se are slower than the reactions between In-bearing species and Se. Results suggest that presence of Na reduces inter-diffusion between the In-rich and Ga-rich phases and promotes segregation of In-rich and Ga-rich phases through the thickness of the absorber layer. On one hand an alkali metal such as Na is desired to lower the resistivity of the resulting compound layers. Additionally, NA may reduce the number of recombination centers to create higher quality material, with longer minority-carrier lifetimes. Therefore Na is usually included in the precursor layers including Ag, Cu, In and Ga by deposition of a Na compound at the contact layer/precursor layer interface, but on the other hand, presence of Na encourages the formation of non-uniform Ga distribution.

Optionally, a Na-containing material may be co-deposited along with at least one of the second portion, the third portion and the fourth portion. In any case, the equivalent thickness of this Na-containing film may be in the range of 2-40 nm, optionally in the range of 5-20 nm. By including Na in at least one of the Ga and Se-rich portions, i.e. second, third and fourth portions, of the overall precursor layer, diffusion of the Ga species (which react with Se) down towards the contact layer is reduced because of presence of Na within these Ga and Se-rich portions, and because of the above mentioned nature of Na retarding inter-diffusion of Ga-rich and In-rich phases. It should be noted that inclusion of Na in the first portion 32A is optional in this case. It should also be noted that although Na is the preferred doping material, it may be wholly or partially replaced by another alkali metal such as K and Li.

Optionally, reaction of Cu, In and Se to form CuInSe2 may start at around 300° C., and therefore this reaction is favorable compared to the reaction of Ga species which takes place at higher temperatures typically above 500° C. In other words if a metallic precursor layer containing Cu, In, and Ga is reacted with Se by increasing the temperature from room temperature to 550° C. at a slow rate, as the precursor is heated up to around 300° C. and beyond, Cu and In within the metallic precursor would start forming CuInSe2 because both Cu and In would easily diffuse to the surface and react with Se. As an example, let us assume that a heating rate of 5° C./sec is employed during a reaction process. This means that it would take (550−300)/5=50 seconds for the temperature of the precursor to go from 300° C. to 550° C. During this long period a large percentage of the In within the metallic precursor is expected to react with Cu and Se to form a surface layer which is rich in In. This would be true even if the precursor layer comprises a Ga-rich or pure Ga surface, such as a Cu/In/Ga precursor stack deposited in that order over a base including a substrate and a contact layer. Since reaction of Ga species takes place at higher temperatures (typically higher than 500° C.), it is important to increase the rate of temperature rise, especially beyond 300° C. Use of a temperature rise rate of 10° C./sec would reduce the reaction time before the formation of Ga-rich phase to about 25 seconds. For the special precursor structure of the present invention this may be adequate since Ga is confined or sandwiched between two Group VIA-rich layers (the second portion 32B and the fourth portion 32D), however, the temperature rise rate for temperatures in the range of 300-600° C. is optionally higher than 20° C./sec, more optionally higher than 30° C./sec, most optionally higher than about 5° C./sec. For a rate of 50° C./sec, the temperature of the precursor is expected to go from 300° C. to 550° C. in 5 seconds. This would help the Ga species reaction kinetics to catch up with that of In species since the temperature goes above 500° C. in 4 seconds and Ga species can also start reacting along with In species. The special structure of the precursor layer 32 of the present invention also increases the residence time of Ga species near the surface and helps provide an absorber layer with increased Ga content at its surface.

In an exemplary ACIGS absorber layer, the layer is formed by heating the structure to a temperature above 500° C. in an inert atmosphere or in an atmosphere containing Se. The heating rate for the temperature range between 300° C. and the highest temperature (which may be in the 550-600° C. range) is optionally higher than 20° C./sec, more optionally higher than 30° C./sec, most optionally higher than 50° C./sec. As can be seen from this figure the ACIGS absorber layer 40 comprises a surface region, wherein the surface region comprises a Ga/(Ga+In) ratio in the range of 0.1-0.3. The thickness of the surface region is in the range of 0.1-0.5 um, optionally in the range of 0.1-0.3 um, whereas the total thickness of the ACIGS absorber layer 40 may be 0.8-3.0 um, optionally 1-2 um. Below the surface region, the Ga/(Ga+In) ratio within the bulk of the absorber layer 40 depends on the composition of the first portion of the precursor layer. Depending upon the Ga content of the first portion, (Ga+In) ratio within the bulk of the absorber may change between 0 and 0.8, optionally between 0.1 and 0.6.

With these thin film stacks, copper layers (or In layers) may be electroplated or sputter deposited on a base comprising a substrate which, on its surface may have a conductive contact film such as a Mo layer and/or a Ru-containing layer. The substrate may be a metallic foil, glass or polymeric sheet or web. The Ru containing layer on the substrate surface may be a Ru layer, a Ru-alloy layer, a Ru compound layer or a stack containing Ru such as a Mo/Ru stack or in general a N/Ru stack, where M is a conductor or semiconductor. Gallium electroplating on the Cu surface (or the In surface) can be carried out at various current densities, such as at 5, 10, 20, 30, 40 and 50 mA/cm.sup.2, using the electrolytes of the present invention. Both DC and/or variable (such as pulsed or ramped) voltage/current waveforms may be used for electroplating the Ga layer.

A set of exemplary aqueous plating baths were prepared containing 0.2-0.5 M GaCl3, and 0.5-0.8 M sodium citrate (Na3C6H5O7). The pH was adjusted to a range between 10 and 13. Gallium was electrodeposited on the copper surface at current densities of 30-50 mA/cm.sup.2. Highly adherent Ga films with surface roughness of <10 nm were obtained for a thickness of 100 nm. The plating efficiency was measured and found to be in the 85-100% range, the higher current density yielding more efficient deposition process. Gallium was also plated on other metal surfaces also using the citrate containing complexed baths. Deposition on Ru surface directly yielded a plating efficiency of 75-90%. On the surface of In, Ga deposition efficiency reached 100%.

An aqueous plating bath was formulated with 0.2 M GaCl3 and 0.5 M Glycine. The pH was adjusted to the range of 11-13 using NaOH. The plating tests were carried out on the surfaces of electroplated copper at current densities of 10-50 mA/cm.sup.2. All Ga films were shiny with smooth surfaces. Surface roughness was <10 nm for 100 nm thick layers.

A Mo coated glass sheet may be used as the base. A 100 nm thick Ag, Cu layer may be deposited over the Mo layer. In one embodiment, the ratio of Ag/IB=0.1-0.4. This is then followed by the deposition of a 220 nm thick In film and a 40 nm thick Ga layer. The stack is annealed at a temperature of 80-200° C. for 5-600 seconds to enhance alloying between Ag, Cu, In and Ga. Over the alloyed layer, 100 nm of Cu, 220 nm of In and 40 nm of Ga are then deposited or applied. The precursor is selenized by well known approaches such as in hydrogen selenide gas or selenium vapor to form the (Ag, Cu)—In—Ga—Se compound. It should be noted that selenization may be carried out by various other means such as depositing Se over the metallic precursor and heating up the stacked layer, heating the substrate in a Se-containing gaseous or liquid atmosphere etc. for times ranging from 5 minutes to 60 minutes.

In some embodiments, the second segment is to introduce S vapor at a partial pressure in an inert gas (such as argon or nitrogen) of 0.2-50 mmHg, while the sample is still at a dwell temperature of 400-600° C., for a duration of 60-360 seconds. Optionally, the duration is from 360 seconds to 960 seconds. Some embodiments have both S and Se in this second segment. Optionally, some embodiments only use S in this second segment. The final segment is to cool the sample in an N2, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

A Mo coated metal foil may be used as the base. A 100 nm thick Ag, Cu layer may be deposited over the Mo layer. In one embodiment, the ratio of Ag/IB=0.1-0.4. This is then followed by the deposition of a 220 nm thick In film and a 40 nm thick Ga layer. The stack is annealed at a temperature of 80-200° C. for 5-600 seconds to enhance alloying between Ag, Cu, In and Ga. Over the alloyed layer, a 100 nm of Cu, a 220 nm of In and 40 nm of Ga are then deposited. A second anneal step is applied at 80-200° C. for 5-600 seconds to promote further alloying between the layers of the metallic precursor. The precursor thus obtained is then selenized by well known approaches such as in hydrogen selenide or selenium vapor to form the (Ag,Cu)—In—Ga—Se compound. It should be noted that selenization may be carried out by various other means such as depositing Se over the metallic precursor and heating up the stacked layer, heating the substrate in a Se-containing gaseous or liquid atmosphere etc. for times ranging from 5 minutes to 60 minutes.

In this embodiment, the approaches in the previous two paragraphs are used except that Ag, Cu, In and Ga layers may be deposited in four steps instead of two steps. Accordingly, thickness of (Ag,Cu), In and Ga for each deposition step may be reduced to 50 nm, 110 nm and 20 nm, respectively. For any of the embodiments herein, the Ag, Cu layer may be co deposited or in separate steps. By heat treating the layers after each deposition step for reduced times of optionally 2-300 seconds (except for the last one for the case of Example 1), a smooth and compositionally uniform metallic precursor may be obtained. Selenization of this precursor yields compositionally uniform, high quality (Ag,Cu)—In—Ga—Se compound layer.

Embodiment 6

In yet another nonlimiting embodiment, Ag was introduced into the precursor ink of Group IB-IIIA mixture (as described herein) in dispersion form. By way of example and not limitation, the Ag particles used were nanoparticle flakes with roughly 500 nm in diameter. The particles were dispersed in an ink at a solids loading of 15-20 wt % with a surfactant. This dispersion was sonicated.

Cu-, In-, Ga- and Na-containing particle dispersions were also prepared. These were added together with the Ag particle dispersion to produce a desired composition with ratios (Ag+Cu)/(In+Ga)=0.84, Ga/(In+Ga)=0.4 to 0.47, Ag/(Ag+Cu)=0.10. It should be understood that any of the embodiments herein may include Na/(Ag+Cu+In+Ga) of 0.01 to 0.03. Substrates were then coated with this ink and some fine coating defects were visible, as well as a moderate amount of large fisheye coating defects in these coatings.

Despite the poor appearance of the anneal morphology, they were selenized using one or more techniques for introducing group VIA material. The parts suffered no delamination and appeared fairly smooth and shiny. Both eye and SEM confirmed that no patterning remained after RTP, indicating that these 100 um scale non-uniformities were healed by selenization.

Subsequently, this annealed layer is selenized. In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, the first segment is to introduce hydrogen selenide gas at this point, while the sample is increasing in temperature up to the dwell temperature of 400-600° C. In some embodiments, the first segment of the selenization time should be between 10-360 seconds, at a temperature between 400-600° C. The concentration of hydrogen selenide to be delivered to fully selenize the precursor layer to form a (Ag, Cu)$_x$(In,Ga)$_y$Se$_z$ compound, where x is between 0.6-1, y is between 0.6-3, and z is between 1.2-5. Some embodiments may increase the time period in the hydrogen selenide atmosphere so that full selenization is reached. In some embodiments, the second segment is to increase the sample dwell temperature to 400-600° C. introduce hydrogen sulfide. The concentration of hydrogen sulfide to be delivered to the sample in this second segment should be 0.1-10% in an inert gas (such as argon or nitrogen), optionally along with a small concentration of oxygen gas (optionally 0.001-0.1%). Optionally, the duration is from 360 seconds to 960 seconds. Some embodiments have both H$_2$S and H$_2$Se in this second segment. Optionally, some embodiments only use H$_2$S in this second segment. The final segment is to cool the sample in an N$_2$, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

The parts were finished into devices using a CdS junction partner, a ZnO-based transparent conductor and a metallic grid top contact. The resulting solar cells had efficiencies above 12%, and devices were created with open-circuit voltages above 660 mV.

Embodiment 7

A metal foil substrate was sputtered with Mo to form a 500 nm to 1000 nm Mo film to serve as the back contact. A barrier layer of 50 nm to 300 nm of Chromium, TiN, HfN, or other transition metal nitride barrier was formed onto the Mo back contact. A precursor ink comprised of Cu, In, Ga, and Ag, and atomic ratios Ag/(Ag+Cu)=0.1, Ga/(Ga+In)=0.4, and (Ag+Cu)/(Ga+In)=0.82. For the present embodiment, an approximately 0.5-2.5 micron thick layer of the precursor material containing solution is deposited on the substrate. The precursor material may be dispersed in a solvent such as water, alcohol or ethylene glycol with the aid of organic surfactants and/or dispersing agents described herein to form an ink.

The precursor layer is annealed with a ramp-rate of 1-5° C./sec, optionally over 5° C./sec, to a temperature of about 225° to about 650° C. optionally for about 30 seconds to about 600 seconds to enhance densification and/or alloying between Ag, Cu, In, and Ga in an atmosphere containing hydrogen or nitrogen gas, where the plateau temperature not necessarily is kept constant in time. Some embodiments may heat to a temperature of at least 500° C. Optionally, some embodiments may heat to a temperature of at least 505° C. Optionally, some embodiments may heat to a temperature of at least 510° C. Optionally, some embodiments may heat to a temperature of at least 515° C. Optionally, some embodiments may heat to a temperature of at least 520° C. Optionally, some embodiments may heat to a temperature of at least 525° C. Optionally, some embodiments may heat to a temperature of at least 530° C. Optionally, some embodiments may heat to a temperature of at least 535° C. Optionally, some embodiments may heat to a temperature of at least 540° C. Optionally, some embodiments may heat to a temperature of at least 545° C. Optionally, some embodiments may heat to a temperature of at least 550° C.

Subsequently, this annealed layer is selenized with a ramp-rate of 1-5° C./sec, optionally over 5° C./sec, to a temperature of about 225 to 600° C. for a time period of about 60 seconds to about 10 minutes in Se vapor in a non-vacuum, where the plateau temperature not necessarily is kept constant in time, to form the thin-film containing one or more chalcogenide compounds containing Ag, Cu, In, Ga, and Se. Some embodiments may heat to a temperature of at least 500° C. Optionally, some embodiments may heat to a temperature of at least 505° C. Optionally, some embodiments may heat to a temperature of at least 510° C. Optionally, some embodiments may heat to a temperature of at least 515° C. Optionally, some embodiments may heat to a temperature of at least 520° C. Optionally, some embodiments may heat to a temperature of at least 525° C. Optionally, some embodiments may heat to a temperature of at least 530° C. Optionally, some embodiments may heat to a temperature of at least 535° C. Optionally, some embodiments may heat to a temperature of at least 540° C. Optionally, some embodiments may heat to a temperature of at least 545° C. Optionally, some embodiments may heat to a temperature of at least 550° C.

In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, the first segment is to introduce hydrogen selenide gas at this point, while the sample is increasing in temperature up to the dwell temperature of 400-600° C. Some embodiments may hold off on introduction of hydrogen selenide until the dwell temperature is reached. In some embodiments, the first segment of the selenization time should be between 10-360 seconds, at a temperature between 400-600° C. The concentration of hydrogen selenide to be delivered to the sample in the initial phase of selenization should be 0.1-10% in an inert gas (such as argon or nitrogen), optionally along with a small concentration of oxygen gas (optionally 0.001-0.1%). After this segment the film may or may not be fully reacted into a $(Ag,Cu)_x(In,Ga)_ySe_z$ compound, where x is between 0.6-1, y is between 0.6-3, and z is between 1.2-5, and there may or may not be some partially reacted binary selenide phases still present in the film. In some embodiments, the second segment is to increase the sample dwell temperature to 400-600° C. introduce hydrogen sulfide. The concentration of hydrogen sulfide to be delivered to the sample in this second segment should be 0.1-10% in an inert gas (such as argon or nitrogen), optionally along with a small concentration of oxygen gas (optionally 0.001-0.1%). Optionally, the duration is from 360 seconds to 960 seconds. Some embodiments have both H2S and H2Se in this second segment. Optionally, some embodiments only use H2S in this second segment. The final segment is to cool the sample in an N2, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

Optionally, instead of this two-step approach, the layer of precursor material may be selenized without the separate annealing step in an atmosphere containing hydrogen or nitrogen gas, but may be densified and selenized in one step with a ramp-rate of 1-5° C./sec, optionally over 5° C./sec, to a temperature of 225 to 600° C. for a time period of about 120 seconds to about 20 minutes in an atmosphere containing either $H_2Se$ or a mixture of $H_2$ and Se vapor or Se vapor, with or without S vapor. It should be understood that other embodiments may be configured to include S vapor or H2S to create the desired ACIGS or ACIGSS absorber.

These absorber layer films were then used in the fabrication of photovoltaic devices by chemical bath deposition of 50 nm CdS, followed by sputter deposition of a 200 nm ZnO:ITO (indium tin oxide) window layer, followed by e-beam deposition of a Ni—Al grid structure.

Embodiment 8

A metal foil substrate was sputtered with Mo to form a 500 nm to 1000 nm Mo film to serve as the back contact. A barrier layer of 50 nm to 300 nm of Chromium, TiN, HfN, or other transition metal nitride barrier was formed onto the Mo back contact. A precursor ink comprised of Cu, In, Ga, and $AgIn_2$, and atomic ratios Ag/(Ag+Cu)=0.05-0.15, Ga/(Ga+In)=0.4-0.5, and (Ag+Cu)/(Ga+In)=0.82. The material may be in the form nanoparticles and/or flake particles. For the present embodiment, an approximately 0.5-2.5 micron thick layer of the precursor material containing solution is deposited on the substrate. The precursor material may be dispersed in a solvent such as water, alcohol or ethylene glycol with the aid of organic surfactants and/or dispersing agents described herein to form an ink.

The precursor layer is annealed with a ramp-rate of 1-5° C./sec, optionally over 5° C./sec, to a temperature of about 225° to about 650° C. optionally for about 30 seconds to about 600 seconds to enhance densification and/or alloying between Ag, Cu, In, and Ga in an atmosphere containing hydrogen or nitrogen gas, where the plateau temperature not necessarily is kept constant in time. Some embodiments may heat to a temperature of at least 500° C. Optionally, some embodiments may heat to a temperature of at least 505° C. Optionally, some embodiments may heat to a temperature of at least 510° C. Optionally, some embodiments may heat to a temperature of at least 515° C. Optionally, some embodiments may heat to a temperature of at least 520° C. Optionally, some embodiments may heat to a temperature of at least 525° C. Optionally, some embodiments may heat to a temperature of at least 530° C. Optionally, some embodiments may heat to a temperature of at least 535° C. Optionally, some embodiments may heat to a temperature of at least 540° C. Optionally, some embodiments may heat to a temperature of at least 545° C. Optionally, some embodiments may heat to a temperature of at least 550° C.

Subsequently, this annealed layer is selenized. In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, the first segment is to introduce selenium vapor in the first segment of the selenization for a duration of 10-360 seconds, at a temperature between 200-450° C. The partial pressure of selenium vapor in an inert gas (such as argon or nitrogen) to be delivered to the sample in the initial phase of selenization should be 0.01-10 mmHg. After this segment the film may not be fully reacted into a $(Ag,Cu)_x(In,Ga)_ySe_z$ compound, where x is between 0.6-1, y is between 0.6-3, and z is between 1.2-5, and there may be some partially reacted binary selenide phases still present in the film. In some embodiments, the second segment is to increase the sample dwell temperature to 400-600° C. introduce S vapor at a partial pressure in an inert gas (such as argon or nitrogen) of 0.2-50 mmHg for a duration of 60-360 seconds. Optionally, the duration is from 360 seconds to 960 seconds. Some embodiments have both S and Se in this second segment. Optionally, some embodiments only use S in this second segment. The final segment is to cool the sample in an N2 or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

Optionally, instead of this two-step approach, the layer of precursor material may be selenized without the separate annealing step in an atmosphere containing hydrogen or nitrogen gas, but may be densified and selenized in one step with a ramp-rate of 1-5° C./sec, optionally over 5° C./sec, to a temperature of 225 to 600° C. for a time period of about 120 seconds to about 20 minutes in an atmosphere containing either $H_2Se$ or a mixture of $H_2$ and Se vapor or Se vapor, with or without S vapor. It should be understood that other embodiments may be configured to include S vapor or $H_2S$ to create the desired ACIGS or ACIGSS absorber. By way of non-limiting example, the S material may be introduced at a lower processing, such as between 200 to 250° C.

These absorber layer films were then used in the fabrication of photovoltaic devices by chemical bath deposition of 50 nm CdS, followed by sputter deposition of a 200 nm metal oxide window layer, followed by e-beam deposition of an electrically conductive grid structure.

Embodiment 9

A metal foil substrate was sputtered with Mo to form a 500 nm to 1000 nm Mo film to serve as the back contact. A barrier layer of 50 nm to 300 nm of Chromium, TiN, HfN, or other transition metal nitride barrier was formed onto the Mo back contact. A precursor ink comprised of Cu, In, $AgGa_3$, and $AgIn_2$ or Ag, and atomic ratios Ag/(Ag+Cu)=0.05-0.15, Ga/(Ga+In)=0.4-0.5, and (Ag+Cu)/(Ga+In)=0.82. The material may be in the form nanoparticles and/or flake particles. For the present embodiment, an approximately 0.5-2.5 micron thick layer of the precursor material containing solution is deposited on the substrate. The precursor material may be dispersed in a solvent such as water, alcohol or ethylene glycol with the aid of organic surfactants and/or dispersing agents described herein to form an ink.

The precursor layer is annealed with a ramp-rate of 1-5° C./sec, optionally over 5° C./sec, to a temperature of about 225° to about 650° C. optionally for about 30 seconds to about 600 seconds to enhance densification and/or alloying between Ag, Cu, In, and Ga in an atmosphere containing hydrogen or nitrogen gas, where the plateau temperature not necessarily is kept constant in time. Some embodiments may heat to a temperature of at least 500° C. Optionally, some embodiments may heat to a temperature of at least 505° C. Optionally, some embodiments may heat to a temperature of at least 510° C. Optionally, some embodiments may heat to a temperature of at least 515° C. Optionally, some embodiments may heat to a temperature of at least 520° C. Optionally, some embodiments may heat to a temperature of at least 525° C. Optionally, some embodiments may heat to a temperature of at least 530° C. Optionally, some embodiments may heat to a temperature of at least 535° C. Optionally, some embodiments may heat to a temperature of at least 540° C. Optionally, some embodiments may heat to a temperature of at least 545° C. Optionally, some embodiments may heat to a temperature of at least 550° C.

Subsequently, this annealed layer is selenized. In one embodiment, the chalcogenization of metallic films (or oxide, or chalcogenide, or other Ag, Cu, In, Ga, S, or Se containing compounds) can be accomplished by preheating the film (optionally in an inert atmosphere such as argon or nitrogen gas) by ramping up the temperature at between 1-8° C./sec, optionally above 8° C./sec, until it is 200-450° C. In some embodiments, no selenium is introduced until a dwell temperature of 400-600° C. is reached. In some embodiments, the first segment is to introduce selenium vapor in the first segment of the selenization for a duration of 10-360 seconds, at a temperature between 200-450° C. In some embodiments, the next segment of the selenization should be between 10-360 seconds, at a temperature between 400-600° C. Some embodiments may increase selenium concentration in the latter portion of this time period. Optionally, some embodiments may decrease selenium concentration after an initial time period in this temperature region. The partial pressure of selenium vapor in an inert gas (such as argon or nitrogen) to be delivered to the sample in the initial phase of selenization should be 10-100 mmHg. After this stage the film will be fully reacted into a $(Ag,Cu)_x(In,Ga)_ySe_z$ compound, and there will not be any partially reacted binary selenide phases still present in the film, where x is between 0.6-1, y is between 0.6-3, and z is between 1.2-5. Thus, the process fully selenizes the precursor layer to form a chalcogenide layer. In some embodiments, the second segment is to introduce S vapor at a partial pressure in an inert gas (such as argon or nitrogen) of 0.2-50 mmHg, while the sample is still at a dwell temperature of 400-600° C., for a duration of 60-360 seconds. Optionally, the duration is from 360 seconds to 960 seconds. Some embodiments have both S and Se in this second segment. Optionally, some embodiments only use S in this second segment. The final segment is to cool the sample in an N2, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

Optionally, instead of this two-step approach, the layer of precursor material may be selenized without the separate annealing step in an atmosphere containing hydrogen or nitrogen gas, but may be densified and selenized in one step with a ramp-rate of 1-5° C./sec, optionally over 5° C./sec, to a temperature of 225 to 600° C. for a time period of about 120 seconds to about 20 minutes in an atmosphere containing either $H_2Se$ or a mixture of $H_2$ and Se vapor or Se vapor, with or without S vapor. It should be understood that other embodiments may be configured to include S vapor or $H_2S$ to create the desired ACIGS or ACIGSS absorber. By way of non-limiting example, the S material may be introduced at a lower processing, such as between 200 to 250° C.

These absorber layer films were then used in the fabrication of photovoltaic devices by chemical bath deposition of 50 nm CdS, followed by deposition of a 200 nm metal oxide window layer, followed by e-beam deposition of an electrically conductive grid structure.

Embodiment 10

Figure 6:
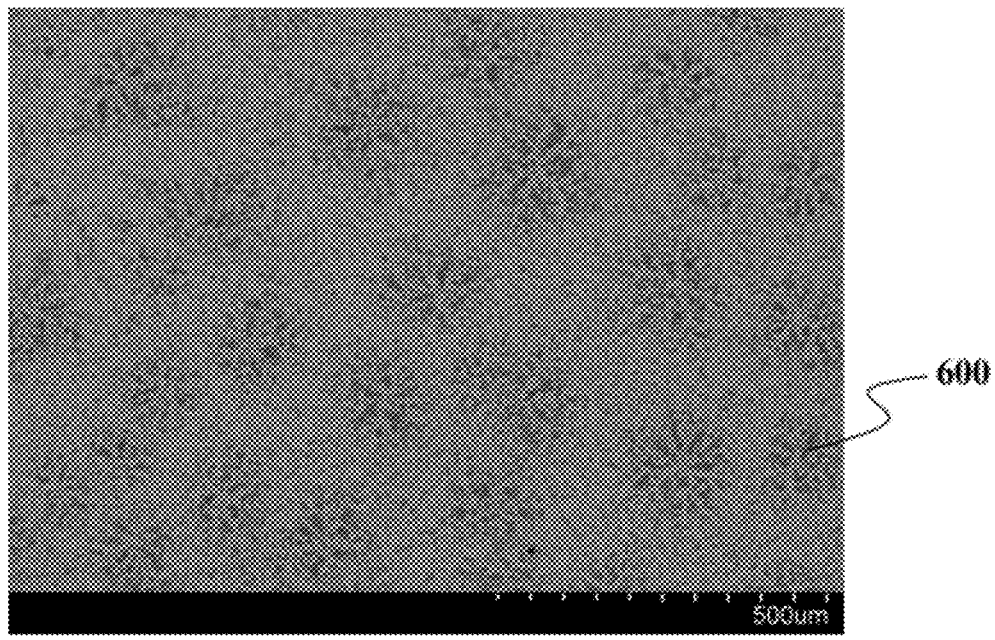
FIG. 6 shows a top down view of annealed material according to one embodiment of the present invention.

In this embodiment, a highly phase segregated material is used. The precursor material is provided that has areas of $AgIn_2$ and/or $Ag_3Ga$ in the precursor material. $AgIn_2$ maybe one of the intermediate alloy phases formed that facilitates subsequent processing to provide improved films. This may be in the form of dark areas 600 as seen in FIG. 6. Even though there may be patches of these materials in precursor material prior to selenization and/or sulfadation in this order or vice versa. A precursor material comprised of Cu, In, Ga, and Ag, and atomic ratios $Ag/(Ag+Cu)=0.1$-$0.4$, $Ga/(Ga+In)=0.25$-$0.4$, and $(Ag+Cu)/(Ga+In)=0.80$-$0.90$. The substrate may be an insulating sheet or foil such as glass or polyimide or a conductive sheet or foil such as stainless steel or aluminum alloy web. The contact layer may comprise a conducting material such as Mo, Ta, Ru, Ir and Os among others. The precursor layer is grown on the top surface of the contact layer. A Mo coated substrate may be used as the substrate. The precursor thus obtained is then selenized by well known approaches such as in hydrogen selenide or selenium vapor for a time period of 5 minutes to 60 minutes to form the ACIGS compound. It should be noted that selenization may be carried out by various other means such as depositing Se over the metallic precursor and heating up the stacked layer, heating the substrate in a Se-containing gaseous or liquid atmosphere etc. The general idea is that selenization and/or sulfadation fixes the anneal segregation.

The two step approach is from particles. It is not obvious that using silver would bring the gallium forward. Others use co-evaporation to deposit all materials all at once, and they do not see gallium segregation. A co-evaporation process is grown from the bottom up and thus does not see this gallium segregation phenomenon. CuIn selenizes much more quickly than CuGa. With Ag (or Au in gold embodiments) binding to the In, the reaction of CuIn with Se is slowed down that would otherwise force Ga to the back. Ag—In has a more noble component that is bound to the indium to influence the rate of chalcogenation. Optionally, some intermediate phases may be formed that react quicker with Ga to prevent it from being pushed to the back. Gold is more noble than Silver. Silver is more noble than copper. Silver is harder to oxidize than copper. Without being bound to any particular technique, it reacts more slowly than copper and thus slows the reaction kinetics of CuIn with Se which is favorable for the reaction of the gallium compounds.

The two stage processes creates massively phase separated material which are then cured during selenization. The annealed film looked rough. Ra is good, Rz (peak to peak) was higher, but overall average Ra was smoother and in the range of about 230 nm or less. Optionally, overall average Ra was smoother and in the range of about 250 nm or less. The material may have areas of molybdenum exposure. Some may have material in the precursor that includes 75% Ga, 25% In ($Cu_9InGa_4$), $Cu_9Ga_4$, and/or $Cu_9In_4$. The composition is uniform after selenization. CIGS morphology is smoother.

Subsequently, this annealed layer is selenized with a ramp-rate of 1-5° C./sec, optionally over 5° C./sec, to a temperature of about 225 to 600° C. for a time period of about 60 seconds to about 10 minutes in Se vapor in a non-vacuum, where the plateau temperature not necessarily is kept constant in time, to form the thin-film containing one or more chalcogenide compounds containing Ag, Cu, In, Ga, and Se. Instead of this two-step approach, the layer of precursor material may be selenized without the separate annealing step in an atmosphere containing hydrogen or nitrogen gas, but may be densified and selenized in one step with a ramp-rate of 1-5° C./sec, optionally over 5° C./sec, to a temperature of 225 to 600° C. for a time period of about 120 seconds to about 20 minutes in an atmosphere containing either $H_2Se$ or a mixture of $H_2$ and Se vapor or Se vapor, with or without S vapor. It should be understood that other embodiments may be configured to include S vapor or $H_2S$ to create the desired ACIGS or ACIGSS absorber. In one embodiment, the semiconductor is formed can be $ACIGCh1_aCh2_b$ alloy, with Ch1 being a first chalcogen (S, Se, or Te), Ch2 being a second chalcogen (S, Se, or Te). Most embodiments, Ch1 is different from Ch2. Ch1 can be introduced in one process and Ch2 introduced in a second process. Optionally, Ch1 and Ch2 are introduced in the same process step.

In some embodiments, a second segment is used to introduce S vapor at a partial pressure in an inert gas (such as argon or nitrogen) of 0.2-50 mmHg, while the sample is still at a dwell temperature of 400-600° C., for a duration of 60-360 seconds. Optionally, the duration is from 360 seconds to 960 seconds. Some embodiments have both S and Se in this second segment. Optionally, some embodiments only use S in this second segment. The final segment is to cool the sample in an $N_2$, argon, or other inert environment until the sample is below 200-400° C. Optionally, the final segment is to cool the sample in a Se and/or S environment until the sample is below 200-400° C. The final segment is to cool the sample in a hydrogen selenide and/or hydrogen sulfide environment until the sample is below 200-400° C.

It should be understood that for any of the embodiments herein, any combination of the following mixed with CIG or other group IB-based precursor ink: core-shell particles (e.g. Ag—Cu or Cu—Ag), Ag nanowires, Cu-coated Ag nanowires, Ag-coated Cu nanowires, ALD of Ag-organometallic precursors, sputtered Ag, evaporated Ag, sputtered Ag—Cu, evaporated Ag—Cu, and so forth. Also included are other deposition techniques such as electroplating of Ag onto CIGS and/or pressure-based printing of Ag onto CIGS using pressure techniques such as described in US20030052382 or US20070160763 both fully incorporated herein by reference for all purposes. Combinations of any or all of these may be used to minimize phase segregation (due to different extents of exposed interfacial area available for chemical reaction, which will be different for different deposition techniques). Although Ag is described herein, it should be understood that Ag may be used in combination with Au or replaced by Au completely in any of the embodiments herein.

Photovoltaic Device Chemistry

The solid particles for use with the present invention may be used with a variety of different chemistries to arrive at a desired semiconductor film. Although not limited to the following, an active layer for a photovoltaic device may be fabricated by formulating an ink of spherical and/or non-spherical particles each containing at least one element from groups IB, IIIA and/or VIA, coating a substrate with the ink to form a precursor layer, and heating the precursor layer to form a dense film. By way of nonlimiting example, the particles themselves may be elemental particles or alloy particles. In some embodiments, the precursor layer forms the desired group IB-IIIA-VIA compound in a one step process. In other embodiments, a two step process is used wherein a dense film is formed and then further processed in a suitable atmosphere to form the desired group IB-IIIA-VIA compound. It should be understood that chemical reduction of the precursor layer may not be needed in some embodiments, particularly if the precursor materials are oxygen-free or substantially oxygen free. Thus, a first heating step of two sequential heating steps may optionally be skipped if the particles are processed air-free and are oxygen-free.

It should also be understood that group IB, IIIA, and VIA elements other than Cu, In, Ga, Se, and S may be included in the description of the IB-IIIA-VIA materials described herein, and that the use of a hyphen ("-" e.g., in Cu—Se or Cu—In—Se) does not indicate a compound, but rather indicates a coexisting mixture of the elements joined by the hyphen. It is also understood that group IB is sometimes referred to as group 11, group IIIA is sometimes referred to as group 13 and group VIA is sometimes referred to as group 16. Furthermore, elements of group VIA (16) are sometimes referred to as chalcogens. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Optionally, the group IB element includes a) copper (Cu) and b) silver (Ag) or gold (Au). Group IIIA elements suitable for use in the method of this invention include gallium (Ga), indium (In), aluminum (Al), and thallium (Tl). Preferably the group IIIA element is gallium (Ga) and/or indium (In). Group VIA elements of interest include selenium (Se), sulfur (S), and tellurium (Te), and preferably the group VIA element is either Se and/or S. It should be understood that mixtures such as, but not limited to, alloys, solid solutions, and compounds of any of the above can also be used. The shapes of the solid particles may be any of those described herein.

Forming a Film from Particle Precursors

Referring now to FIGS. 1A-1D, one method of forming a semiconductor film from particles of precursor materials according to the present invention will now be described. It should be understood that the present embodiment uses non-vacuum techniques to form the semiconductor film. Other embodiments of the invention, however, may optionally form the film under a vacuum environment, and the use of solid particles (non-spherical and/or spherical) is not limited to only non-vacuum deposition or coating techniques. Optionally, some embodiments may combine both vacuum and non-vacuum techniques.

As seen in FIG. 1A, a substrate 102 is provided on which the precursor layer 106 (see FIG. 1B) will be formed. By way of non-limiting example, the substrate 102 may be made of a metal such as stainless steel or aluminum. In other embodiments, metals such as, but not limited to, copper, steel, coated aluminum, molybdenum, titanium, tin, metallized plastic films, or combinations of the foregoing may be used as the substrate 102. Alternative substrates include but are not limited to ceramics, glasses, and the like. Any of these substrates may be in the form of foils, sheets, rolls, the like, or combinations thereof. Depending on the conditions of the surface, and material of the substrate, it may be useful to clean and/or smoothen the substrate surface. Furthermore, depending on the material of the substrate 102, it may be useful to coat a surface of the substrate 102 with a contact layer 104 to promote electrical contact between the substrate 102 and the absorber layer that is to be formed on it, and/or to limit reactivity of the substrate 102 in subsequent steps, and/or to promote higher quality absorber growth. As a non-limiting example, when the substrate 102 is made of aluminum, the contact layer 104 may be but is not limited to a single or multiple layer(s) of molybdenum (Mo), tungsten (W), tantalum (Ta), binary and/or multinary alloys of Mo, W, and/or Ta, with or without the incorporation of a IA element like sodium, and/or oxygen, and/or nitrogen. Some embodiment may include a contact layer 104 may be comprised of a molybdenium-IA material such as but not limited to Na—Mo, Na—F—Mo, or the like deposited using a vacuum or non-vacuum technique. For the purposes of the present discussion, the contact layer 104 may be regarded as being part of the substrate. As such, any discussion of forming or disposing a material or layer of material on the substrate 102 includes disposing or forming such material or layer on the contact layer 104, if one is used. Optionally, other layers of materials may also be used with the contact layer 104 for insulation or other purposes and still considered part of the substrate 102. It should be understood that the contact layer 104 may comprise of more than one type or more than one discrete layer of material. Optionally, some embodiments may use any one and/or combinations of the following for the contact layer: a copper, aluminum, chromium, molybdenum, tungsten, tantalum, vanadium, etc. and/or iron-cobalt alloys. Optionally, a diffusion barrier layer 103 (shown in phantom) may be included and layer 103 may be electrically conductive or electrically non-conductive. As non-limiting examples, the layer 103 may be composed of any of a variety of materials, including but not limited to chromium, vanadium, tungsten, or compounds such as nitrides (including tantalum nitride, tungsten nitride, titanium nitride, silicon nitride, zirconium nitride, and/or hafnium nitride), oxy-nitrides (including tantalum oxy nitride, tungsten oxy nitride, titanium oxy nitride, silicon oxy nitride, zirconium oxy nitride, and/or hafnium oxy nitride), oxides (including Al2O3 or SiO2), carbides (including SiC), binary and/or multinary compounds of W, Ti, Mo, Cr, V, Ta, Hf, Zr, and/or Nb, with/without the addition of either oxygen and/or nitrogen into these elemental, binary and/or multinary compound layers, and/or any single or multiple combination of the foregoing. Optionally, a diffusion barrier layer 105 (shown in phantom) may be on the underside of substrate 102 and be comprised of a material such as but not limited to chromium, vanadium, tungsten, or compounds such as nitrides (including tantalum nitride, tungsten nitride, titanium nitride, silicon nitride, zirconium nitride, and/or hafnium nitride), oxides (including alumina, Al2O3, SiO2, or similar oxides), carbides (including SiC), and/or any single or multiple combination of the foregoing. The layers 103 and/or 105 may be adapted for use with any of the embodiments described herein. The layer 105 may be the same or a different material from that of layer 103.

Figure 1B:
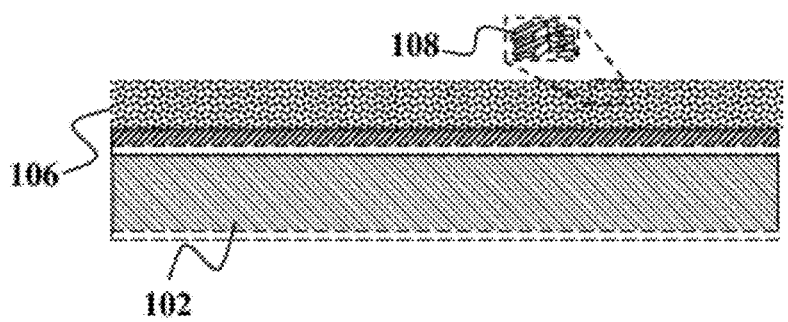

Referring now to FIG. 1B, a precursor layer 106 is formed over the substrate 102 by coating the substrate 102 with a dispersion such as but not limited to an ink. As one non-limiting example, the ink may be comprised of a carrier liquid mixed with particles such as but not limited to flakes 108 and has a rheology that allows the ink to be solution-deposited over the substrate 102. In one embodiment, the present invention may use a single dry powder or a mixture of two or more dry powders mixed with the vehicle containing or not containing a dispersant, and sonicated before coating. Optionally, the inks may be already formulated as the precursor materials are formed in a RF thermal plasma-based size reduction chamber such that discussed in U.S. Pat. No. 5,486,675 fully incorporated herein by reference. Optionally, the inks may be already formulated. In the case of mixing a plurality of flake compositions, the product may be mixed from various sources. This mixing could be by sonication but other forms of mechanical agitation and/or a mill may also be used. The ink used to form the precursor layer 106 may contain non-spherical particles 108 such as but not limited to microflakes and/or nanoflakes. It should also be understood that the ink may optionally use both non-spherical and spherical particles in any of a variety of relative proportions.

FIG. 1B includes a close-up view of the particles in the precursor layer 106, as seen in the enlarged image. Although not limited to the following, the particles may be flakes 108 that have non-spherical shapes and are substantially planar on at least one side. A more detailed view of one embodiment of the flakes 108 can be found in FIGS. 2A and 2B of U.S. patent application Ser. No. 11/362,266 filed Feb. 23, 2006 and fully incorporated herein by reference. Microflakes may be defined as particles having at least one substantially planar surface with a length and/or largest lateral dimension of about 500 nm or more and the particles have an aspect ratio of about 2 or more. In other embodiments, the microflake is a substantially planar structure with thickness of between about 10 and about 250 nm and lengths between about 500 nm and about 5 microns. It should be understood that in other embodiments of the invention, microflakes may have lengths of at least 1 micron or more. It should be understood that in other embodiments of the invention, microflakes may have lengths as large as 10 microns. Although not limited to the following, at least some of the solid group IIIA-particles may be processed into planar particles and adapted for use during solution deposition.

In one non-limiting example, the particles used to form the precursor layer 106 are elemental particles, i.e., having only a single atomic species. In one embodiment, the ink used for precursor layer 106 may contain particles comprising one or more group IB elements and particles comprising one or more different group IIIA elements. Preferably, the precursor layer 106 contains copper, indium and gallium. In another embodiment, the precursor layer 106 may be an oxygen-free layer containing copper, indium and gallium. Optionally, the ratio of elements in the precursor layer may be such that the layer, when processed, forms one or more phases where the phases contain one or more of the elements Cu, In, and Ga, and where the layer has the overall composition $(Ag,Au,Cu)_z In_x Ga_{1-x}$, where $0 \leq x \leq 1$ and $0.5 \leq z \leq 1.5$.

Optionally, some of the particles in the ink may be alloy particles. In one nonlimiting example, the particles may be binary alloy particles such as but not limited to Ag—In, Ag—Ga, Au—In, Au—Ga, Cu—In, In—Ga, or Cu—Ga. Alternatively, the particles may be a binary alloy of group IB, IIIA elements, a binary alloy of Group IB, VIA elements, and/or a binary alloy of group IIIA, VIA elements. In other embodiments, the particles may be a ternary alloy of group IB, IIIA, and/or VIA elements. For example, the particles may be ternary alloy particles of any of the above elements such as but not limited to Ag—In—Ga, Au—In—Ga, Cu—In—Ga. In other embodiments, the ink may contain particles that are a quaternary alloy of group IB, IIIA, and/or VIA elements. Some embodiments may have quaternary or multi-nary particles. It should also be understood that the source of group VIA material may be added as discussed in commonly assigned, co-pending U.S. patent application Ser. No. 11/243,522 filed on Feb. 23, 2006 and fully incorporated herein by reference.

Generally, an ink may be formed by dispersing any of the aforementioned particles (and/or other particles) in a vehicle containing a dispersant (e.g., a surfactant or polymer) along with (optionally) some combination of other components commonly used in making inks. In some embodiments of the present invention, the ink is formulated without a dispersant or other additive. The carrier liquid may be an aqueous (water-based) or non-aqueous (organic) solvent. Other components include, without limitation, dispersing agents, binders, emulsifiers, anti-foaming agents, dryers, solvents, fillers, extenders, thickening agents, film conditioners, anti-oxidants, flow and leveling agents, plasticizers and preservatives. These components can be added in various combinations to improve the film quality and optimize the coating properties of the particle dispersion and/or improve the subsequent densification. Any of the ink formulations, dispersants, surfactants, or other additives described in U.S. patent application Ser. No. 12/175,945 filed Jul. 18, 2008 and fully incorporated herein by reference.

The precursor layer 106 from the dispersion may be formed on the substrate 102 by any of a variety of solution-based coating techniques including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like, as well as combinations of the above and/or related technologies. The foregoing may apply to any embodiments herein, regardless of particle size or shape.

Note that the method may be optimized by using, prior to, during, or after the solution deposition and/or (partial) densification of one or more of the precursor layers, any combination of (1) any (mixture of) chalcogen source(s) that can be solution-deposited, e.g. a Se or S nanopowder mixed into the precursor layers or deposited as a separate layer, (2) chalcogen (e.g., Se or S) evaporation, (3) a (mixture of) chalcogen-containing hydride gas(es) atmosphere (e.g. $H_2Se$, and/or $H_2S$) at pressures below, equal to, and/or above atmospheric pressure, (4) a steady-state and/or dynamic (mixture of) chalcogen vapor(s) atmosphere (e.g., Se, and/or S) at pressures below, equal to, and/or above atmospheric pressure, (5) an organo-selenium containing atmosphere, e.g. diethylselenide, at pressures below, equal to, and/or above atmospheric pressure, (6) an $H_2$ atmosphere at pressures below, equal to, and/or above atmospheric pressure, (7) another reducing atmosphere, e.g. CO, (8) a wet chemical reduction step, (9) generation of a plasma to break the chemical bonds in the vapor(s) and/or gas(es) in the atmosphere to increase the reactivity of these species, at pressures below, equal to, and/or above atmospheric pressure, (10) a steady-state and/or dynamic atmosphere containing a sodium source, (e.g. Na—Se or Na—S), at pressures below, equal to, and/or above atmospheric pressure, (11) liquid deposition of a chalcogen source, and a (12) heat treatment.

Figure 1C:
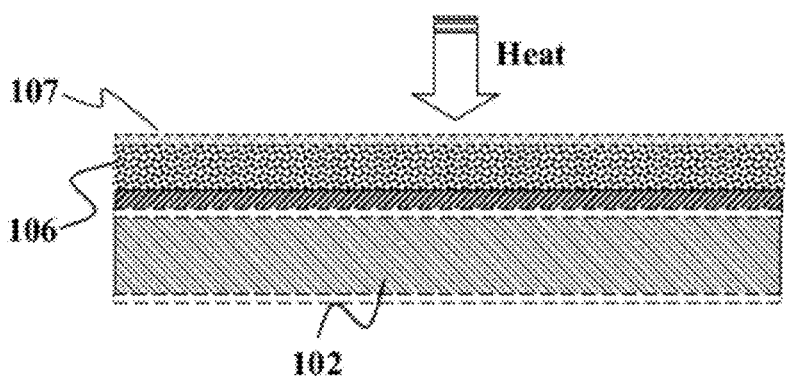

Referring now to FIG. 1C, the precursor layer 106 of particles may then be processed in a suitable atmosphere to form a film. In one embodiment, this processing involves heating the precursor layer 106 to a temperature sufficient to convert the ink to a film (as-deposited ink; note that solvent and possibly dispersant have been removed by drying or other removal technique). The heating may involve various thermal processing techniques such as pulsed thermal processing, exposure to laser beams, heating via IR lamps, and/or similar or related processes. Although not limited to the following, the temperature during heating may be between about 375° C. and about 525° C. (a safe temperature range for processing on aluminum foil or high-temperature-compatible polymer substrates). The processing may occur at various temperatures in this range, such as but not limited to a constant temperature of 450° C. In other embodiments, the temperature may be between about 400° C. and about 600° C. at the level of the precursor layer, but cooler at the substrate. In other embodiments, the temperature may be between about 500° C. and about 600° C. at the level of the precursor layer.

The atmosphere associated with the annealing step in FIG. 1C may also be varied. In one embodiment, the suitable atmosphere comprises an atmosphere containing more than about 10% hydrogen. In another embodiment the suitable atmosphere comprises a carbon monoxide atmosphere. However, in other embodiments where very low or no amounts of oxygen are found in the particles, the suitable atmosphere may be a nitrogen atmosphere, an argon atmosphere, or an atmosphere having less than about 10% hydrogen. These other atmospheres may be advantageous to enable and improve material handling during production.

Figure 1D:
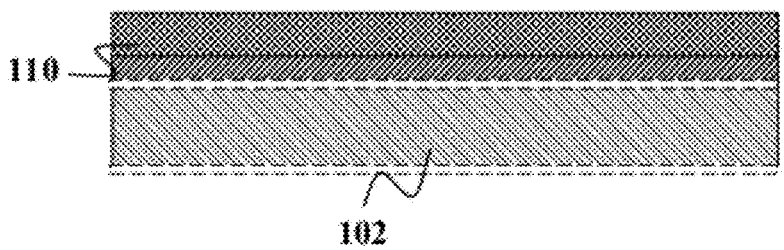

Referring now to FIG. 1D, the precursor layer 106 processed in FIG. 1C will form a film 110. The film 110 may actually have a reduced thickness compared to the thickness of the wet precursor layer 106 since the carrier liquid and other materials have been removed during processing. In one nonlimiting embodiment, the film 110 may have a thickness in the range of about 0.5 microns to about 2.5 microns. In other embodiments, the thickness of film 110 may be between about 1.5 microns and about 2.25 microns. In one embodiment, the resulting dense film 110 may be substantially void free. In some embodiments, the dense film 110 has a void volume of about 5% or less. In other embodiments, the void volume is about 10% or less. In another embodiment, the void volume is about 20% or less. In still other embodiments, the void volume is about 24% or less. In still other embodiments, the void volume is about 30% or less. The processing of the precursor layer 106 will fuse the particles together and in most instances, remove void space and thus reduce the thickness of the resulting dense film.

Depending on the type of materials used to form the film 110, the film 110 may be suitable for use as an absorber layer or be further processed to become an absorber layer. More specifically, the film 110 may be a film as a result of a one step process, or for use in another subsequent one step process making it a two step process, or for use in a multi-step process. In a one step process, the film 110 is formed to include group IB-IIIA-VIA compounds and the film 110 may be an absorber film suitable for use in a photovoltaic device. In a two step process, the film 110 may be a solid, annealed, and/or densified film that will have further processing to be suitable for use as an absorber film for use in a photovoltaic device. As a nonlimiting example, the film 110 in a two step process may not contain any and/or sufficient amounts of a group VIA element to function as an absorber layer. Adding a group VIA element or other material may be the second step of the two-step process. Either a mixture of two or more VIA elements can be used, or a third step can be added with another VIA element as used in the second step. A variety of methods of adding that material include printing of group VIA element, using VIA element vapor, and/or other techniques. It should also be understood that in a two step process, the process atmospheres may be different. By way of nonlimiting example, one atmosphere may optionally be a group VIA-based atmosphere. As another nonlimiting example, one atmosphere may be an inert atmosphere as described herein. Other processing steps as used in a multi-step process may be a wet chemical surface treatment to improve the IB-IIIA-VIA thin-film surface and/or grain boundaries, and/or an additional rapid thermal heating to improve bulk and/or surface properties of the IB-IIIA-VIA thin-film.

Particle Shapes

It should be understood that any of solid particles as discussed herein may be used in spherical and/or non-spherical particle shapes. FIG. 1A shows that the particles may all be non-spherical, planar flake particles. By way of example and not limitation, it should be understood that the solid Group IIIA-based particles may be particles of various shapes used with any of the combinations shown below in Table III. Flakes may be considered to be one type of non-spherical particles.

Referring now to FIG. 2A, the absorber layer may be formed on a substrate 312, as shown in FIG. 2A. A surface of the substrate 312 may be coated with a contact layer 314 to promote electrical contact between the substrate 312 and the absorber layer that is to be formed on it. By way of example, a metal substrate 312 may be coated with a contact layer 314 of molybdenum. As discussed herein, forming or disposing a material or layer of material on the substrate 312 includes disposing or forming such material or layer on the contact layer 314, if one is used. Optionally, it should also be understood that a layer 315 may also be formed on top of contact layer 314 and/or directly on substrate 312. This layer may be solution coated, evaporated, and/or deposited using vacuum based techniques. Although not limited to the following, the layer 315 may have a thickness less than that of the precursor layer 316. In one nonlimiting example, the layer may be between about 1 nm to about 100 nm in thickness. The layer 315 may be comprised of various materials including but not limited to at least one of the following: a group IB element, a group MA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gal-

TABLE III

|  | Spherical | Non-Spherical | Flake | Nanoglobules |
| --- | --- | --- | --- | --- |
| Spherical | Spherical | Non-spherical + Spherical | Flake + Spherical | Nanoglobules + Spherical |
| Non-Spherical | Spherical + Non-spherical | Non-spherical | Flake + Non-spherical | Nanoglobules + Non-spherical |
| Flake | Spherical + Flake | Non-spherical + Flake | Flake | Nanoglobules + Flake |
| Nanoglobules | Spherical + Nanoglobules | Non-spherical + Nanoglobules | Flake + Nanoglobules | Nanoglobules |
| Spherical + Non-spherical | Spherical + Non-spherical | Spherical + Non-spherical | Spherical + Non-spherical + Flake | Spherical + Non-spherical + Nanoglobules |
| Spherical + Flake | Spherical + Flake | Spherical + Flake + Non-spherical | Spherical + Flake | Spherical + Flake + Nanoglobules |
| Spherical + Nanoglobules | Spherical + Nanoglobules | Spherical + Nanoglobules + Non-spherical | Spherical + Nanoglobules + Flake | Spherical + Nanoglobules |
| Flake + Nonspherical | Flake + Nonspherical + Spherical | Flake + Nonspherical | Flake + Nonspherical | Flake + Nonspherical + Nanoglobules |
| Flake + Nanoglobules | Flake + Nanoglobules + Spherical | Flake + Nanoglobules + Non-spherical | Flake + Nanoglobules | Flake + Nanoglobules |
| Non-spherical + Nanoglobules | Non-spherical + Nanoglobules + Spherical | Non-spherical + Nanoglobules | Non-spherical + Nanoglobules + Flake | Non-spherical + Nanoglobules |

It should be understood that the salt particles described herein may be size reduced to be spherical and/or non-spherical in shape and is not limited to any one particular configuration.

Additional Sodium

Referring now to FIGS. 2A-2E, it should be understood that even with solid group IIIA-based particles, more sodium may be desired to provide improved performance. This embodiment of the invention shows that layers of material may be deposited above and/or below the precursor layer. Some layers may be deposited after the precursor layer has been processed. Although not limited to the following, these layers may provide one technique for adding additional sodium.

lium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

As shown in FIG. 2B, a precursor layer 316 is formed on the substrate. The precursor layer 316 contains one or more group IB elements and one or more group IIIA elements. Preferably, the one or more group IB elements include copper. Optionally, the one or more group IB elements include silver or gold. The one or more group IIIA elements may include indium and/or gallium. The precursor layer may be formed using any of the techniques described above. In one embodiment, the precursor layer contains no oxygen other than those unavoidably present as impurities or incidentally present in components of the film other than the flakes themselves. Although the precursor layer 316 is preferably formed using non-vacuum methods, it should be understood that it may optionally be formed by other means, such as evaporation, sputtering, chemical vapor deposition, physical vapor deposition, atomic layer deposition, ALD, etc. By way of example, the precursor layer 316 may be an oxygen-free compound containing copper, indium and gallium. In one embodiment, the non-vacuum system operates at pressures above about 3.2 kPa (24 Torr). Optionally, it should also be understood that a layer 317 may also be formed on top of precursor layer 316. It should be understood that the stack may have both layers 315 and 317, only one of the layers, or none of the layers. Although not limited to the following, the layer 317 may have a thickness less than that of the precursor layer 316. In one nonlimiting example, the layer may be between about 1 to about 100 nm in thickness. The layer 317 may be comprised of various materials including but not limited to at least one of the following: a group IB element, a group IIIA element, a group VIA element, a group IA element (new style: group 1), a binary and/or multinary alloy of any of the preceding elements, a solid solution of any of the preceding elements, copper, indium, gallium, selenium, copper indium, copper gallium, indium gallium, sodium, a sodium compound, sodium fluoride, sodium indium sulfide, copper selenide, copper sulfide, indium selenide, indium sulfide, gallium selenide, gallium sulfide, copper indium selenide, copper indium sulfide, copper gallium selenide, copper gallium sulfide, indium gallium selenide, indium gallium sulfide, copper indium gallium selenide, and/or copper indium gallium sulfide.

Referring now to FIG. 2C, heat 320 is applied to densify the first precursor layer 316 into a group IB-IIIA compound film 322. The heat 320 may be supplied in a rapid thermal annealing process, e.g., as described above. As a nonlimiting example, the substrate 312 and precursor layer(s) 316 may be heated from an ambient temperature to a plateau temperature range of between about 200° C. and about 600° C. The temperature may be maintained in the plateau range for a period of time ranging between about a fraction of a second to about 60 minutes, and subsequently reduced. The heat turns the precursor layer into a film 322. Optionally, this may be a dense, metallic film as shown in FIG. 2D. The heating may remove voids and create a denser film than the precursor layer. In other embodiments, where the precursor layer is already dense, there may be little to no densification.

Optionally, as shown in FIG. 2D, a layer 326 containing an additional chalcogen source, and/or an atmosphere containing a chalcogen source, may optionally be applied to layer 322. Heat 328 may optionally be applied to layer 322 and the layer 326 and/or atmosphere containing the chalcogen source to heat them to a temperature sufficient to melt the chalcogen source and to react the chalcogen source with the group IB element and group IIIA elements in the precursor layer 322. The heat 328 may be applied in a rapid thermal annealing process, e.g., as described above. The reaction of the chalcogen source with the group IB and IIIA elements forms a compound film 330 of a group IB-IIIA-chalcogenide compound. Preferably, the group IB-IIIA-chalcogenide compound is of the form $(Ag,Au,Cu)_z In_{1-x} Ga_x Se_{2(1-y)} S_{2y}$, where $0 \leq x \leq 1$, $0 \leq y \leq 1$, and $0.5 \leq y \leq 1.5$. Although not limited to the following, the compound film 330 may be thicker than the film 322 due to the reaction with group VIA elements.

Referring now to FIGS. 2A-2E, it should be understood that sodium may also be used with the precursor material to improve the qualities of the resulting film. This may be particularly useful in situation where solid Group IIIA particles are formed without using a sodium based material and additional sodium is desired. In a first method, as discussed in regards to FIGS. 2A and 2B, one or more layers of a sodium containing material may be formed above and/or below the precursor layer 316. The formation may occur by solution coating and/or other techniques such as but not limited to sputtering, evaporation, CBD, electroplating, sol-gel based coating, spray coating, chemical vapor deposition (CVD), physical vapor deposition (PVD), atomic layer deposition (ALD), and the like.

Optionally, in a second method, sodium may also be introduced into the stack by sodium doping the flakes and/or particles in the precursor layer 316. As a nonlimiting example, the flakes and/or other particles in the precursor layer 316 may be a sodium containing material such as, but not limited to, Au—Na, Ag—Na, Cu—Na, In—Na, Ga—Na, Cu—In—Na, Au—In—Na, Ag—In—Na, Au—Ga—Na, Ag—Ga—Na, Cu—Ga—Na, In—Ga—Na, Na—Se, Au—Se—Na, Ag—Se—Na, Cu—Se—Na, In—Se—Na, Ga—Se—Na, Au—In—Se—Na, Ag—In—Se—Na, Cu—In—Se—Na, Au—Ga—Se—Na, Ag—Ga—Se—Na, Cu—Ga—Se—Na, In—Ga—Se—Na, Ag—In—Ga—Se—Na, Au—In—Ga—Se—Na, Cu—In—Ga—Se—Na, Na—S, Au—In—Ga—Na, Ag—In—Ga—Na, Cu—In—Ga—Na, Au—S—Na, Ag—S—Na, Cu—S—Na, In—S—Na, Ga—S—Na, Au—In—S—Na, Ag—In—S—Na, Cu—In—S—Na, Au—Ga—S—Na, Ag—Ga—S—Na, Cu—Ga—S—Na, In—Ga—S—Na, Au—In—Ga—S—Na, Ag—In—Ga—S—Na, and/or Cu—In—Ga—S—Na. In one embodiment of the present invention, the amount of sodium in the flakes and/or other particles may be about 1 at. % or less. In another embodiment, the amount of sodium may be about 0.5 at. % or less. In yet another embodiment, the amount of sodium may be about 0.1 at. % or less. It should be understood that the doped particles and/or flakes may be made by a variety of methods including milling feedstock material with the sodium containing material and/or elemental sodium.

Optionally, in a third method, sodium may be incorporated into the ink itself, regardless of the type of particle, nanoparticle, microflake, and/or nanoflakes dispersed in the ink. As a nonlimiting example, the ink may include flakes (Na doped or undoped) and a sodium compound with an organic counter-ion (such as but not limited to sodium acetate) and/or a sodium compound with an inorganic counter-ion (such as but not limited to sodium sulfide). It should be understood that sodium compounds added into the ink (as a separate compound), might be present as particles (e.g. nanoparticles), or dissolved and/or in (reverse) micelles. The sodium may be in "aggregate" form of the sodium compound (e.g. dispersed particles), and the "molecularly dissolved" form.

None of the three aforementioned methods are mutually exclusive and may be applied singly or in any single or multiple combination(s) to provide the desired amount of sodium to the stack containing the precursor material. Additionally, sodium and/or a sodium containing compound may also be added to the substrate (e.g. into the molybdenum target). Also, sodium-containing layers may be formed in between one or more precursor layers if multiple precursor layers (using the same or different materials) are used. It should also be understood that the source of the sodium is not limited to those materials previously listed. As a nonlimiting example, basically, any deprotonated alcohol where the proton is replaced by sodium, any deprotonated organic and inorganic acid, the sodium salt of the (deprotonated) acid, $Na_x H_y Se_z S_u Te_v O_w$ where x, y, z, u, v, and w≥0, $Na_x Cu_y In_z Ga_u O_v$ where x, y, z, u, and v≥0 sodium hydroxide, sodium acetate, and the sodium salts of the following acids: butanoic acid, hexanoic acid, octanoic acid, decanoic acid, dodecanoic acid, tetradecanoic acid, hexadecanoic acid, 9-hexadecenoic acid, octadecanoic acid, 9-octadecenoic acid, 11-octadecenoic acid, 9,12-octadecadienoic acid, 9,12,15-octadecatrienoic acid, and/or 6,9,12-octadecatrienoic acid.

Optionally, as seen in FIG. 2E, it should also be understood that sodium and/or a sodium compound may be added to the processed chalcogenide film after the precursor layer has been densified or otherwise processed. This embodiment of the present invention thus modifies the film after ACIGS formation. With sodium, carrier trap levels associated with the grain boundaries are reduced, permitting improved electronic properties in the film. A variety of sodium containing materials such as those listed above may be deposited as layer 332 onto the processed film and then annealed to treat the ACIGS film.

Additionally, the sodium material may be combined with other elements that can provide a bandgap widening effect. Two elements which would achieve this include gallium and sulfur. The use of one or more of these elements, in addition to sodium, may further improve the quality of the absorber layer. The use of a sodium compound such as but not limited to $Na_2S$, $NaInS_2$, or the like provides both Na and S to the film and could be driven in with an anneal such as but not limited to an RTA step to provide a layer with a bandgap different from the bandgap of the unmodified CIGS layer or film.

Figure 4A:
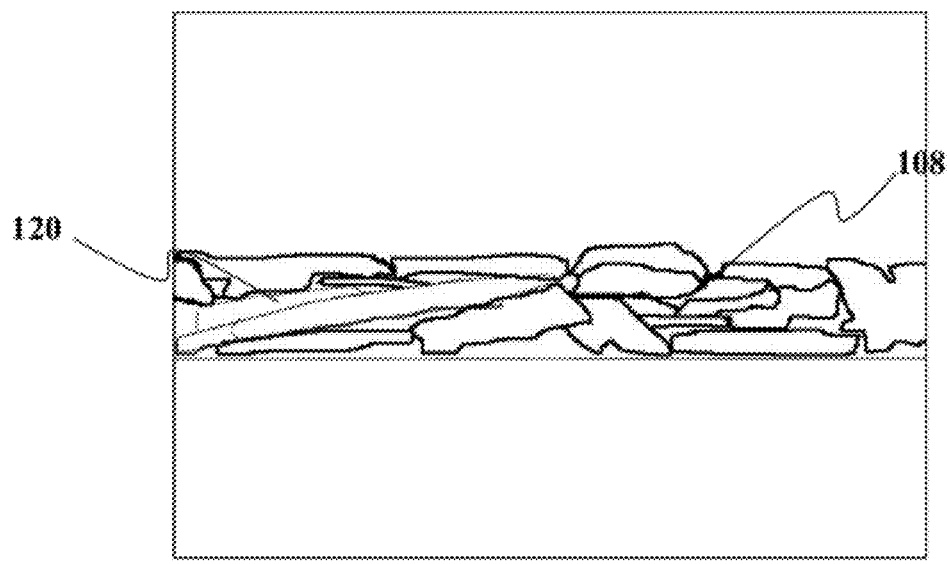
FIGS. 4A-4C show various views of non-spherical particles according to embodiments of the present invention.
Figure 4B:
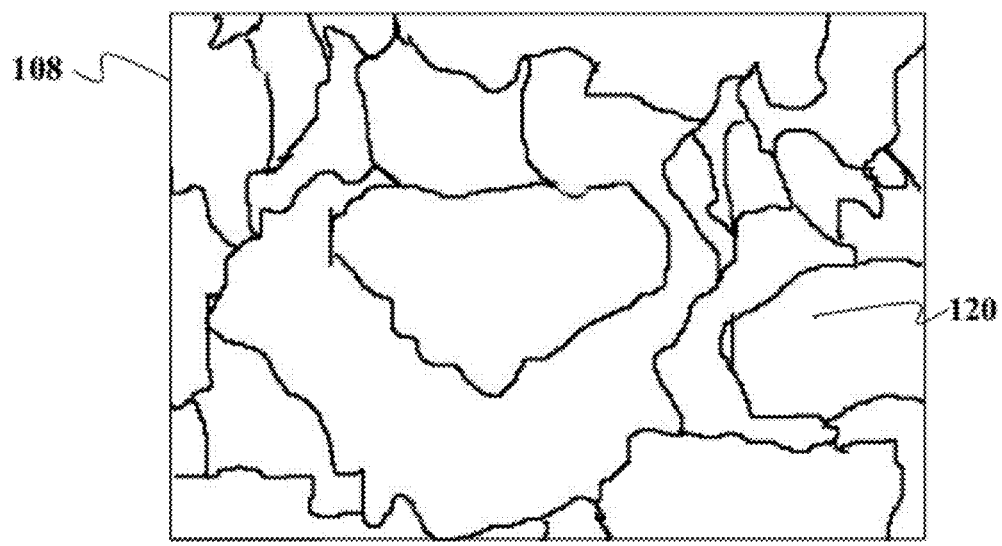

Referring now to FIGS. 4A and 4B, embodiments of the flakes 108 according to the present invention will be described in further detail. The flakes 108 may come in a variety of shapes and sizes. In one embodiment, the flakes 108 may have a large aspect ratio, in terms of particle thickness to particle length. FIG. 2A shows that some flakes have thicknesses between about 0.2 to about 0.4 microns (200 to 400 nm) and lengths between about 2 to about 5 microns (2000 to 5000 nm). Optionally, some embodiments use smaller flakes with the median size in the longest dimension in the range of about 400 nm to 700 nm. As a nonlimiting example, the plates are thin (about 100 nm to 75 nm thickness or less) while their lengths may be as large as about 5 microns (5000 nm). Some may have a length of about 3 microns (3000 nm) or less. Other embodiments of the flakes 108 may have a length of about 1 micron (1000 nm) or less. The aspect ratio in some embodiments of flakes may be about 10:1 or more (ratio of the longest dimension to the shortest dimension of a particle). Other embodiments may have an aspect ratio of about 30:1 or more. Still others may have an aspect ratio of about 50:1 or more. An increase in aspect ratio would indicate that the longest dimension has increased over the shortest dimension or that the shortest dimension has decreased relative to the longest dimension. Thus, aspect ratio herein involves the longest lateral dimension (be it length or width) relative to the shortest dimension, which is typically the thickness of a flake. The dimensions are measured along edges or across a major axis to provide measurement of dimensions such as but not limited to length, width, depth, and/or diameter. When referring to a plurality of flakes having a defined aspect ratio, what is meant is that all of the flakes of a composition as a whole have an average aspect ratio as defined. It should be understood that there may be a distribution of particle aspect ratios around the average aspect ratio.

As seen in FIG. 4A, although the size and shape of the flakes 108 may vary, most include at least one substantially planar surface 120. The at least one planar surface 120 allows for greater surface contact between adjacent flakes 108. The greater surface contact provides a variety of benefits. The greater contact allows for improved atomic intermixing between adjacent particles. For flakes containing more than one element, even though there may be atomic intermixing already in place for the particles, the close contact in the film allows easy subsequent diffusion. Thus, if a particle is slightly rich in one element, the increased contact facilitates a more even distribution of elements in the resulting dense film. Furthermore, greater interparticle interfacial area leads to faster reaction rates. The planar shape of the particles maximizes interparticle contact area. The interparticle contact area allows chemical reactions (e.g. based for example upon atomic diffusion) to be initiated, catalyzed, and/or progress relatively rapidly and concurrently over large areas. Thus, not only does the shape improve intermixing, the greater interfacial area and interparticle contact area also improves reaction rates.

Referring still to FIG. 4A, the planar shape also allows for improved packing density. As seen in FIG. 4A, the flakes 108 may be oriented substantially parallel to the surface of substrate 102 and stack one on top of the other to form the precursor layer 106. Intrinsically, the geometry of the flakes allow for more intimate contact than spherical particles or nanoparticles in the precursor layer. In fact, it is possible that 100% of the planar surface of the flake is in contact with another flake. Thus, the planar shape of the flakes creates a higher packing density in the dense film as compared to a film made from a precursor layer using an ink of spherical nanoparticles of the same composition that is otherwise substantially identical. In some embodiments, the planar shape of the flakes creates a packing density of at least about 70% in the precursor layer. In other embodiments, the flakes create a packing density of at least about 80% in the precursor layer. In other embodiments, the flakes create a packing density of at least about 90% in the precursor layer. In other embodiments, the flakes create a packing density of at least about 95% in the precursor layer.

As seen in FIG. 4B, the flakes 108 may have a variety of shapes. In some embodiments, the flakes in the ink may include those that are of random size and/or random shape. On the contrary, particles size is extremely important for standard spherical nanoparticles, and those spherical nanoparticles of different size and composition will result in dispersion with unstable atomic composition. The planar surface 120 of the flakes allows for particles that are more easily suspended in the carrier liquid. Thus, even though the flakes may not be monodisperse in size, putting the constituent metals in plate form provides one method to have particles suspended in the carrier liquid without rapid and/or preferential settling of any constituent element.

It should be understood that the flakes 108 of the present invention may be formed and/or size discriminated to provide a more controlled size and shape distribution. The size distribution of flakes may be such that one standard deviation from a mean length and/or width of the flakes is less than about 1000 nm. The size distribution of flakes may be such that one standard deviation from a mean length and/or width of the flakes is less than about 600 nm. The size distribution of flakes may be such that one standard deviation from a mean length and/or width of the flakes is less than about 500 nm. The size distribution of flakes may be such that one standard deviation from a mean length and/or width of the flakes is less than about 400 nm. The size distribution of flakes may be such that one standard deviation from a mean length and/or width of the flakes is less than about 250 nm. In another embodiment, the size distribution of flakes may be such that one standard deviation from a mean length and/or width of the flakes is less than about 100 nm. In another embodiment, one standard deviation from a mean length of the flakes is less than about 50 nm.

Figure 4C:
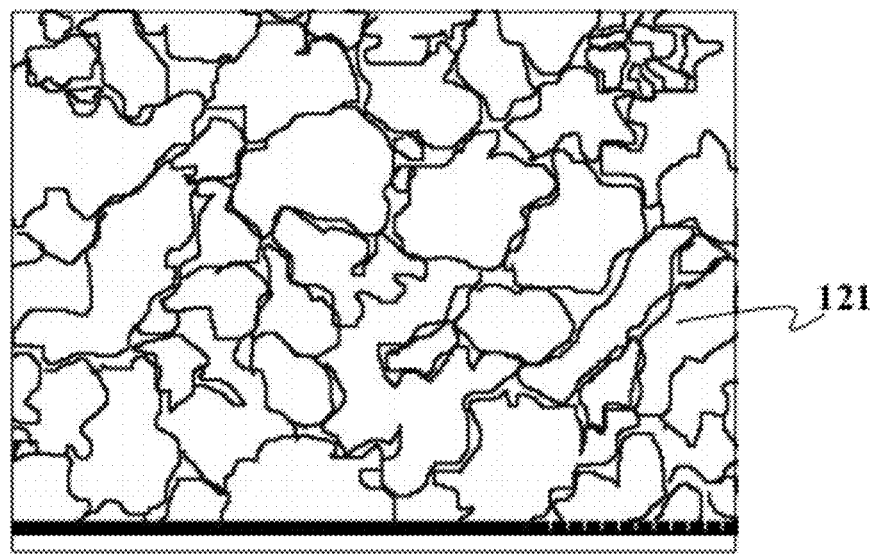

In yet another embodiment, one standard deviation from a mean thickness of the flakes is less than about 10 nm. In another embodiment of the invention, one standard deviation from a mean thickness of the flakes is less than about 5 nm. The flakes each have a thickness less than about 250 nm. In another embodiment, the flakes each have a thickness less than about 100 nm. In yet another embodiment, the flakes each have a thickness less than about 20 nm. The flakes may have a length of less than about 5 microns and a thickness of less than about 250 nm. In another embodiment, the flakes may have a length of less than about 2 microns and a thickness of less than about 100 nm. In another embodiment, the flakes have a length of less than about 1 micron and a thickness of less than about 50 nm. In terms of their shape, the flakes may have an aspect ratio of at least about 10 or more. In another embodiment, the flakes have an aspect ratio of at least about 15 or more. The flakes are of random planar shape and/or a random size distribution. In other embodiments, the flakes are of non-random planar shape and/or a non-random size distribution. Additionally, FIG. 4C shows a magnified top-down view of nanoflakes 121 according to one embodiment of the present invention The stoichiometric ratio of elements may vary between individual flakes so long as the overall amount in all of the particles combined is at the desired or close to the desired stoichiometric ratio for the precursor layer and/or resulting dense film. According to one preferred embodiment of that process, the overall amount of elements in the resulting film has a Cu/(In+Ga) compositional range of about 0.7 to about 1.0 and a Ga/(In+Ga) compositional range of about 0.05 to about 0.30. Optionally, the Se/(In+Ga) compositional range may be about 0.00 to about 4.00 such that a later step involving use of an additional source of Se may or may not be required.

Figure 3:
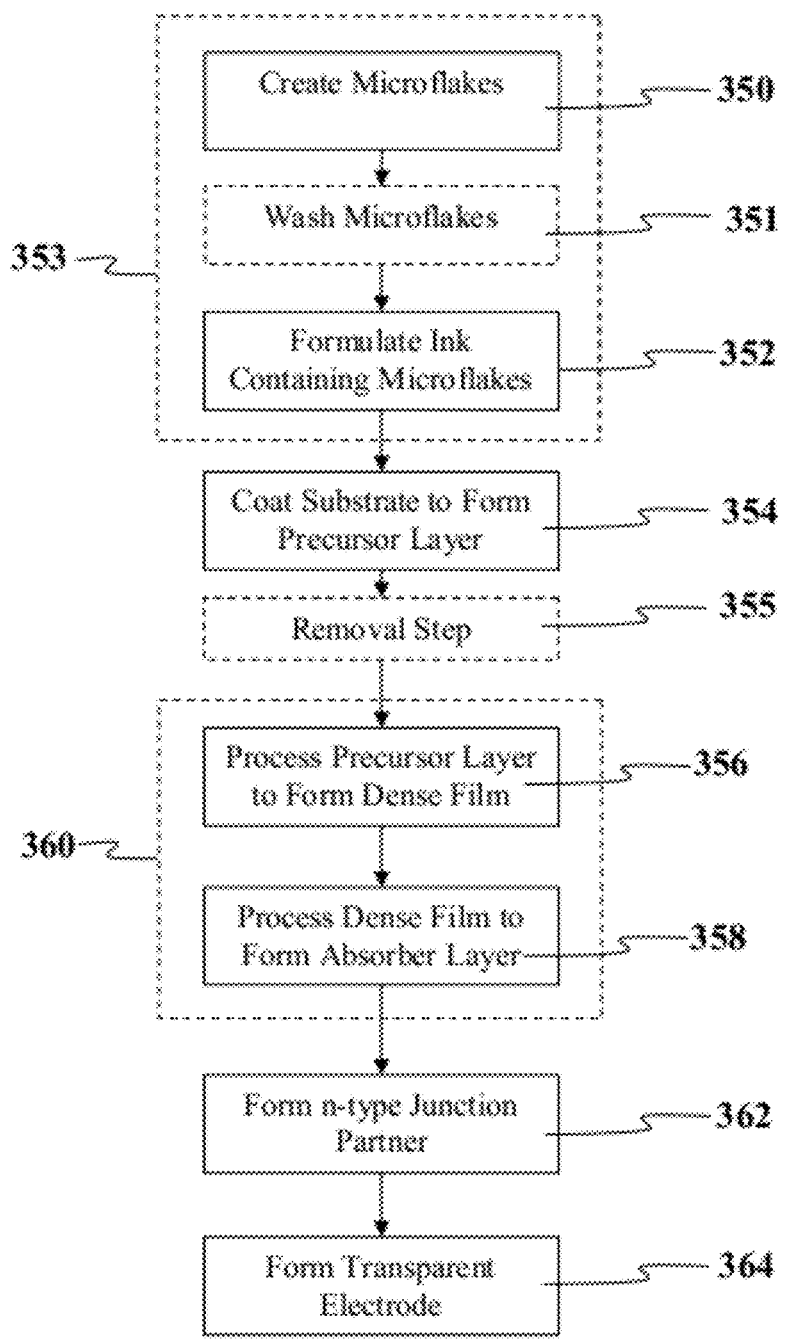
FIG. 3 shows a flowchart of a method according to one embodiment of the present invention.

Referring now to FIG. 3, a flowchart showing one embodiment of a method according to the present invention will now be described. FIG. 3 shows that at step 350, the microflakes 108 may be created using one of the processes described herein. Optionally, there may be a washing step 351 to remove any undesired residue. Once the microflakes 108 are created, step 352 shows that the ink may be formulated with the microflakes and at least one other component such as but not limited to a carrier liquid. Optionally, it should be understood that some embodiments of the invention may combine the steps 350 and 352 into one process step as indicated by box 353 (shown in phantom) if the creation process results in a coatable formulation. As one nonlimiting example, this may be the case if the dispersants and/or solvents used during formation can also be used to form a good coating. At step 354, the substrate 102 may be coated with the ink to form the precursor layer 106. Optionally, there may be a step 355 of removing dispersant and/or other residual of the as-coated layer 106 by methods such as but not limited to heating, washing, or the like. Optionally, step 355 may involve a step of removing solve after ink deposition by using a drying device such as but not limited to a drying tunnel/furnace. Step 356 shows the precursor layer is processed to form a dense film which may then further be processed at step 358 to form the absorber layer. Optionally, it should be understood that some embodiments of the invention may combine the steps 356 and 358 into one process step if the dense film is an absorber layer and no further processing of the film is needed. Step 360 shows that the n-type junction may be formed over and/or in contact with the absorber layer. Step 362 shows that a transparent electrode may be formed over the n-type junction layer to create a stack that can function as a solar cell.

To formulate the dispersion used in the precursor layer 106, the flakes 108 are mixed together and with one or more chemicals including but not limited to dispersants, surfactants, polymers, binders, cross-linking agents, emulsifiers, anti-foaming agents, dryers, solvents, fillers, extenders, thickening agents, film conditioners, anti-oxidants, flow agents, leveling agents, and corrosion inhibitors.

The inks created using the present invention may optionally include a dispersant. Some embodiments may not include any dispersants. Dispersants (also called wetting agents) are surface-active substances used to prevent particles from aggregating or flocculating, thus facilitating the suspension of solid materials in a liquid medium and stabilizing the dispersion thereby produced. If particle surfaces attract one another, then flocculation occurs, often resulting in aggregation and decreasing stability and/or homogeneity. If particle surfaces repel one another, then stabilization occurs, where particles do not aggregate and tend not to settle out of solution as fast.

An efficient dispersing agent can typically perform pigment wetting, dispersing, and stabilizing. Dispersing agents are different depending on the nature of the ink/paint. Polyphosphates, styrene-maleinates and polyacrylates are often used for aqueous formulations whereas fatty acid derivatives and low molecular weight modified alkyd and polyester resins are often used for organic formulations.

Surfactants are surface-active agents that lower the surface tension of the solvent in which they dissolve, serving as wetting agents, and keeping the surface tension of an (aqueous) medium low so that an ink interacts with a substrate surface. Certain types of surfactants are also used as dispersing agents. Surfactants typically contain both a hydrophobic carbon chain and a hydrophilic polar group. The polar group can be non-ionic. If the polar group is ionic, the charge can be either positive or negative, resulting in cationic or anionic surfactants. Zwitterionic surfactants contain both positive and negative charges within the same molecule; one example is N-n-Dodecyl-N,N-dimethyl betaine. Certain surfactants are often used as dispersant agents for aqueous solutions. Representative classes include acetylene diols, fatty acid derivatives, phosphate esters, sodium polyacrylate salts, polyacrylic acids, soya lecithin, trioctylphosphine (TOP), and trioctylphosphine oxide (TOPO).

Binders and resins are often used to hold together proximate particles in a nascent or formed dispersion. Examples of typical binders include acrylic monomers (both as monofunctional diluents and multifunctional reactive agents), acrylic resins (e.g. acrylic polyol, amine synergists, epoxy acrylics, polyester acrylics, polyether acrylics, styrene/acrylics, urethane acrylics, or vinyl acrylics), alkyd resins (e.g. long-oil, medium-oil, short-oil, or tall oil), adhesion promoters such as but not limited to polyvinyl pyrrolidone (PVP), amide resins, amino resins (such as but not limited to melamine-based or urea-based compounds), asphalt/bitumen, butadiene acrylonitriles, cellulosic resins (such as but not limited to cellulose acetate butyrate (CAB)), cellulose acetate proprionate (CAP), ethyl cellulose (EC), nitrocellulose (NC), or organic cellulose ester), chlorinated rubber, dimer fatty acids, epoxy resin (e.g. acrylates, bisphenol A-based resins, epoxy UV curing resins, esters, phenol and cresol (Novolacs), or phenoxy-based compounds), ethylene co-terpolymers such as ethylene acrylic/methacrylic Acid, E/AA, E/M/AA or ethylene vinyl acetate (EVA), fluoropolymers, gelatin (e.g. Pluronic F-68 from BASF Corporation of Florham Park, N.J.), glycol monomers, hydrocarbon resins (e.g. aliphatic, aromatic, or coumarone-based such as indene), maelic resins, modified urea, natural rubber, natural resins and gums, rosins, modified phenolic resins, resols, polyamide, polybutadienes (liquid hydroxyl-terminated), polyesters (both saturated and unsaturated), polyolefins, polyurethane (PU) isocyanates (e.g. hexamethylene diisocynate (HDI), isophorone diisocyanate (IPDI), cycloaliphatics, diphenylmethane disiocyanate (MDI), toluene diisocynate (TDI), or trimethylhexamethylene diisocynate (TMDI)), polyurethane (PU) polyols (e.g. caprolactone, dimer-based polyesters, polyester, or polyether), polyurethane (PU) dispersions (PUDs) such those based on polyesters or polyethers, polyurethane prepolymers (e.g. caprolactone, dimer-based polyesters, polyesters, polyethers, and compounds based on urethane acrylate), Polyurethane thermoplastics (TPU) such as polyester or polyether, silicates (e.g. alkyl-silicates or water-glass based compounds), silicones (amine functional, epoxy functional, ethoxy functional, hydroxyl functional, methoxy functional, silanol functional, or cinyl functional), styrenes (e.g. styrene-butadiene emulsions, and styrene/vinyl toluene polymers and copolymers), or vinyl compounds (e.g. polyolefins and polyolefin derivatives, polystyrene and styrene copolymers, or polyvinyl acetate (PVAC)).

Emulsifiers are dispersing agents that blend liquids with other liquids by promoting the breakup of aggregating materials into small droplets and therefore stabilize the suspension in solution. For example, sorbitan esters are used as an emulsifier for the preparation of water-in-oil (w/o) emulsions, for the preparation of oil absorption bases (w/o), for the formation of w/o type pomades, as a reabsorption agent, and as a non toxic anti-foaming agent. Examples of emulsifiers are sorbitan esters such as sorbitan sesquioleate (Arlacel 60), sorbitan sesquioleate (Arlacel 83), sorbitan monolaurate (Span 20), sorbitan monopalmitate (Span 40), sorbitan monostearate (Span 60), sorbitan tristearate (Span 65), sorbitan mono-oleate (Span 80), and sorbitan trioleate (Span 85) all of which are available, e.g., from Uniqema of New Castle, Del. Other polymeric emulsifiers include polyoxyethylene monostearate (Myrj 45), polyoxyethylene monostearate (Myrj 49), polyoxyl 40 stearate (Myrj 52), polyoxyethylene monolaurate (PEG 400), polyoxyethylene monooleate (PEG 400 monoleate) and polyoxyethylene monostearate (PEG 400 monostearate), and the Tween series of surfactants including but not limited to polyoxyethylene sorbitan monolaurate (Tween 20), polyoxyethylene sorbitan monolaurate (Tween 21), polyoxyethylene sorbitan monopalmitate (Tween 40), polyoxyethylene sorbitan monostearate (Tween 60), polyoxyethylene sorbitan tristearate (Tween 61), polyoxyethylene sorbitan mono-oleate (Tween 80), polyoxyethylene sorbitan monooleate (Tween 81), and polyoxyethylene sorbitan tri-oleate (Tween 85) all of which are available, e.g., from Uniqema of New Castle, Del. Arlacel, Myrj, and Tween are registered trademarks of ICI Americas Inc. of Wilmington, Del.

Foam may form during the coating/printing process, especially if the printing process takes place at high speeds. Surfactants may adsorb on the liquid-air interface and stabilize it, accelerating foam formation. Anti-foaming agents prevent foaming from being initiated, while defoaming agents minimize or eliminate previously-formed foam. Anti-foaming agents include hydrophobic solids, fatty oils, and certain surfactants, all of which penetrate the liquid-air interface to slow foam formation. Anti-foaming agents also include both silicate, silicone and silicone-free materials. Silicone-free materials include microcrystalline wax, mineral oil, polymeric materials, and silica- and surfactant-based materials.

Solvents can be aqueous (water-based) or non-aqueous (organic). While environmentally friendly, water-based solutions carry the disadvantage of a relatively higher surface tension than organic solvents, making it more difficult to wet substrates, especially plastic substrates. To improve substrate wetting with polymer substrates, surfactants may be added to lower the ink surface tension (while minimizing surfactant-stabilized foaming), while the substrate surfaces are modified to enhance their surface energy (e.g. by corona treatment). Typical organic solvents include acetate, acrylates, alcohols (butyl, ethyl, isopropyl, or methyl), aldehydes, benzene, dibromomethane, chloroform, dichloromethane, dichloroethane, trichloroethane, cyclic compounds (e.g. cyclopentanone or cyclohexanone), esters (e.g. butyl acetate or ethyl acetate), ethers, glycols (such as ethylene glycol or propylene glycol), hexane, heptane, aliphatic hydrocarbons, aromatic hydrocarbons, ketones (e.g. acetone, methyl ethyl ketone, or methyl isobutyl ketone), natural oils, terpenes, terpinol, toluene.

Additional components may include fillers/extenders, thickening agents, rheology modifiers, surface conditioners, including adhesion promoters/bonding, anti-gelling agents, anti-blocking agents, antistatic agents, chelating/complexing agents, corrosion inhibitors, flame/rust inhibitors, flame and fire retardants, humectants, heat stabilizers, light-stabilizers/UV absorbers, lubricants, pH stabilizers, and materials for slip control, anti-oxidants, and flow and leveling agents. It should be understood that all components may be added singly or in combination with other components.

Roll-to-Roll Manufacturing

Figure 7:
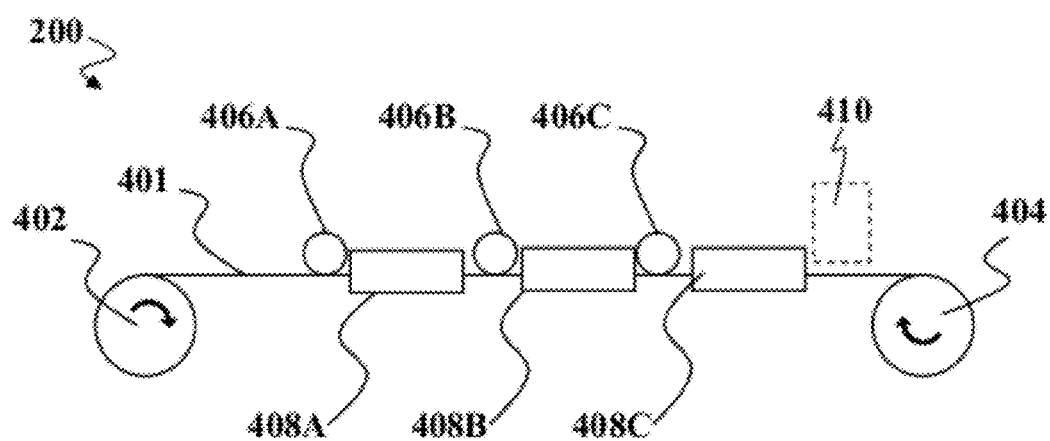
FIG. 7 shows a schematic of a roll-to-roll manufacturing system according to the one embodiment of the present invention.

A roll-to-roll manufacturing process according to the present invention will now be described. Embodiments of the invention using the solid group IIIA-based materials are well suited for use with roll-to-roll manufacturing. Specifically, in a roll-to-roll manufacturing system 400 a flexible substrate 401, e.g., aluminum foil travels from a supply roll 402 to a take-up roll 404. In between the supply and take-up rolls, the substrate 401 passes a number of applicators 406A, 406B, 406C, e.g. gravure rollers and heater units 408A, 408B, 408C. It should be understood that these heater units may be thermal heaters or be laser annealing type heaters as described herein. Each applicator deposits a different layer or sub-layer of a precursor layer, e.g., as described above. The heater units are used to anneal the different layers and/or sub-layers to form dense films. In the example depicted in FIG. 7, applicators 406A and 406B may apply different sub-layers of a precursor layer. Heater units 408A and 408B may anneal each sub-layer before the next sub-layer is deposited. Alternatively, both sub-layers may be annealed at the same time. Applicator 406C may optionally apply an extra layer of material containing chalcogen or alloy or elemental particles as described above. Heater unit 408C heats the optional layer and precursor layer as described above. Note that it is also possible to deposit the precursor layer (or sub-layers) then deposit any additional layer and then heat all three layers together to form the IB-IIIA-chalcogenide compound film used for the photovoltaic absorber layer. The roll-to-roll system may be a continuous roll-to-roll and/or segmented roll-to-roll, and/or batch mode processing.

Photovoltaic Device

Figure 8:
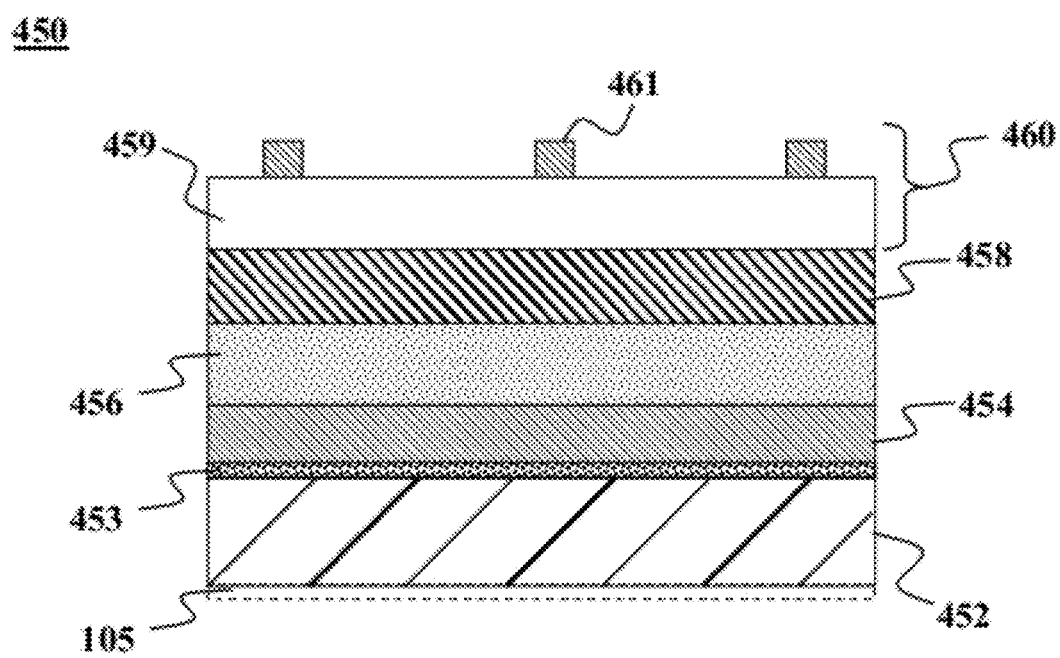
FIG. 8 shows a side cross-sectional view of a solar cell according to one embodiment of the present invention.

Referring now to FIG. 8, the films fabricated as described above using solid group IIIA-based materials may serve as an absorber layer in a photovoltaic device, module, or solar panel. An example of such a photovoltaic device 450 is shown in FIG. 8. The device 450 includes a base substrate 452, an optional adhesion layer 453, a base or back electrode 454, a p-type absorber layer 456 incorporating a film of the type described above, an n-type semiconductor thin film 458 and a transparent electrode 460. By way of example, the base substrate 452 may be made of a metal foil, a polymer such as polyimides (PI), polyamides, polyetheretherketone (PEEK), Polyethersulfone (PES), polyetherimide (PEI), polyethylene naphtalate (PEN), Polyester (PET), related polymers, a metallized plastic, and/or combination of the above and/or similar materials. By way of nonlimiting example, related polymers include those with similar structural and/or functional properties and/or material attributes. The base electrode 454 is made of an electrically conductive material. By way of example, the base electrode 454 may be of a metal layer whose thickness may be selected from the range of about 0.1 micron to about 25 microns. An optional intermediate layer 453 may be incorporated between the electrode 454 and the substrate 452. The transparent electrode 460 may include a transparent conductive layer 459 and a layer of metal (e.g., Al, Ag, Cu, or Ni) fingers 461 to reduce sheet resistance. Optionally, the layer 453 may be a diffusion barrier layer to prevent diffusion of material between the substrate 452 and the electrode 454. The diffusion barrier layer 453 may be a conductive layer or it may be an electrically nonconductive layer. As nonlimiting examples, the layer 453 may be composed of any of a variety of materials, including but not limited to chromium, vanadium, tungsten, and glass, or compounds such as nitrides (including tantalum nitride, tungsten nitride, titanium nitride, silicon nitride, zirconium nitride, and/or hafnium nitride), oxides, carbides, and/or any single or multiple combination of the foregoing. Although not limited to the following, the thickness of this layer can range from 10 nm to 50 nm. In some embodiments, the layer may be from 10 nm to 30 nm. Optionally, an interfacial layer may be located above the electrode 454 and be comprised of a material such as including but not limited to chromium, vanadium, tungsten, and glass, or compounds such as nitrides (including tantalum nitride, tungsten nitride, titanium nitride, silicon nitride, zirconium nitride, and/or hafnium nitride), oxides, carbides, and/or any single or multiple combination of the foregoing.

The n-type semiconductor thin film 458 serves as a junction partner between the compound film and the transparent conducting layer 459. By way of example, the n-type semiconductor thin film 458 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Layers of these materials may be deposited, e.g., by chemical bath deposition (CBD) and/or chemical surface deposition (and/or related methods), to a thickness ranging from about 2 nm to about 1000 nm, more preferably from about 5 nm to about 500 nm, and most preferably from about 10 nm to about 300 nm. This may also be configured for use in a continuous roll-to-roll and/or segmented roll-to-roll and/or a batch mode system.

The transparent conductive layer 459 may be inorganic, e.g., a transparent conductive oxide (TCO) such as but not limited to indium tin oxide (ITO), fluorinated indium tin oxide, zinc oxide (ZnO) or aluminum doped zinc oxide, or a related material, which can be deposited using any of a variety of means including but not limited to sputtering, evaporation, chemical bath deposition (CBD), electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like or using any of various vapor deposition techniques. Optionally, it should be understood that intrinsic (non-conductive) i-ZnO or other intrinsic transparent oxide may be used between CdS and Al-doped ZnO. Combinations of inorganic and organic materials can also be used to form a hybrid transparent conductive layer. Thus, the layer 459 may optionally be an organic (polymeric or a mixed polymeric-molecular) or a hybrid (organic-inorganic) material. Examples of such a transparent conductive layer are described e.g., in commonly-assigned US Patent Application Publication Number 20040187317, which is incorporated herein by reference.

Those of skill in the art will be able to devise variations on the above embodiments that are within the scope of these teachings. For example, it is noted that in embodiments of the present invention, portions of the IB-IIIA precursor layers (or certain sub-layers of the precursor layers or other layers in the stack) may be deposited using techniques other than particle-based inks. For example precursor layers or constituent sub-layers may be deposited using any of a variety of alternative deposition techniques including but not limited to solution-deposition of spherical nanopowder-based inks, vapor deposition techniques such as ALD, evaporation, sputtering, CVD, PVD, electroplating and the like.

Figure 5A:
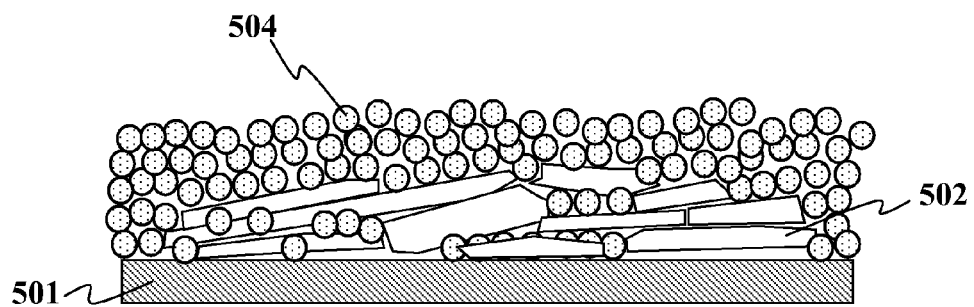
FIGS. 5A-5C show the formation of a semiconductor layer from a precursor layer comprised of spherical and non-spherical particles.

Referring now to FIG. 5A, it should also be understood that the embodiments of the present invention may also be used on a rigid substrate 600. By way of nonlimiting example, the rigid substrate 600 may be glass, soda-lime glass, steel, stainless steel, aluminum, polymer, ceramic, coated polymer, or other rigid material suitable for use as a solar cell or solar module substrate. A high speed pick-and-place robot 602 may be used to move rigid substrates 600 onto a processing area from a stack or other storage area. In FIG. 5A, the substrates 600 are placed on a conveyor belt which then moves them through the various processing chambers. Optionally, the substrates 600 may have already undergone some processing by the time and may already include a precursor layer on the substrate 600. Other embodiments of the invention may form the precursor layer as the substrate 600 passes through the chamber 606. Any of the foregoing may be adapted for use with a laser annealing system that selectively processes target layers over substrates. This may occur in one or more of the chambers through which the substrate 600 passes.

Figure 5B:
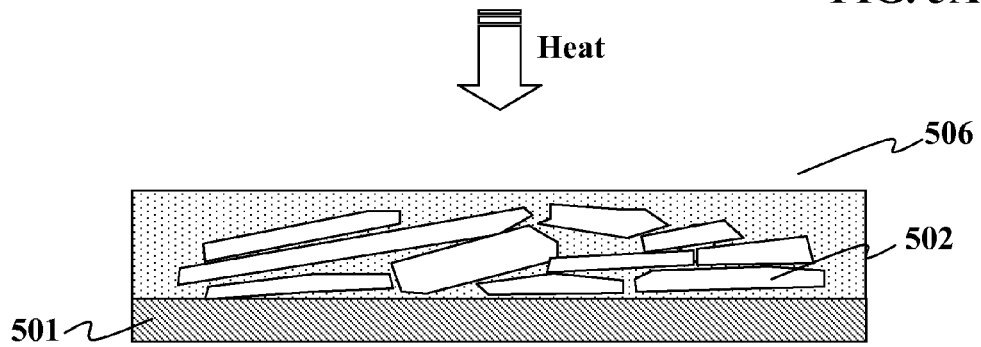
Figure 5C:
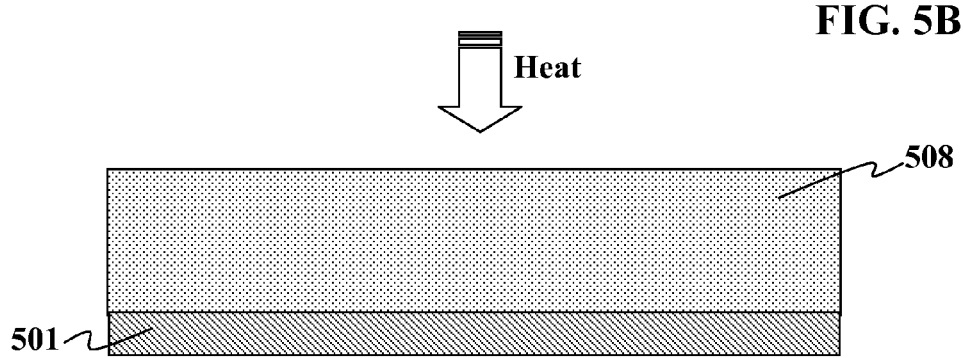

FIG. 5B shows another embodiment of the present system where a pick-and-place robot 610 is used to position a plurality of rigid substrates on a carrier device 612 which may then be moved to a processing area as indicated by arrow 614. This allows for multiple substrates 600 to be loaded before they are all moved together to undergo processing. Source 662 may provide a source of processing gas to provide a suitable atmosphere to create the desired semiconductor film. In one embodiment, chalcogen vapor may be provided by using a partially or fully enclosed chamber with a chalcogen source 662 therein or coupled to the chamber. Any of the foregoing may be adapted for use with a laser annealing system that selectively processes target layers over substrates.

Chalcogen Vapor Environment

Figure 7A:
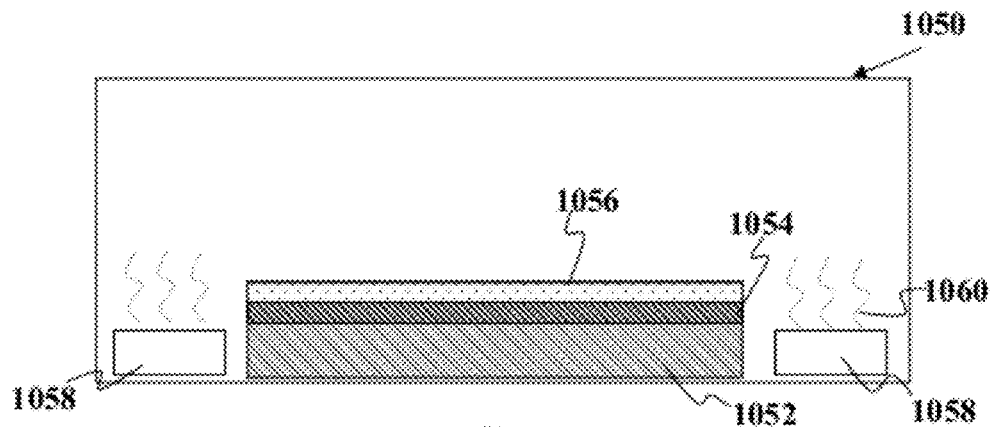
FIG. 7A shows a schematic of a system using a chalcogen vapor environment according to one embodiment of the present invention.
Figure 7B:
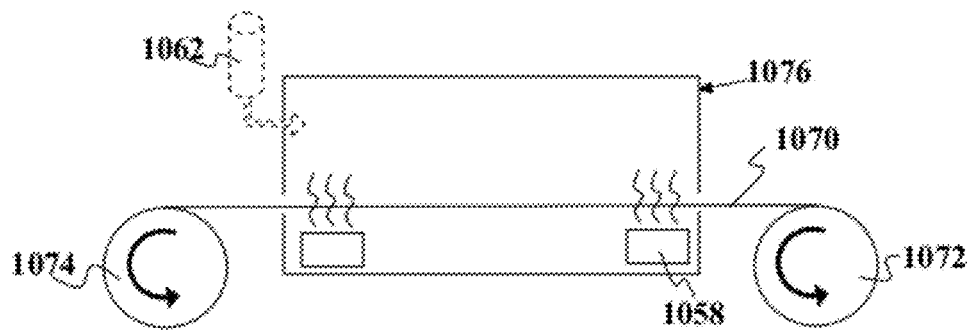
FIG. 7B shows a schematic of a system using a chalcogen vapor environment according to one embodiment of the present invention.
Figure 7C:
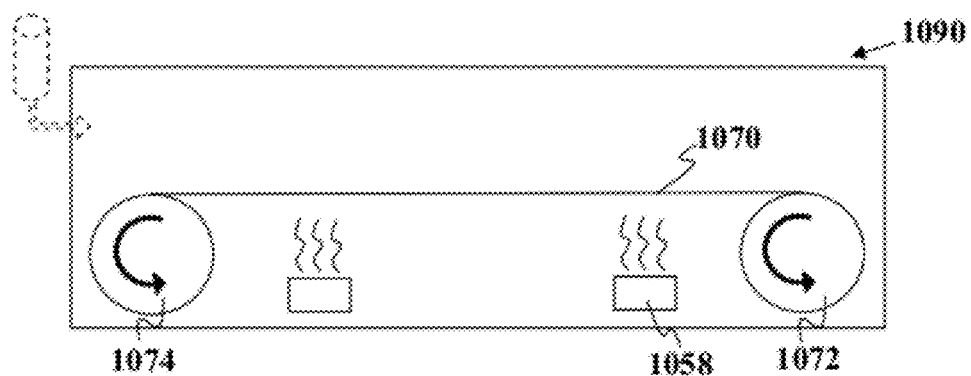
FIG. 7C shows a schematic of a system using a chalcogen vapor environment according to one embodiment of the present invention.

Yet another embodiment of the present invention will now be described. In this embodiment for use with a metal-ion based precursor material, it should be understood that a chalcogen vapor may be used to provide a chalcogen atmosphere to process a film into the desired absorber layer. Optionally, in one embodiment, an overpressure from chalcogen vapor is used to provide a chalcogen atmosphere. FIG. 7A shows a chamber 1050 with a substrate 1052 having a layer 1054 and a precursor layer 1056. Extra sources 1058 of chalcogen may be included in the chamber and are brought to a temperature to generate chalcogen vapor as indicated by lines 1060. In one embodiment of the present invention, the chalcogen vapor is provided to have a partial pressure of the chalcogen present in the atmosphere greater than or equal to the vapor pressure of chalcogen that would be required to maintain a partial chalcogen pressure at the processing temperature and processing pressure to minimize loss of chalcogen from the precursor layer, and if desired, provide the precursor layer with additional chalcogen. The partial pressure is determined in part on the temperature that the chamber 1050 or the precursor layer 1056 is at. It should also be understood that the chalcogen vapor is used in the chamber 1050 at a non-vacuum pressure. In one embodiment, the pressure in the chamber is at about atmospheric pressure. Per the ideal gas law PV=nRT, it should be understood that the temperature influences the vapor pressure. In one embodiment, this chalcogen vapor may be provided by using a partially or fully enclosed chamber with a chalcogen source 1062 therein or coupled to the chamber. In another embodiment using a more open chamber, the chalcogen overpressure may be provided by supplying a source producing a chalcogen vapor. The chalcogen vapor may serve to help keep the chalcogen in the film. Thus, the chalcogen vapor may or may not be used to provide excess chalcogen. It may serve more to keep the chalcogen present in the film than to provide more chalcogen into the film.

In yet another embodiment, it is shown that the present invention may be adopted for use with a roll-to-roll system where the substrate 1070 carrying the precursor layer may be flexible and configured as rolls 1072 and 1074. The chamber 1076 may be at vacuum or non-vacuum pressures. The chamber 1076 may be designed to incorporate a differential valve design to minimize the loss of chalcogen vapor at the chamber entry and chamber exit points of the roll-to-roll substrate 1070.

In a still further embodiment of the present invention, the system uses a chamber 1090 of sufficient size to hold the entire substrate, including any rolls 1072 or 1074 associated with using a roll-to-roll configuration.

Extra Source of Chalcogen

It should be understood that the present invention using metal ion precursors or hydroxides may also use an extra chalcogen source in a manner similar to that described in copending, U.S. patent application Ser. No. 11/290,633, wherein the precursor material contains the previous materials and 1) chalcogenides such as, but not limited to, copper selenide, and/or indium selenide and/or gallium selenide and/or 2) a source of extra chalcogen such as, but not limited to, Se or S nanoparticles less than about 200 nanometers in size. In one nonlimiting example, the chalcogenide and/or the extra chalcogen may be in the form of microflakes and/or nanoflakes while the extra source of chalcogen may be flakes and/or non-flakes. The chalcogenide microflakes may be one or more binary alloy chalcogenides such as, but not limited to, group IB-binary chalcogenide nanoparticles (e.g. group IB non-oxide chalcogenides, such as Cu—Se, Cu—S or Cu—Te) and/or group IIIA-chalcogenide nanoparticles (e.g., group IIIA non-oxide chalcogenides, such as Ga(Se,S,Te), In(Se,S,Te) and Al(Se,S,Te). In other embodiments, the microflakes may be non-chalcogenides such as but not limited to group IB and/or IIIA materials like Cu—In, Cu—Ga, and/or In—Ga. If the chalcogen melts at a relatively low temperature (e.g., 220° C. for Se, 120° C. for S) the chalcogen is already in a liquid state and makes good contact with the microflakes. If the microflakes and chalcogen are then heated sufficiently (e.g., at about 375° C.), the chalcogen reacts with the chalcogenides to form the desired IB-IIIA-chalcogenide material.

Although not limited to the following, the chalcogenide particles may be obtained starting from a binary chalcogenide feedstock material, e.g., micron size particles or larger. Examples of chalcogenide materials available commercially are listed below in Table I.

TABLE I

| Chemical | Formula | Typical % Purity |
| --- | --- | --- |
| Aluminum selenide | Al2Se3 | 99.5 |
| Aluminum sulfide | Al2S3 | 98 |
| Aluminum sulfide | Al2S3 | 99.9 |
| Aluminum telluride | Al2Te3 | 99.5 |
| Copper selenide | Cu—Se | 99.5 |
| Copper selenide | Cu2Se | 99.5 |
| Gallium selenide | Ga2Se3 | 99.999 |
| Copper sulfide | Cu2S(may be Cu1.8—2S) | 99.5 |
| Copper sulfide | CuS | 99.5 |
| Copper sulfide | CuS | 99.99 |
| Copper telluride | CuTe(generally Cu1.4Te) | 99.5 |
| Copper telluride | Cu2Te | 99.5 |
| Gallium sulfide | Ga2S3 | 99.95 |
| Gallium sulfide | GaS | 99.95 |
| Gallium telluride | GaTe | 99.999 |
| Gallium telluride | Ga2Te3 | 99.999 |
| Indium selenide | In2Se3 | 99.999 |
| Indium selenide | In2Se3 | 99.99% |
| Indium selenide | In2Se3 | 99.9 |
| Indium selenide | In2Se3 | 99.9 |
| Indium sulfide | InS | 99.999 |
| Indium sulfide | In2S3 | 99.99 |
| Indium telluride | In2Te3 | 99.999 |
| Indium telluride | In2Te3 | 99.999 |

Examples of chalcogen powders and other feedstocks commercially available are listed in Table II below.

TABLE II

| Chemical | Formula | Typical % Purity |
| --- | --- | --- |
| Selenium metal | Se | 99.99 |
| Selenium metal | Se | 99.6 |
| Selenium metal | Se | 99.6 |
| Selenium metal | Se | 99.999 |
| Selenium metal | Se | 99.999 |
| Sulfur | S | 99.999 |
| Tellurium metal | Te | 99.95 |
| Tellurium metal | Te | 99.5 |
| Tellurium metal | Te | 99.5 |
| Tellurium metal | Te | 99.9999 |
| Tellurium metal | Te | 99.99 |
| Tellurium metal | Te | 99.999 |
| Tellurium metal | Te | 99.999 |
| Tellurium metal | Te | 99.95 |
| Tellurium metal | Te | 99.5 |

Printing A Layer of the Extra Source of Chalcogen

Referring now to FIG. 1C, another embodiment of the present invention will now be described. An extra source of chalcogen may be provided as a discrete layer 107 containing an extra source of chalcogen such as, but not limited to, elemental chalcogen particles over a microflake or non-flake precursor layer. By way of example, and without loss of generality, the chalcogen particles may be particles of selenium, sulfur or tellurium. Heat is applied to the precursor layer and the layer 107 containing the chalcogen particles to heat them to a temperature sufficient to melt the chalcogen particles and to react the chalcogen particles with the elements in the precursor layer 106. It should be understood that the microflakes may be made of a variety of materials include but not limited to group IB elements, group IIIA elements, and/or group VIA elements. The reaction of the chalcogen particles 107 with the elements of the precursor layer 106 forms a compound film 110 of a group IB-IIIA-chalcogenide compound. Preferably, the group IB-IIIA-chalcogenide compound is of the form $(Ag,Au,Cu)In_{1-x}Ga_xSe_{2(1-y)}S_{2y}$, where $0 \leq x \leq 1$ and $0 \leq y \leq 1$. In some embodiments, the Ag or Au is 5-15 at % of the group IB elements. It should be understood that in some embodiments, the precursor layer 106 may be densified prior to application of the layer 107 with the extra source of chalcogen. In other embodiments, the precursor layer 106 is not pre-heated and the layers 106 and 107 are heated together.

In one embodiment of the present invention, the precursor layer 106 may be between about 4.0 to about 0.5 microns thick. The layer 107 containing chalcogen particles may have a thickness in the range of about 4.0 microns to about 0.5 microns. The chalcogen particles in the layer 107 may be between about 1 nanometer and about 25 microns in size, preferably between about 25 nanometers and about 300 nanometers in size. It is noted that the chalcogen particles may be initially larger than the final thickness of the IB-IIIA-VIA compound film 110. The chalcogen particles 108 may be mixed with solvents, carriers, dispersants etc. to prepare an ink or a paste that is suitable for wet deposition over the precursor layer 106 to form the layer. Alternatively, the chalcogen particles may be prepared for deposition on a substrate through dry processes to form the layer 107. It is also noted that the heating of the layer 107 containing chalcogen particles may be carried out by an RTA process, e.g., as described above.

The chalcogen particles (e.g., Se or S) may be formed in several different ways. They may be formed by grinding, milling, electroexplosive wire (EEW) processing, evaporation condensation (EC), pulsed plasma processing, or combinations thereof. The particles may be formed using at least one of the following methods: sonification, agitation, electromagnetically mixing of a liquid metal or liquid alloy. The particles may be formed using at least one of the following methods: spray-pyrolysis, laser pyrolysis, or a bottom-up technique like wet chemical approaches.

Figure 9A:
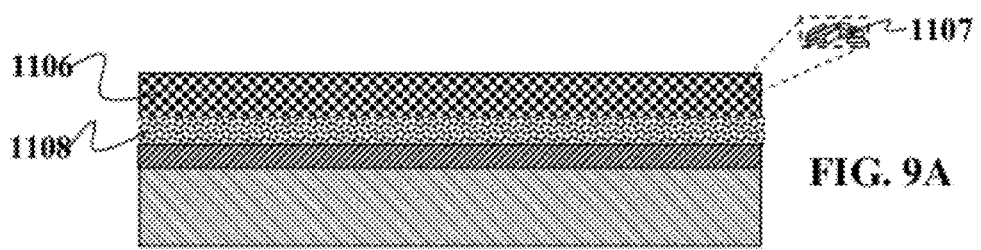
FIGS. 9A-9B shows side cross-sectional views of material for use in forming solar cells according to embodiments of the present invention.

As seen in FIG. 9A, it should also be understood that in some embodiments, the layer 1108 of chalcogen particles may be formed below the precursor layer 1106. This position of the layer 1108 still allows the chalcogen particles to provide a sufficient surplus of chalcogen to the precursor layer 1106 to fully react with the group IB and group IIIA elements in layer 1106. Additionally, since the chalcogen released from the layer 1108 may be rising through the layer 1106, this position of the layer 1108 below layer 1106 may be beneficial to generate greater intermixing between elements. The thickness of the layer 1108 may be in the range of about 4.0 microns to about 0.5 microns. In still other embodiments, the thickness of layer 1108 may be in the range of about 500 nm to about 50 nm. In one nonlimiting example, a separate Se layer of about 100 nm or more might be sufficient. The coating of chalcogen may incorporate coating with powder, Se evaporation, or other Se deposition method such as but not limited to chemical vapor deposition (CVD), physical vapor deposition (PVD), atomic layer deposition (ALD), electroplating, and/or similar or related methods using singly or in combination. Other types of material deposition technology may be used to get Se layers thinner than 0.5 microns or thinner than 1.0 micron. It should also be understood that in some embodiments, the extra source of chalcogen is not limited to only elemental chalcogen, but in some embodiments, may be an alloy and/or solution of one or more chalcogens.

Optionally, it should be understood that the extra source of chalcogen may be mixed with and/or deposited within the precursor layer, instead of as a discrete layer. In one embodiment of the present invention, oxygen-free particles or substantially oxygen-free particles of chalcogen could be used. If the chalcogen is used with microflakes and/or plate shaped precursor materials, densification might not end up an issue due to the higher density achieved by using planar particles, so there is no reason to exclude printing Se and/or other source of chalcogen within the precursor layer as opposed to a discrete layer. This may involve not having to heat the precursor layer to the previous processing temperatures. In some embodiments, this may involve forming the film without heating above 400° C. In some embodiments, this may involve not having to heat above about 300° C.

In still other embodiments of the present invention, multiple layers of material may be printed and reacted with chalcogen before deposition of the next layer. One nonlimiting example would be to deposit a Cu—In—Ga layer, anneal it, then deposit an Se layer then treat that with RTA, follow that up by depositing another precursor layer rich in Ga, followed by another deposition of Se, and finished by a second RTA treatment. More generically, this may include forming a precursor layer (either heat or not) then coating a layer of the extra source of chalcogen (then heat or not) then form another layer of more precursor (heat or not) and then for another layer of the extra source of chalcogen (then heat or not) and repeat as many times as desired to grade the composition or nucleating desired crystal sizes. In one nonlimiting example, this may be used to grade the gallium concentration. In another embodiment, this may be used to grade the copper concentration. In yet another embodiment, this may be used to grade the indium concentration. In a still further embodiment, this may be used to grade the selenium concentration. In yet another embodiment this may be used to grade the selenium concentration. Another reason would be to first grow copper rich films to get big crystals and then to start adding copper-poor layers to get the stoichiometry back. Of course this embodiment can combined to allow the chalcogen to be deposited in the precursor layer for any of the steps involved.

Figure 9B:

FIG. 9B shows core-shell microflakes in which the core is a microflake 1107 and the shell 1120 is a chalcogen and/or chalcogenide coating. Up to 10% to 8% by weight of the particle may be oxygen. Up to 8% to 6% by weight of the particle may be oxygen. In some embodiments, the shell is an oxide shell that is the same or different from the material in the core. This oxygen may be concentrated in the shell. Optionally, it may be dispersed through the particle. Optionally, it may be in both the shell and through out the particle. As a nonlimiting example, the core may be a mix of elemental particles of groups IB (e.g., Cu) and/or MA (e.g., Ga and In), which may be obtained by size reducing of feedstock to a desired size. Examples of elemental feedstock materials available are listed in Table III below. The core may also be a chalcogenide core or other material as described herein.

TABLE III

| Chemical | Formula | Typical % Purity |
| --- | --- | --- |
| Copper metal | Cu | 99.99 |
| Copper metal | Cu | 99 |
| Copper metal | Cu | 99.5 |
| Copper metal | Cu | 99.5 |
| Copper metal | Cu | 99 |
| Copper metal | Cu | 99.999 |
| Copper metal | Cu | 99.999 |

TABLE III-continued

| Chemical | Formula | Typical % Purity |
| --- | --- | --- |
| Copper metal | Cu | 99.9 |
| Copper metal | Cu | 99.5 |
| Copper metal | Cu | 99.9 (O₂ typ. 2-10%) |
| Copper metal | Cu | 99.99 |
| Copper metal | Cu | 99.997 |
| Copper metal | Cu | 99.99 |
| Gallium metal | Ga | 99.999999 |
| Gallium metal | Ga | 99.99999 |
| Gallium metal | Ga | 99.99 |
| Gallium metal | Ga | 99.9999 |
| Gallium metal | Ga | 99.999 |
| Indium metal | In | 99.9999 |
| Indium metal | In | 99.999 |
| Indium metal | In | 99.999 |
| Indium metal | In | 99.99 |
| Indium metal | In | 99.999 |
| Indium metal | In | 99.99 |
| Indium metal | In | 99.99 |

Low-cost (Cu,Ag)(Ga,In)(S,Se)$_2$ Solar Cells

One problem encountered when creating CIG(S)Se films for solar cells using low cost two (or more) step selenization methods is preventing Ga from segregating to the back of the film. Two-step selenization methods entail one step where a metal, oxide, or chalcogenide (or other Ag, Cu, In, Ga, S, or Se containing compounds) precursor film is deposited, and then subsequently selenized (and/or sulfidized) in a second step. The approach described herein is to create the senary compound (Cu,Ag)(Ga,In)(S,Se)$_2$ (hereafter referred to as CuAgGaInSSe) by adding Ag to the precursor film and selenizing and sulfidizing or vice versa. This can also be performed simultaneously and/or sequentially. It has been found that this enables more of the Ga to remain forward in the film. Ga at the front surface of the film allows for higher open-circuit voltage solar cells and therefore higher efficiencies. Furthermore, the addition of sulfur is important, since it aids in the incorporation of Ag into the compound (more uniformly).

It was known that others have produced ACIGS materials and solar cells with reasonable quality. Sulfur was added in the present embodiment since sulfur further improves the Voc of CIGS solar cells. One saw not only an improvement in $V_{oc}$ but also surprisingly unexpected gains efficiency and fill factor (compared with (Cu,Ag)(Ga,In)Se2 hereafter referred to as CuAgGaInSe).

The reaction thermodynamics and kinetics of 2-step selenization approaches for Cu(In,Ga)Se2 from metallic precursors favor the reaction of Cu and In with selenium, before Ga reacts with selenium. This causes Ga to be pushed to the back of the film. There are some advantages to having some Ga at the back, such as the formation of a back surface field. However, having some Ga at the surface is beneficial to solar cell performance because Ga raises the bandgap of CIG(S)Se, and the bandgap at the front of the film greatly influences the open-circuit voltage of the solar cell.

When selenizing metallic (or oxide, or chalcogenide, or other Cu, In, Ga, S, or Se containing compounds) precursor films, it is difficult to keep the Ga from segregating to the back of the film. The addition of a chalcogenization rate modifier such as Ag and/or Au can result in less Ga segregation in depth. Two possible mechanisms are that 1) Ag slows down the reaction responsible for the Ga segregation since Ag is a more noble metal, or 2) Ag speeds up the reaction of a Ga-containing intermediate product which then keeps the Ga from segregating to the back of the finished ACIGS film.

More surprisingly, the addition of sulfur to form the senary compound CuAgGaInSSe results in an improved $V_{oc}$, fillfactor and efficiency, possibly indicating that the uniformity and material quality was improved by adding sulfur.

In this embodiment, we used low cost, high throughput processing methods to create CuAgGaInSSe, including nanoparticle printing of precursor materials on an inexpensive flexible metal substrate followed by a rapid thermal process to form the large grain high quality CuAgGaInSSe material. The product was the senary CuAgGaInSSe compound with higher minimum bandgaps than were produced using similar processing for CIGS (without Ag) or for the quinary CuAgGaInSe compound (without sulfur), and higher efficiency solar cells than could be produced with the quinary CuAgGaInSe (without sulfur).

Data is included in an attached document for two experiments where the senary CuAgGaInSSe outperformed the quinary CuAgGaInSe, if the correct amount of sulfur was added. In one case elemental Ag was added to our precursor ink which yielded CuAgGaInSe solar cells with a baseline % median efficiency ("baseline") and baseline+2% maximum conversion efficiency. For this experiment the sulfur was added during the selenization and sulfidation step using an evaporation source, and the amount of S was tuned by changing the temperature of the evaporation boat. When the S source temperature was increased to ~230 C, the median efficiency came up to ~baseline+4%, and the maximum efficiency was also ~baseline+4% conversion efficiency (the uniformity of the cells improved greatly). Some embodiments may use sulfur at even higher temperatures. It should be understood that addition of sulfur can be at the target temperature described or by other additive techniques such as but not limited to: evaporation, co-evaporation, thermal evaporation, CVD, ALD, bath deposition, deposition by gas, vacuum, or vapor phase techniques (vacuum evaporation, sputtering, vapor transport, etc.) of the constituent elements either in sequence or the simultaneous deposition of two or more elements, or any combination thereof; deposition of any combination of single or multiple phases of the constituent elements or compounds or alloys of two or more of the constituent elements, deposition from suspension in solvent followed by coating and drying, onto the substrate in either inert or Se- or S-containing atmosphere.

Thus, in this above embodiment, the addition of sulfur to the silver precursor surprisingly increased efficiency by 4% and 2% respectively.

In a second experiment outlined in the attached document the silver was added to the precursor ink using a Ag—In alloy. In this experiment the CuAgGaInSe solar cells had ~baseline+3% median efficiency and over baseline+4% maximum efficiency. However, when the S source temperature was increased to ~230 C with this particle system, the median efficiency came up to ~baseline+4% conversion efficiency, and the maximum efficiency was above ~baseline+5%. Some embodiments may use sulfur at even higher temperatures than 230 C. Some embodiments may use sulfur at even higher temperatures than 220 C. Some embodiments may use sulfur at even higher temperatures than 210 C. Some embodiments may use sulfur at even higher temperatures than 200 C. It should be understood that addition of sulfur can be at the target temperature described or by other additive techniques such as but not limited to vapor, coating, vacuum deposition, or the like as described above. Some embodiments may use a single inline RTP furnace with multiple process zones to include different process gases (such as S, Se, or the like) in each zone. Some embodiments may use more than one process gas in each zone. Some embodiments may use a single inline RTP furnace with multiple process stages to include different process gases (such as S, Se, or the like) in each stage. Some embodiments may use more than one process gas in each stage. The sulfur may be heated outside of the furnace and the process gas carried by itself or carrier gas into the process zone.

Thus, in this above embodiment, the addition of sulfur to the silver precursor surprisingly increased efficiency by 1% and 1% respectively.

A possible mechanism that could explain why the addition of sulfur to form senary CuAgGaInSSe creates better solar cells than quinary CuAgGaInSe (without S), is that possibly the materials quality is improved due to the fact that silver readily reacts with S. This could help the Ag to incorporate more uniformly into the $Cu(In,Ga)(S,Se)_2$ structure. By way of example, the reaction of silver with sulfur compounds in the air (e.g. $H_2S$) is the mechanism by which silver tarnishes.

Absorbers with Non-Toxic Materials

It should be understood that in the foregoing, though described in the context of group IB-IIIA-VIA absorber layers, the inventions therein are also applicable to absorbers formed from other nanoparticles. By way of example, there are a few classes of compounds that are composed of abundant non-toxic materials and have great promise for cost effective thin film solar cells such as IB-IIB-IVA-VIA absorbers. For any of the embodiments herein, it is also possible to have two or more elements of IB elements in the chalcogenide particle and/or the resulting intermediate film and/or final absorber layer.

Examples of such classes are metal-sulfides (e.g. $FeS_2$, $NiS_2$, SnS, ZnS, etc.), metal-selenides (e.g. $FeSe_2$, $Ni_3Se_2$, $SnSe_2$, etc.), metal-oxides (e.g. $Fe_2O_3$, Co—Fe—Al-oxides, etc.), and I2-II-IV-VI4 compounds (e.g. $Cu_2ZnGeSe_4$, $Cu_2ZnSnS_4$, $Cu_2ZnSnSe_4$, $Cu_2ZnSiSe_4$, etc.). Optionally, (Ag, Au, Cu)—Zn—Sn—S—Se may be the absorber layer. Any of the group VIA vapor techniques may be used. This may be used for selenization or sulfidation of a group I2-II-IV precursor layer. The vapor may be at atmospheric, below atmospheric, or above atmospheric pressure. The following embodiments may be used on wide web metal or other flexible substrates. Some embodiments may be 1 meter wide or more. Optionally, another embodiment may be up to 2 meter wide or more. Optionally, another embodiment use be up to 3 meters wide or more. These wide webs are applicable to any of the embodiments herein.

To create cost-effective thin film solar cells, it is desirable that the component materials be low cost (abundant and non-toxic), but the processing techniques used to deposit the films need to be low cost as well. The aforementioned groups of materials can be deposited by various high-cost and energy intensive techniques (such as sputtering, CVD, and vacuum evaporation), however, these particular materials classes also lend themselves to inexpensive solution based deposition techniques (such as densification of a nanoparticulate precursor ink, electrodeposition, chemical bath deposition, and spray pyrolysis). These solution based processes could utilize many types of precursors (elemental, salts, oxides, etc.), and can be used either to produce semiconductor crystals directly (in one step), or to form metallic precursor layers which are subsequently crystallized via reactive post-treatments (using sulfur, selenium, oxygen, etc.).

For a thin film solar cell to cost-effectively generate electrical power, not only does it need to be inexpensive to fabricate, but have reasonably high power conversion efficiency as well. The materials comprising high efficiency thin film solar cells exhibit several key properties; the bandgap of the absorber must be matched to the solar spectrum and the bandgap of a window (or heterojunction partner) needs to be wider, the absorber must strongly absorb sunlight, and all materials must have good electrical properties (such as moderate doping densities, high free-carrier mobilities and long free-carrier lifetimes). The aforementioned groups of materials contain members exhibiting all of these materials properties, and, since they are also composed of inexpensive elements and are suitable for low-cost (solution based) processing, these classes of materials are excellent choices for cost-effective thin film solar cells. The following are fully incorporated herein by reference for all purposes. 1. http://www.webelements.com 2. Björn A. Andersson, "Materials availability for large-scale thin-film photovoltaics", Progress in Photovoltaics: Research and Applications, 8(1), p. 61-76 (2000).

A variety of paths may be used to form the desired IB-IIB-IVA-VIA absorber material. Any of the following particles in the examples below may use the nanoflake, microflake, or other shaped particle as described herein. Optionally, they may be deposited by electrodeposition, electrobath, sputtering, evaporation, chemical bath deposition (CBD), electroplating, sol-gel based coating, spray coating, chemical vapor deposition (CVD), physical vapor deposition (PVD), atomic layer deposition (ALD), spray pyrolysis, liquid melt, and/or the like.

Note that the method may be optimized by using, prior to, during, or after the solution deposition and/or densification of one or more of the precursor layers, any combination of (1) any chalcogen source that can be solution-deposited, e.g. a Se or S nanopowder mixed into the precursor layers or deposited as a separate layer, (2) chalcogen (e.g., Se or S) evaporation, (3) an $H_2Se$ (H2S) atmosphere, (4) a chalcogen (e.g., Se or S) atmosphere, (5), an organo-selenium containing atmosphere, e.g. diethylselenide (6) an $H_2$ atmosphere, (7) another reducing atmosphere, e.g. CO, (8) a wet chemical reduction step, (9) use of a plasma, and a (10) heat treatment.

Optionally, any combination of number of deposition and heating steps, RTP steps, heating in reducing atmosphere, any combination of different techniques to deposit materials (sequentially or simultaneously), any size and shape of particles, any wet deposition technique (various coating, spraying, and printing techniques), any method to remove dispersant, any type of substrate (rigid and/or flexible), or any interconnect scheme (monolithic integration, MWT, etc.) may be used with the present absorber layer.

1. Quaternary IB-IIB-IVA-VIA Nanoparticles

According to one set of embodiments of the present invention, quaternary nanoparticles (e.g., quantum dots or quantum rods) for making a IB-IIB-IVA-VIA ink may be fabricated by several different approaches. Some embodiments may use non-oxide versions of the above nanoparticles.

2. Ternary IB-IIB-IVA Nanoparticles

According to one set of embodiments of the present invention, ternary nanoparticles (e.g., quantum dots or quantum rods) for making a IB-IIB-IVA ink may be fabricated by several different approaches. Optionally, IB-IIB-VIA, IB-IVA-VIA, or IIB-IVA-VIA may be manufactured. Some embodiments may use non-oxide versions of the above nanoparticles.

a). Preparation From Single-Source Precursors
b). Preparation using Spray Co-precipitation
c) Preparation using a Volatile Capping Agent 3. Production of Binary Nanoparticles According to one set of embodiments of the present invention, binary nanoparticles (e.g., quantum dots or quantum rods) for making a IB-IIB ink may be fabricated by several different approaches. Optionally, IIB-VIA, IB-IVA, IVA- VIA, or IB-VIA may be manufactured. Some embodiments may use non-oxide versions of the above nanoparticles.
a) Nanoparticles Prepared in Volatile Solvent
b). Sonochemical Synthesis of Binary Quantum Nanoparticles 4. Intermetallics of the Binary Nanoparticles According to one set of embodiments of the present invention, binary nanoparticles (e.g., quantum dots or quantum rods) for making a IB-IIB ink may be fabricated by several different approaches. Optionally, IB-VIA, IB-IVA, IVA-VIA, or IB-VIA may be manufactured. These binary nanoparticles are selected from the intermetallic regions of their phase diagrams.

Of course, other embodiments may use elemental metal nanoparticles of the foregoing with Se(S) Vapor or Powders. Some embodiments may use metal Halides Dissolved in Chelating Agents such as that described in U.S. application Ser. No. 10/782,017 fully incorporated herein by reference for all purposes. Others may use metal salts as described in manners similar to that in U.S. application Ser. No. 10/782,017. Stoichiometric balance (50% of each, within a certain range) may also be used for particles of group IIB-IVA alloy, or IIB elemental, or IVA elemental particles. These may be selected to approximately replace a group IIIA material in a group IB-IIB-IVA-VIA absorber layer.

It should also be understood that the diffusion barrier layers as described in U.S. Patent Application 60/909,357 filed Mar. 30, 2007, fully incorporated herein for all purposes, may also be included herein to minimize corruption of the precursor layer during processing at elevated temperatures.

It should also be understood that the group VIA tools described in U.S. Application 61/012,020 may be used for sulfidation, selenization, or other group VIA processing for any group IB-IIB-IVA-VIA or IB-IIB-IVA precursor. Some may require additional group VIA material or chalcogen rich chalcogenide material as described in U.S. application Ser. Nos. 11/395,426, 11/290,633, 11/361,522, and/or 11/361,515, each fully incorporated herein by reference for all purposes. The group IB-IIB-IVA precursor would replace any IB-IIIA precursors in those applications. Optionally, IB-IIB-IVA-VIA would replace IB-IIIA-VIA precursors in those applications. Optionally, IB-IIB or IB-IVA would replace any IB-IIIA precursor. Some may use IIB-IVA to replace any IIIA-IIIA precursor used in the incorporated applications.

It should be understood that other absorber layer materials may also be used. For any of the embodiments herein, it is also possible to have two or more elements of IB elements in the chalcogenide particle and/or the resulting intermediate film and/or final absorber layer.

Indium Replacement Materials (Absorbers):

| | | | |
|---|---|---|---|
| Cu2ZnSiTe4 | Eg = 1.47 eV | | |
| Cu2ZnGeSe4 | Eg = 1.63 eV | | |
| Cu2ZnSnS4 | Eg = 1.39 eV | CdS/CZTS | 5.5% PCE or higher |
| Cu2ZnSnSe4 | Eg = 1.44 eV | | |
| Cu2ZnSnS4 | Eg = ??? | | |
| Cu2CdGeSe4 | Eg = 1.20 eV | | |
| Cu2CdSnS4 | Eg = 1.37 eV | | |
| Cu2CdSnSe4 | Eg = 0.96 eV | | |

Many binary, ternary and quaternary Metal Sulfides and Selenides
Some binary, ternary and quaternary Metal Oxides (tend to be wider bandgap materials)
Optionally, the material used for a window layer or junction partner material may also be replaced with one or more of the following:

Cadmium Replacement Materials (Windows/Junction Partners):

| | | | |
|---|---|---|---|
| ZnS | Eg = 3.6 eV | ZnS/CIGS | 18.6% PCE |
| In(OH)3 | Eg = | In(OH)3/CIGS | 14% |
| In2S3 | Eg = | In2S3/CIGS | 16.4% |
| ZnSe | Eg = | ZnSe/CIGS | 15.7% |
| ZnInSe | Eg = | ZnInSe | 15.3% |
| InSe | Eg = | InSe/CIGS | 13.0% |
| ZnMgO | Eg = | ZnMgO/CIGS | 16.2% |
| ZnO | Eg = | ZnO/CIGS | 15.0% |
| SnO2 | Eg = | SnO2 | 12.2% |
| Cu2ZnSiS4 | Eg = 3.25 eV | | |
| Cu2ZnSiSe4 | Eg = 2.33 eV | | |
| Cu2ZnGeS4 | Eg = 2.10 eV | | |

Many binary, ternary and quaternary Metal Sulfides, Selenides and Oxides

In one embodiment, metal ratios necessary for a CZTS solar cell precursor foil may be (Cu, Ag, Au: 50 at.-%, Zn: 25 at.-%, Sn: 25 at.-%)

Optionally, a further object of the invention is to provide a thin film of CZTS $((Au,Ag,Cu)_2ZnSnS_4)$ and related compounds like $(Au,Ag,Cu)_xZn_ySn_zCh1_aCh2_b$.

A still further object of the present invention is to provide precursors of these chalcogenides, i.e., more specifically, $(Au,Ag,Cu)_xZn_ySn_z$ in foil form. In this manner, the desired stoichiometry is fixed in the bulk material.

Thus, more specifically, an object of the present invention is also to provide a method of forming $(Au,Ag,Cu)_xZn_ySn_z$, $(Au,Ag,Cu)_xZn_ySn_zS_a$ (ACZTS), $(Au,Ag,Cu)_xZn_ySn_zSe_b$ (ACZTSe) or $(Au,Ag,Cu)_xZn_ySn_2S_aSe_b$ (ACZTSSe) layers with well-defined total bulk stoichiometries, wherein x ranges from 1.5 to 2.5, y ranges from 0.9 to 1.5, z ranges from 0.5 to 1.1, a ranges from 0 to 4.2, preferably from 0.1 to 4.2, and b ranges from 0 to 4.2, preferably from 0.1 to 4.2, and which method is easy to apply and suitable for large scale production of thin film solar cells.

As used herein after and in the claims, the term "copper-zinc-tin alloy" denotes an alloy comprising the indicated elements and optionally additionally at least one chalcogen. Such alloy comprising at least one chalcogen may, if chalcogen is sulfur which is comprised in the alloy $((Au,Ag,Cu)_2ZnSnS_4)$, be present in the stannite type structure (kesterite).

A copper-zinc-tin alloy substrate may be provided. More specifically a $(Au,Ag,Cu)_xZn_ySn_z$ alloy $(1.5<x<2.5; 0.9<y<1.5; 0.5<z<1.1)$, is used for depositing this alloy into a suitable electrically conductive substrate.

Optionally, the copper-zinc-tin alloy is a $(Au,Ag,Cu)_xZn_ySn_zCh1_aCh2_b$ alloy, with Ch1 being a first chalcogen, Ch2 being a second chalcogen and wherein x is from 1.5 to 2.5, y is from 0.9 to 1.5, z is from 0.5 to 1.1, a is from 0 to 4.2 and b is from 0 to 4.2.

Optionally, the copper, zinc and tin species are comprised in the composition at a molar ratio of (Au,Ag,Cu):zinc:tin=1: 0.1-10:0.1-4, more specifically 2-8:0.4-1.

In a further preferred embodiment of the present invention, the copper-zinc-tin alloy comprises Ch1, wherein Ch1 may be sulfur. Thus, when a>0, Ch1 is S and at least one chalcogen plating species is a sulfur plating species (sulfur source: (Au,Ag,Cu)$_x$Zn$_y$Sn$_z$S$_a$ or (Au,Ag,Cu)$_x$Zn$_y$Sn$_z$S$_a$Se$_b$: 1.5<x<2.5; 0.9<y<1.5; 0.5<z<1.1; 0.1<a<4.2; 0<b<4.2).

In a further preferred embodiment of the present invention, when b>0, Ch2 is Se and at least one chalcogen plating species is a selenium plating species (selenium source: (Au,Ag,Cu)$_x$Zn$_y$Sn$_z$Se$_b$ or (Au,Ag,Cu)$_x$Zn$_y$Sn$_z$S$_a$Se$_b$: 1.5<x<2.5; 0.9<y<1.5; 0.5<z<1.1; 0<a<4.2; 0.1<b<4.2). Said selenium species is selected from the group comprising selenates, selenosulfites, diselenides and polyselenides. By using this selenium source, selenium is incorporated into the deposited alloy layer to form $(Au,Ag,Cu)_xZn_ySn_zSe_b$, with x being from 1.5 to 2.5, y being from 0.9 to 1.5, z being from 0.5 to 1.1 and b being from 0.1 to 4.2.

In a further preferred embodiment of the present invention, the copper-zinc-tin alloy comprises both Ch1 and Ch2, wherein Ch1 may be sulfur and Ch2 may be selenium. In such case the copper-zinc-tin alloy may be $(Au,Ag,Cu)_xZn_ySn_zS_aSe_b$ with x, y, z being as before and a and b being each from 0 to 4.2.

More specifically, the bath additionally may contain a mixture of the sulfur and selenium sources to deposit layers which contain sulfur as well as selenium in order to form layers of $(Au,Ag,Cu)_xZn_ySn_zS_aSe_b$ ($1.5<x<2.5$; $0.9<y<1.5$; $0.5<z<1.1$; $0.1<a<4.2$; $0.1<b<4.2$).

By using the sulfur and the selenium sources, sulfur and selenium is are incorporated into the foil to form $(Au,Ag,Cu)_xZn_ySn_zS_aSe_b$, with x being from 1.5 to 2.5, y being from 0.9 to 1.5, z being from 0.5 to 1.1, a being from 0.1 to 4.2 and b being from 0.1 to 4.2. The depth of the conversion of the foil may be less than 5 microns, optionally 2 microns or less on any surface of the precursor foil.

Further, the method according to the second aspect of the invention comprises depositing a copper-zinc-tin alloy, said alloy optionally additionally containing at least one chalcogen, more specifically a $(Au,Ag,Cu)_xZn_ySn_z$ alloy ($1.5<x<2.5$; $0.9<y<1.5$; $0.5<z<1.1$), a $(Au,Ag,Cu)_xZn_ySn_zS_a$ alloy ($1.5<x<2.5$; $0.9<y<1.5$; $0.5<z<1.1$; $0.1<a<4.2$), a $(Au,Ag,Cu)_xZn_ySn_2Se_b$ alloy ($1.5<x<2.5$; $0.9<y<1.5$; $0.5<z<1.1$; $0.1<b<4.2$) or a $(Au,Ag,Cu)_xZn_ySn_zS_aSe_b$ alloy ($1.5<x<2.5$; $0.9<y<1.5$; $0.5<z<1.1$; $0.1<a<4.2$; $0.1<b<4.2$).

Optionally, the foil may be treated to deposit a $(Au,Ag,Cu)$-zinc-tin alloy, the substrate is optionally contacted with an electrolytic bath at a temperature of from about 15° C. to about 80° C. to form such alloy.

Optionally, the method according to the second aspect of the present invention further comprises sulfurizing the copper-zinc-tin alloy of the foil by contacting same with a sulfur plating species. More preferably, said sulfur plating species is selected from the group comprising elemental sulfur and a reducing atmosphere containing a sulfur compound.

Optionally, the method according to the second aspect of the present invention further comprises depositing a selenium monolayer onto the alloy.

Optionally, the method comprises selenizing the copper-zinc-tin alloy by contacting same with a reducing atmosphere containing a selenium compound.

Deposition of the $(Au,Ag,Cu)$, zinc and tin monolayers in the method according to the fourth aspect of the present invention which results in forming a sandwich layer is performed preferably electrolytically. In this embodiment of the present invention the $(Au,Ag,Cu)_xZn_ySn_z$ sandwich layer or the $(Au,Ag,Cu)_xZn_ySn_zSe_b$ sandwich layer is obtained by stepwise wet-chemical deposition of thin monolayers of copper, tin, zinc and, optionally, selenium on a suitable substrate with a metallic back contact.

Optionally, depositing at least one chalcogen to at least one of said monolayers comprises sulfurizing either at least one of said monolayers with a sulfur plating species or sulfurizing said $(Au,Ag,Cu)$-zinc-tin sandwich layer by contacting same with a sulfur plating species.

More specifically, for preparing a layer of $(Au,Ag,Cu)_xZn_ySn_zS_a$ ($1.5<x<2.5$; $0.9<y<1.5$; $0.5<z<1.1$; $3.8<a<4.2$) the following method steps may be performed:

i. Preparing layers of $(Au,Ag,Cu)_xZn_ySn_z$ or of $(Au,Ag,Cu)_xZn_ySn_zS_a$ by using a method in which a layer of $(Au,Ag,Cu)_xZn_ySn_z$ or of $(Au,Ag,Cu)_xZn_ySn_2S_a$ ($1.5<x<2.5$; $0.9<y<1.5$; $0.5<z<1.1$; $0.1<a<4.2$) is prepared by contacting a substrate with a suitable electrolytic bath at a temperature of from 15° C. to 80° C. and at a pH of from 8 to 13, or preparing sandwich layers consisting of copper, tin and zinc monolayers and having an overall composition of $(Au,Ag,Cu)_xZn_ySn_z$ ($1.5<x<2.5$; $0.9<y<1.5$; $0.5<z<1.1$) by sequentially depositing stacked copper, tin and zinc onto a substrate having a layer thickness suitable to achieve the desired stoichiometry by contacting the substrate with an electrolytic bath for the deposition of copper, with an electrolytic bath for the deposition of tin and with an electrolytic bath for the deposition of zinc in any order and any number of stackings; and thereafter ii. Sulfurizing the layers by contacting them with a sulfur-containing compound.

Optionally, the sulfur species is selected from the group comprising elemental sulfur and a reducing atmosphere containing a sulfur compound.

Optionally, sulfurization may be performed by contacting the layers herein above with a reducing sulfur atmosphere like $H_2S$ a temperatures higher than room temperature.

Optionally, sulfurization may be performed by contacting the layers herein above with elemental sulfur either at room temperature or at elevated temperatures higher than room temperature.

Optionally, depositing at least one chalcogen to at least one of said monolayers comprises depositing a selenium monolayer onto the sandwich layer.

More specifically, for preparing a layer of $(Au,Ag,Cu)_xZn_ySn_2S_aSe_b$ ($1.5<x<2.5$; $0.9<y<1.5$; $0.5<z<1.1$; $0.1<a<4.2$; $0.1<b<4.2$) the following method steps may be performed:

iii. Preparing layers of $(Au,Ag,Cu)_xZn_ySn_z$, $(Au,Ag,Cu)_xZn_ySn_zS_a$, $(Au,Ag,Cu)_xZn_ySn_zSe_b$ or $(Au,Ag,Cu)_xZn_ySn_2S_aSe_b$ ($1.5<x<2.5$; $0.9<y<1.5$; $0.5<z<1.1$; $0.1<a<4.2$; $0.1<b<4.2$) by contacting a substrate with a suitable electrolytic bath at a temperature of from 15° C. to 80° C. and at a pH of from 8 to 13, more preferably from 10 to 12, or preparing sandwich layers consisting of copper, tin and zinc and having an overall composition of $(Au,Ag,Cu)_xZn_ySn_2$ ($1.5<x<2.5$; $0.9<y<1.5$; $0.5<z<1.1$) by sequentially depositing stacked metal layers onto a substrate having a layer thickness suitable to achieve the desired stoichiometry by contacting the substrate with an electrolytic bath for the deposition of copper, with an electrolytic bath for the deposition of tin and with an electrolytic bath for the deposition of zinc in any order and any number of stackings; and thereafter iv. Depositing a selenium layer and sulfurizing the layers by contacting them with a sulfur-containing compound.

Optionally in this latter method depositing the selenium layer comprises depositing said layer using a (wet-chemical reaction) electrochemical reaction by either electroless or electrochemical deposition.

Optionally, depositing at least one chalcogen to at least one of said monolayers comprises selenizing the sandwich layer by contacting same with a reducing atmosphere containing a selenium compound.

According to yet another aspect of the present invention, a thin film solar cell is provided which comprises a substrate film, optionally a barrier layer such as but not limited to an electrically conductive barrier layer is deposited on the substrate, which serves as as a diffusion barrier to prevent any constituent of the substrate to diffuse there through, an electrically conductive back contact layer, a p-type absorber layer, comprised of a copper-zinc-tin alloy further comprising at least one chalcogen and having chemical formula $(Au,Ag,Cu)_x Zn_x Sn_2 S_3$ with x being from 1.5 to 2.5, y being from 0.9 to 1.5, z being from 0.5 to 1.1 and a being from 3.8 to 4.2, or having chemical formula $(Au,Ag,Cu)_x Zn_y Sn_z S_a Se_b$ with x being from 1.5 to 2.5, y being from 0.9 to 1.5, z being from 0.5 to 1.1, a being from 0.1 to 4.2 and b being from 0.1 to 4.2, at least one n-type buffer layer and at least one window layer. Further, a grid layer may be provided for electrical contact. Of course, some embodiments may use an electrically insulating barrier layer.

More specifically, the thin film solar cell may comprise: a substrate layer which is either electrically conductive or non-conductive and which is furthermore either flexible or rigid; optionally, a barrier layer which serves either as an electrical isolator or as a diffusion barrier to prevent diffusion of any constituent of the substrate material into the absorber layer deposited thereon; an electrically conductive back contact layer which is preferably made from molybdenum; the p-type absorber layer made from $(Au,Ag,Cu)_x Zn_y Sn_2 S_a$ (1.5<x<2.5; 0.9<y<1.5; 0.5<z<1.1; 3.8<a<4.2), or $(Au,Ag,Cu)_x Zn_y Sn_2 S_a Se_b$ (1.5<x<2.5; 0.9<y<1.5; 0.5<z<1.1; 0.1<a<4.2; 0.1<b<4.2) obtained by any method described herein above to prepare such alloy; —at least one n-type buffer layer; one or more window layers.

In one embodiment, it should be understood that the precursor layer is designed to be IIB rich. This is particularly true if the IIB material is Zn. The desirable atomic ratio of IIB to IVA is at least 55:45 or optionally as high as 60:40. This IIB rich ratio in the precursor is particularly desirable due to the nature of the processing that occurs. Using particles such as but not limited to elemental particles, the ratio of IIB material to others is controllable. Optionally, some embodiments may have the ratio locked into alloy particles of IIB-IVA, IB-IIB, IB-IVA or IB-IIB-IVA. This IIB rich composition may also be obtained by printing an additional layer of IIB over any existing IB IIB IVA precursor.

Optionally, some embodiment may desire to lock in the IIB material be using core-shell particles with IIB in the core and a IB, IVA, or VIA shell. Optionally, some embodiments may use a IB, IVA, or VIA layer deposited over a precursor layer of IB IIB IVA.

In order to prepare the layers in accordance with the present invention the substrate surface to receive such layers will normally be subjected to a process of pre-cleaning same prior to metallization. The substrates may be treated before plating with wet-chemical processes developed by the applicant or with any other cleansing chemicals, in order to remove any grease, dirt dust or oxide from the surface. One pre-cleaning process is described in Table 1:

Cleaning Substrate

Uniclean® 399 is a mild alkaline, slightly foaming cleaner, which contains carbonate, silicates, phosphates, tensides and the biodegradable chelating agent gluconate. This bath is designed to remove mineral oils, polish and grind residues and pigment impurities for all metals.

Uniclean® 260 is a weak alkaline sodium hydroxide electrolytic cleaner, having electric conductivity, for the use for cathodic or for anodic degreasing.

Uniclean® 675 is an acidic activation agent for universal use. This cleaner contains sodium hydrogensulfate and sodium fluoride.

After having cleaned the substrate, the foil may be sent to selenization and/or sulfidation.

In the following Examples, numerous specific details are set forth in order to provide a thorough understanding of the present invention. It will be understood, however, to one skilled in the art, that the present invention may be practiced without some or all of these specific details:

In one embodiment, the heating rate was 10 K/s until the final temperature of 550° C. was reached. This rate was a compromise between reaching as soon as possible the necessary sulfur partial pressure and the kinetics of the formation and recrystallization of the $(Au,Ag,Cu)_x Zn_y Sn_z S_a$ (1.5<x<2.5; 0.9<y<1.5; 0.5<z<1.1; 0.1<a<4.2).

Formation of $(Au,Ag,Cu)_x Zn_y Sn_z S_a$ (1.5<x<2.5; 0.9<y<1.5; 0.5<z<1.1; 0.1<a<4.2) was linked with an expansion of the layer. For a sufficient sulfurization and cure of the layers the final temperature of 550° C. was held for at least 60 min. A homogeneous crystal structure was observed within 120 min reaction time.

After the sulfurization step cooling started. The flow rate of nitrogen was increased to 500 sccm for a faster exchange of the gas atmosphere. Until approximately 350° C. the graphite box containing the samples was allowed to cool down without further cooling devices. After that the cooling was supported by the fan system of the furnace.

The recrystallized absorber layers were further processed to a thin film solar cell using standard procedures known from the copper indium gallium selenide system.

Any of the forgoing may be deposited by solution deposition techniques, vacuum techniques, sputtering, evaporation, chemical bath deposition (CBD), electroplating, sol-gel based coating, spray coating, chemical vapor deposition (CVD), physical vapor deposition (PVD), atomic layer deposition (ALD), and the like.

Size Reduction

The particles may be formed by using at least one of the following methods: grinding, milling, electroexplosive wire (EEW) processing, evaporation condensation (EC), pulsed plasma processing, or combinations thereof. The particles may be formed using at least one of the following methods: sonification, agitation, electromagnetically mixing of a liquid metal or liquid alloy. The particles may be formed using at least one of the following methods: spray-pyrolysis, laser pyrolysis, or a bottom-up technique like wet chemical approaches.

In one embodiment, the sample started out at feedstock with spherical ternary CZT or ACZT particles of about 1050 microns, then was filtered down to ~10 microns, then milled down to <4 micron in the 1st stage, then finally milled down to 1~2 micron in the 2nd stage.

Normally, particles to be made smaller involves using a higher mill speed. In this case with CZT or ACZT, the faster the mill got, the particles got larger and larger. As the mill speed slowed down the mill, the particles got smaller. This is the non-newtonian aspect of the CZT or ACZT particles. This could be due to the specific density and formulation that were used.

The CZT is similar to cornstarch. Hit at high velocity, it is hard. But push slowly it is soft. The higher the shear force, the modulus gets higher. Thus, the CZT or ACZT precursor did not behave as expected. Solution is to use a slower mill speed at the beginning (not hard). Not 50% slower, but tens slower.

In one embodiment, grind pressure is 0.4 to 0.8 bar. Optionally, grind pressure was reduced to 0.2 to 0.7 bar. Optionally, many embodiments with about 0.2 to about 0.3 bar were able to produce the desired size reduction while minimizing agglomeration. Optionally, many embodiments with about 0.2 to about 0.4 bar were able to produce the desired size reduction while minimizing agglomeration. The percent solid loading is between about 4 to 6%. Optionally, they may be between 3% to about 10%. Run times may be from 30 to 200 minutes in one embodiment. The samples of particles may also be sonicated before, during, or after size reduction to improve coating quality with the materials. The material formed from the process is also in the form of flakes. The flakes 450 in the figures may have a longest dimension in the range of about 1 micron to 2 microns. Some embodiments may use smaller, submicron flakes.

In one embodiment, Cu pct is in the range of about 38% to 40.5%; Sn pct is between 32% to about 38.2%; Zn pct is between 23% to about 27%. The precursor material according to the present invention may have material components in this range to produce the desired final stoichiometric ratios in the final semiconductor absorber.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, traditional thermal annealing may also be used in conjunction with laser annealing. For example, with any of the above embodiments, microflakes may be replaced by and/or mixed with nanoflakes wherein the lengths of the planar nanoflakes are about 500 nm to about 1 nm. As a nonlimiting example, the nanoflakes may have lengths and/or largest lateral dimension of about 300 nm to about 10 nm. In other embodiments, the nanoflakes may be of thickness in the range of about 200 nm to about 20 nm. In another embodiment, these nanoflakes may be of thickness in the range of about 100 nm to about 10 nm. In one embodiment, these nanoflakes may be of thickness in the range of about 200 nm to about 20 nm. As mentioned, some embodiments of the invention may include both microflakes and nanoflakes. Other may include flakes that are exclusively in the size range of microflakes or the size range of nanoflakes. With any of the above embodiments, the microflakes may be replaced and/or combined with microrods which are substantially linear, elongate members. Still further embodiments may combine nanorods with microflakes in the precursor layer. The microrods may have lengths between about 500 nm to about 1 nm. In another embodiment, the nanorods may have lengths between about 500 nm and 20 nm. In yet another embodiment, the nanorods may have lengths between about 300 nm and 30 nm. Any of the above embodiments may be used on rigid substrate, flexible substrate, or a combinations of the two such as but not limited to a flexible substrate that become rigid during processing due to its material properties. In one embodiment of the present invention, the particles may be plates and/or discs and/or flakes and/or wires and/or rods of micro-sized proportions Again, any of the foregoing may also be combined with spherical particles in a suspension. Some embodiments may have all spherical particles, all non-spherical particles, and/or mixtures of particles of various shapes. It should be understood that the solid group IIIA-based particles may be used in single or multiple combination with particles of other shapes and/or composition. This may include shapes such as but not limited to spherical, planar, flake, other non-spherical, and/or single or multiple combinations of the foregoing. As for materials, this may include alloys, elementals, chalcogenides, inter-metallics, solid-solutions and/or single or multiple combinations of the foregoing in any shape or form. Use of solid particles with dispersions and/or emulsions of the foregoing is also envisioned. The solid solutions are described in pending U.S. patent application Ser. No. 10/474,259 and published as US20040219730, fully incorporated herein by reference for all purposes. The following applications are also fully incorporated herein by reference: Ser. Nos. 11/395,438, 11/395,668, and 11/395,426 both filed Mar. 30, 2006. Any of the embodiments described in those applications may be adapted for use with the particles described herein.

For any of the above embodiments, it should be understood that in addition to the aforementioned, the temperature used during annealing may also vary over different time periods of precursor layer processing. As a nonlimiting example, the heating may occur at a first temperature over an initial processing time period and proceed to other temperatures for subsequent time periods of the processing. Optionally, the method may include intentionally creating one or more temperature dips so that, as a nonlimiting example, the method comprises heating, cooling, heating, and subsequent cooling. Some embodiments may use a two-step absorber growth (non-reactive anneal for densification followed by reactive anneal) without cool-down and ramp-up between densification and selenization/sulfurization. An annealed layer can be selenized and/or sulfdized (in that order or vice versa). Various heating methods, including not heating the substrate, but only the precursor layer (laser) may be used. Others heating techniques may use muffle heating, convection heating, IR-heating. Some embodiments may use the same or different techniques for heating the top surface and bottom surface of the substrate. Basically, all heating mechanisms, being conduction, convection, and radiation may be used. All temperature gradients within the web (across the thickness), being uniformly heated from bottom to top, and/or heating with a huge temperature gradient from bottom (low T) to top (high T), e.g. with a laser, and covering all web transport mechanisms through the furnace (including but not limited to being free-span through the module, dragging over a dense or partially open surface, or relying on a belt), orientation of the furnace, horizontally, vertically, or anything in between.

For any of the above embodiments, it is also possible to have two or more elements of IB elements in the chalcogenide particle and/or the resulting film. Although the description herein uses an ink, it should be understood that in some embodiments, the ink may have the consistency of a paste or slurry. It should be understood that the deposition methods for use with depositing precursor material(s) may include one or more of the following: solution-deposition of particulates, like coating, printing, and spraying, sol-gel, electro(less) deposition (HBP, CBD, e-Dep), precipitations, (chemical) vapor deposition, sputtering, evaporation, ion plating, extrusion, cladding, thermal spray, where several of these methods can be plasma-enhanced) and precursor/film-conversion methods, where the latter can be either chemically, physically, and/or mechanically, and covers both partial and complete changes of the precursor/film and/or surface only.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . . .

For example, still other embodiments of the present invention may use a Cu—In precursor material wherein Cu—In contributes less than about 50 percent of both Cu and In found in the precursor material. The remaining amount is incorporated by elemental form or by non IB-IIIA alloys. Thus, a $Cu_{11}In_9$ may be used with elemental Cu, In, and Ga to form a resulting film.

In another embodiment, instead of elemental Cu, In, and Ga, other materials such as Cu—Se, In—Se, and/or Ga—Se may be substituted as source of the group IB or IIIA material. Optionally, in another embodiment, the IB source may be any particle that contains Cu without being alloyed with In and Ga (Cu, Cu—Se). The IIIA source may be any particle that contains In without Cu (In—Se, In—Ga—Se) or any particle that contains Ga without Cu (Ga, Ga—Se, or In—Ga—Se). Other embodiments may have these combinations of the IB material in a nitride or oxide form. Still other embodiments may have these combinations of the IIIA material in a nitride or oxide form. The present invention may use any combination of elements and/or selenides (binary, ternary, or multinary) may be used. Optionally, some other embodiments may use oxides such as $In_2O_3$ to add the desired amounts of materials. It should be understood for any of the above embodiments that more than one solid solution may be used, multiphasic alloys, and/or more general alloys may also be used. For any of the above embodiments, the annealing process may also involve exposure of the compound film to a gas such as $H_2$, CO, $N_2$, Ar, $H_2Se$, Se vapor, S vapor, or other group VIA containing vapor. There may be a two stage process where there is an initial anneal in a non group-VIA based atmosphere and then a second or more heating in group VIA-based atmosphere. There may be a two stage process where there is an initial anneal in a non group-VIA based atmosphere and then a second heating in a non-group VIA based atmosphere, wherein VIA material is placed directly on the stack for the second heating and additional is the VIA-containing vapor is not used. Alternatively, some may use a one stage process to create a final film, or a multi-stage process where each heating step use a different atmosphere. Although most embodiments herein are described in the context of Ag, it should be understood that some embodiments may replace Ag with Au and/or use Au with Ag in the embodiments herein is not excluded.

It should also be understood that several intermediate solid solutions may also be suitable for use according to the present invention. As nonlimiting examples, a composition in the δ phase for Cu—In (about 42.52 to about 44.3 wt % In) and/or a composition between the δ phase for Cu—In and $Cu_{16}In_9$ may be suitable inter-metallic materials for use with the present invention to form a group IB-IIIA-VIA compound. It should be understood that these inter-metallic materials may be mixed with elemental or other materials such as Cu—Se, In—Se, and/or Ga—Se to provide sources of the group IB or IIIA material to reach the desired stoichiometric ratios in the final compound. Other nonlimiting examples of inter-metallic material include compositions of Cu—Ga containing the following phases: $\gamma_1$ (about 31.8 to about 39.8 wt % Ga), $\gamma_2$ (about 36.0 to about 39.9 wt % Ga), $\gamma_3$ (about 39.7 to about −44.9 wt % Ga), the phase between $\gamma_2$ and $\gamma_3$, the phase between the terminal solid solution and $\gamma_1$, and θ (about 66.7 to about 68.7 wt % Ga). For Cu—Ga, a suitable composition is also found in the range in between the terminal solid-solution of and the intermediate solid-solution next to it. Advantageously, some of these inter-metallic materials may be multi-phasic which are more likely to lead to brittle materials that can be mechanically milled. Phase diagrams for the following materials may be found in ASM Handbook, Volume 3 Alloy Phase Diagrams (1992) by ASM International and fully incorporated herein by reference for all purposes. Some specific examples (fully incorporated herein by reference) may be found on pages 2-168, 2-170, 2-176, 2-178, 2-208, 2-214, 2-257, and/or 2-259. It should also be understood that a particle may have portions that are of a solid alloy and portions that are phase separated into individual elements or other alloys that are liquid.

It should be understood that any of the embodiments herein may be adapted for use in a one step process, or a two step process, or a multi-step process for forming a photovoltaic absorber layer. One step processes do not require a second follow-up process to convert the film into an absorber layer. A two step process typically creates a film that uses a second process to convert the film into an absorber layer. Additionally, some embodiments may have anywhere from about 0 to about 5 wt % oxygen in the shell.

It should be understood that the particles as described herein may be used with solids, solid solutions, intermetallics, nanoglobules, emulsions, nanoglobule, emulsion, or other types of particles. It should also be understood that prior to deposition of any material on the substrate, the metal foil may undergo conditioning (cleaning, smoothening, and possible surface treatment for subsequent steps), such as but not limited to corona cleaning, wet chemical cleaning, plasma cleaning, ultrasmooth re-rolling, electro-polishing, and/or CMP slurry polishing.

Furthermore, those of skill in the art will recognize that any of the embodiments of the present invention can be applied to almost any type of solar cell material and/or architecture. For example, the absorber layer in the solar cell may be an absorber layer comprised of copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. The ACIGS cells may be formed by vacuum or non-vacuum processes. The processes may be one stage, two stage, or multi-stage ACIGS processing techniques. Many of these types of cells can be fabricated on flexible substrates.

In some embodiments, the method comprises depositing onto a back contact of the substrate one or more films of elemental Ag, Tl, or Te, or oxides, sulfides, selenides, or tellurides of any of these. Subsequently one or more of Cu, In, Ga, Al, Se, or S is deposited. Optionally, one or more of Ag, Tl, or Te may also be deposited. This film may then be optionally be further processed if necessary at a further elevated temperature in an inert or O-, S-, Se-, or Te-containing atmosphere to form the chalcopyrite film.

In some embodiments, the method of making the film comprises depositing one or more films of elemental Ag, Cu, In, Ga, Tl, Al, Te, or alloys thereof, or oxides, sulfides, selenides, or tellurides of any of these via sputter deposition or via reactive sputter deposition in an oxygen-, sulfur-, selenium-, or tellurium-containing atmosphere.

The method may instead comprise the deposition and annealing, reaction, or sintering of a particulate chalcopyrite, or precursor particles in a vacuum, inert, or S-, Se-, or Te-containing atmosphere. Ag, Tl, or Te may be present in the pre-processed particulate films either in elemental form or as compounds.

Alternatively, Ag, Tl, or Te may be incorporated into the I-III-$VI_2$ absorber layer by simultaneous or sequential co-evaporation with Cu, In, Ga, Al, Se, or S.

In some embodiments, Tl or its sulfides, selenides, or tellurides are delivered to the substrate by thermal evaporation of TlS, $Tl_2Se$, $Tl_2Te$, or other Tl sulfides, selenides, or tellurides.

In another embodiment, an Ag film may be sputtered onto the back contact, followed by the formation of the remainder of the absorber layer by sequential or co-evaporation of Cu, Ga, In, Se, and optionally additional Ag, to form a resultant (AgCu)(InGa)Se$_2$ absorber layer.

In other embodiments, Ag, Tl, or Te are incorporated into a precursor film or films before annealing in a vacuum or inert atmosphere, or reaction in an S-, Se-, or Te-containing atmosphere to form the resultant I-III-VI$_2$ absorber layer.

In yet other embodiments, Ag, Tl, or Te are incorporated into the I-III-VI$_2$ absorber layer by deposition onto a film containing Cu, In, Ga, Al, Se, or S, and optionally Ag, Tl, or Te, and then heating in an inert, vacuum, or S-, Se-, or Te-containing atmosphere.

The method may also comprise sequentially co-evaporating Ag, Cu, In, Ga, and Se onto a heated substrate to form the chalcopyrite film. Or, it may involve depositing one or more layers of Ag, Cu, In, Ga, and optionally Se, or alloys or oxides, sulfides, or selenides thereof, and subsequently processing the film at a further elevated temperature in an inert, O-, S-, or Se-containing atmosphere to form the chalcopyrite film. Alternatively, the method may include depositing a particulate film comprising Ag, Cu, Tl, In, Ga, O, S, Se, or Te, or a combination thereof, or alloys or oxides, sulfides, selenides, or tellurides thereof, and subsequently processing the film at a further elevated temperature to form the chalcopyrite film.

Suitable substrates upon which to dispose the absorber layer films of this invention include any known in the art. Specific examples include metal films, glasses (including soda-lime glass), and self-supporting polymer films. The polymer films may for example be polyimides, liquid crystal polymers, or rigid-rod polymers. A typical film thickness may be about 50 μm to about 125 μm, although any thickness can be used.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, US 20040219730 and US 2005/0183767 are fully incorporated herein by reference. U.S. Provisional Application Ser. No. 61/290,490 filed Dec. 28, 2009 is fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An optoelectronic device, comprising
a thin film absorber layer consisting essentially of: silver (Ag), copper (Cu), indium (In), gallium (Ga), selenium (Se), and sulfur (S);
wherein the absorber layer is characterized by an Ag/(Ag+Cu) ratio which is less than about 0.5.

2. The device of claim 1, wherein the device exhibits at least about 10% conversion efficiency under AM 1.5G illumination.

3. The device of claim 1, wherein the device exhibits at least about 11% conversion efficiency under AM 1.5G illumination.

4. The device of claim 1, wherein the device exhibits at least about 12% conversion efficiency under AM 1.5G illumination.

5. The device of claim 1, wherein the device exhibits at least about 13% conversion efficiency under AM 1.5G illumination.

6. The device of claim 1, wherein the device exhibits at least about 14% conversion efficiency under AM 1.5G illumination.

7. The device of claim 1, wherein the device exhibits at least about 15% conversion efficiency under AM 1.5G illumination.

8. The device of claim 1, wherein the device exhibits at least about 16% conversion efficiency under AM 1.5G illumination.

9. The device of claim 1, wherein the device exhibits at least about 17% conversion efficiency under AM 1.5G illumination.

10. The device of claim 1, wherein the thin film absorber layer is formed on a base, wherein an oxygen content of the absorber layer at a surface region of the absorber layer is reduced compared to another thin film absorber layer comprising Ag, Cu, In, Ga, and Se that is formed in substantially the same manner as the thin film absorber layer comprising Ag, Cu, In, Ga, Se, and S.

11. The device of claim 1, wherein the thin film absorber layer includes a surface region, a bulk region and a transition region disposed between the surface region and the bulk region, wherein a transition region Ag/(Ag+Cu) molar ratio in the transition region is higher than a surface region Ag/(Ag+Cu) ratio in the surface region.

12. The device of claim 11, wherein the surface region is characterized by a thickness of less than about 300 nm, a Ga/(Ga+In) molar ratio that is in the range of about 0 to about 0.3, a S/(Se+S) molar ratio that is in the range of about 0.1 to about 0.7, and a Ag/(Ag+Cu) molar ratio that is in the range of about 0 to about 0.4.

13. The device of claim 11, wherein the surface region is characterized by a thickness of less than about 300 nm, a surface region Ga/(Ga+In) molar ratio within the surface region in the range of 0 to about 0.3.

14. The device of claim 11, wherein the bulk region is characterized by an average bulk region Ga/(Ga+In) molar ratio of about 0.5 or less.

15. The device of claim 11, wherein the bulk region is at least 400 nm thick.

16. The device of claim 11, wherein a surface region S/(S+Se) molar ratio in the surface region is greater than a surface region Ag/(Ag+Cu) ratio in the surface region.

17. The device of claim 11, wherein an amount of silver in the absorber layer is large enough to bring gallium towards a surface of the thin film absorber layer.

18. The device of claim 1, wherein the sulfur changes a bandgap in a surface region of the absorber layer.

* * * * *